(12) United States Patent
Xiao

(10) Patent No.: US 11,004,861 B2
(45) Date of Patent: May 11, 2021

(54) THREE-DIMENSIONAL MEMORY DEVICES AND FABRICATION METHODS THEREOF

(71) Applicant: YANGTZE MEMORY TECHNOLOGIES CO., LTD., Wuhan (CN)

(72) Inventor: Li Hong Xiao, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 0 days.

(21) Appl. No.: 16/541,144

(22) Filed: Aug. 14, 2019

(65) Prior Publication Data

US 2020/0312872 A1    Oct. 1, 2020

Related U.S. Application Data

(63) Continuation of application No. PCT/CN2019/093454, filed on Jun. 28, 2019.

(30) Foreign Application Priority Data

Mar. 29, 2019 (CN) .......................... 201910248585.1
Mar. 29, 2019 (CN) .......................... 201910248601.7

(Continued)

(51) Int. Cl.
*H01L 27/1158* (2017.01)
*H01L 27/11582* (2017.01)
(Continued)

(52) U.S. Cl.
CPC .... *H01L 27/11582* (2013.01); *H01L 27/1157* (2013.01); *H01L 27/11524* (2013.01);
(Continued)

(58) Field of Classification Search
CPC ........... H01L 27/11582; H01L 27/1157; H01L 27/11556; H01L 27/11524;
(Continued)

(56) References Cited

U.S. PATENT DOCUMENTS 7,465,625 B2   12/2008   Woo et al.
8,415,742 B2    4/2013   Kim et al.
(Continued)

FOREIGN PATENT DOCUMENTS

CN    104541370 A    4/2015
CN    106571367 A    4/2017
(Continued)

OTHER PUBLICATIONS

International Search Report issued in corresponding International Application No. PCT/CN2019/093447, dated Jan. 2, 2020, 4 pages.
(Continued)

*Primary Examiner* — Vu A Vu
(74) *Attorney, Agent, or Firm* — Bayes PLLC

(57) ABSTRACT

Embodiments of a method for forming a three-dimensional (3D) memory device includes the following operations. First, an initial channel hole is formed in a stack structure of a plurality first layers and a plurality of second layers alternatingly arranged over a substrate. An offset is formed between a side surface of each one of the plurality of first layers and a side surface of each one of the plurality of second layers on a sidewall of the initial channel hole to form a channel hole. A semiconductor channel is formed by filling the channel hole with a channel-forming structure, the semiconductor channel having a memory layer including a plurality of first memory portions each surrounding a bottom of a respective second layer and a plurality of second memory portions each connecting adjacent first memory portions.

20 Claims, 34 Drawing Sheets

(30) Foreign Application Priority Data

Mar. 29, 2019 (CN) .......................... 201910248617.8
Mar. 29, 2019 (CN) .......................... 201910248966.X
Mar. 29, 2019 (CN) .......................... 201910248967.4

(51) Int. Cl.
*H01L 27/1157* (2017.01)
*H01L 27/11556* (2017.01)
*H01L 27/11524* (2017.01)
*H01L 27/11578* (2017.01)
*H01L 27/11563* (2017.01)

(52) U.S. Cl.
CPC ... *H01L 27/11556* (2013.01); *H01L 27/11563* (2013.01); *H01L 27/11578* (2013.01)

(58) Field of Classification Search
CPC ......... H01L 27/11551; H01L 27/11563; H01L 27/11578
USPC ........................................................ 257/314
See application file for complete search history.

(56) References Cited

U.S. PATENT DOCUMENTS

| | | | |
|---|---|---|---|
| 8,697,524 B2* | 4/2014 | You | H01L 27/11582 438/288 |
| 9,385,139 B2* | 7/2016 | Chang | H01L 27/11556 |
| 9,419,012 B1 | 8/2016 | Shimabukuro et al. | |
| 9,576,975 B2 | 2/2017 | Zhang et al. | |
| 9,875,929 B1 | 1/2018 | Shukla et al. | |
| 10,700,090 B1 | 6/2020 | Cui et al. | |
| 10,741,576 B2 | 8/2020 | Nishikawa et al. | |
| 2011/0101443 A1 | 5/2011 | Huo et al. | |
| 2012/0140562 A1 | 6/2012 | Choe et al. | |
| 2013/0307126 A1 | 11/2013 | Chiang et al. | |
| 2014/0008714 A1 | 1/2014 | Makala | |
| 2015/0035068 A1 | 2/2015 | Huang et al. | |
| 2016/0071871 A1 | 3/2016 | Kamigaichi | |
| 2016/0086972 A1 | 3/2016 | Zhang et al. | |
| 2016/0163728 A1 | 6/2016 | Tsutsumi et al. | |
| 2016/0268283 A1* | 9/2016 | Kitamura | H01L 29/40117 |
| 2016/0336420 A1 | 11/2016 | Chou et al. | |
| 2017/0104079 A1 | 4/2017 | Xiao et al. | |
| 2017/0222020 A1 | 8/2017 | Yu et al. | |
| 2017/0236836 A1 | 8/2017 | Huo et al. | |
| 2017/0278859 A1* | 9/2017 | Sharangpani | H01L 27/11582 |
| 2018/0006041 A1 | 1/2018 | Xu et al. | |
| 2018/0033799 A1 | 2/2018 | Kanamori et al. | |
| 2018/0219017 A1 | 8/2018 | Goda et al. | |
| 2018/0269227 A1 | 9/2018 | Carlson | |
| 2018/0374860 A1 | 12/2018 | Goda et al. | |

FOREIGN PATENT DOCUMENTS

| | | |
|---|---|---|
| CN | 106876403 A | 6/2017 |
| CN | 107946310 A | 4/2018 |
| CN | 108475529 A | 8/2018 |
| CN | 108598085 A | 9/2018 |
| CN | 109300902 A | 2/2019 |
| CN | 109326608 A | 2/2019 |
| CN | 109346474 A | 2/2019 |
| CN | 110047839 A | 7/2019 |
| TW | 201212168 A | 3/2012 |
| TW | I520272 B | 2/2016 |
| TW | 201608749 A | 3/2016 |
| TW | 201834150 A | 9/2018 |
| TW | 201834207 A | 9/2018 |
| TW | 201907548 A | 2/2019 |

OTHER PUBLICATIONS

Written Opinion of the International Searching Authority issued in corresponding International Application No. PPCT/CN2019/093447, dated Jan. 2, 2020, 5 pages.
International Search Report issued in corresponding International Application No. PCT/CN2019/093442, dated Dec. 27, 2019, 5 pages.
Written Opinion of the International Searching Authority issued in corresponding International Application No. PCT/CN2019/093442, dated Dec. 27, 2019, 4 pages.
International Search Report issued in corresponding International Application No. PCT/CN2019/093419, dated Dec. 27, 2019, 4 pages.
Written Opinion of the International Searching Authority issued in corresponding International Application No. PCT/CN2019/093419, dated Dec. 27, 2019, 5 pages.
International Search Report issued in corresponding International Application No. PCT/CN2019/093454, dated Dec. 27, 2019, 4 pages.
Written Opinion of the International Searching Authority issued in corresponding International Application No. PCT/CN2019/093454, dated Dec. 27, 2019, 5 pages.
International Search Report issued in corresponding International Application No. PCT/CN2019/093455, dated Dec. 27, 2019, 4 pages.
Written Opinion of the International Searching Authority issued in corresponding International Application No. PCT/CN2019/093455, dated Dec. 27, 2019, 4 pages.

* cited by examiner

THREE-DIMENSIONAL MEMORY DEVICES AND FABRICATION METHODS THEREOF

CROSS-REFERENCE TO RELATED APPLICATIONS

This application is continuation of International Application No. PCT/CN2019/093454, filed on Jun. 28, 2019, entitled "THREE-DIMENSIONAL MEMORY DEVICES AND FABRICATION METHODS THEREOF," which is hereby incorporated by reference in its entirety. This application also claims priorities to Chinese Patent Applications Nos. 201910248967.4, 201910248617.8, 201910248601.7, 201910248966.X, and 201910248585.1, each filed on Mar. 29, 2019, all of which are incorporated herein by reference in their entireties. This application is also related to U.S. application Ser. No. 16/541,137, filed on even date, entitled "THREE-DIMENSIONAL MEMORY DEVICES AND FABRICATION METHODS THEREOF," U.S. application Ser. No. 16/541,141, filed on even date, entitled "THREE-DIMENSIONAL MEMORY DEVICES AND FABRICATION METHODS THEREOF," U.S. application Ser. No. 16/541,142, filed on even date, entitled "THREE-DIMENSIONAL MEMORY DEVICES AND FABRICATION METHODS THEREOF," and U.S. application Ser. No. 16/541,145, filed on even date, entitled "THREE-DIMENSIONAL MEMORY DEVICES AND FABRICATION METHODS THEREOF," all of which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and the fabrication methods to fabricate the 3D memory devices are disclosed herein.

In one example, a method for forming a 3D memory device includes the following operations. First, an initial channel hole is formed in a stack structure of a plurality first layers and a plurality of second layers alternatingly arranged over a substrate. An offset is formed between a side surface of each one of the plurality of first layers and a side surface of each one of the plurality of second layers on a sidewall of the initial channel hole to form a channel hole. A semiconductor channel is formed by filling the channel hole with a channel-forming structure, the semiconductor channel having a memory layer including a plurality of first memory portions each surrounding a bottom of a respective second layer and a plurality of second memory portions each connecting adjacent first memory portions. Further, the plurality of first layers are removed and a plurality of conductor layers are formed from the plurality of second layers. A gate-to-gate dielectric layer is formed between the adjacent conductor layers. The gate-to-gate dielectric layer includes at least one sub-layer of silicon oxynitride and an airgap.

In another example, a method for forming a 3D memory device includes forming an initial channel hole in a stack structure of a plurality first layers and a plurality of second layers alternatingly arranged over a substrate, forming an offset between a side surface of each one of the plurality of first layers and a side surface of each one of the plurality of second layers on a sidewall of the initial channel hole to form a channel hole, and forming a semiconductor channel by filling the channel hole with a channel-forming structure. The semiconductor channel may have a memory layer including a plurality of first memory portions each surrounding a bottom of a respective second layer and a plurality of second memory portions each connecting adjacent first memory portions. The method may also include removing the plurality of first layers, forming a plurality of conductor layers each from a middle portion of a respective second layer, forming a composite layer from a surface portion of the second layer, the composite layer including at least one sub-layer of silicon oxynitride, and forming an airgap between adjacent conductor layers.

In still another example, a 3D memory device includes a stack structure including a plurality of conductor layers insulated from one another by a gate-to-gate dielectric structure. The gate-to-gate dielectric structure may include at least a sub-layer of silicon oxynitride and an airgap between adjacent conductor layers along a direction perpendicular to a top surface of the substrate. The 3D memory device also includes a semiconductor channel extending from a top surface of the stack structure to the substrate. The semiconductor channel may include a memory layer having a plurality of first memory portions each surrounding a bottom of a respective conductor layer and a plurality of second memory portions each connecting adjacent first memory portions. The plurality of first memory portions and the plurality of second memory portions may be staggered along a vertical direction perpendicular to a top surface of the substrate, and a source structure may extend from the top surface of the stack structure to the substrate.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
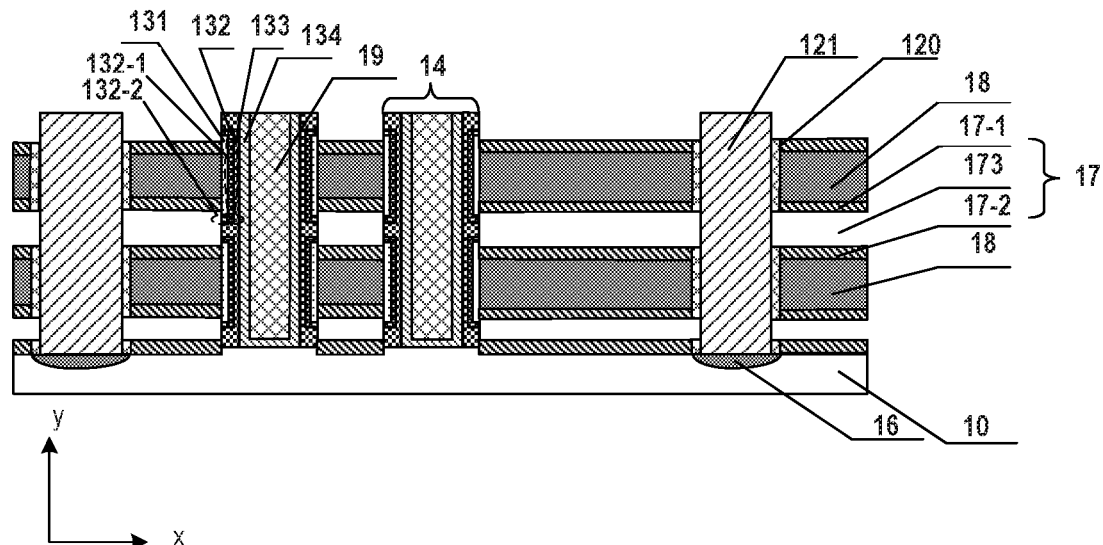
FIGS. 1A-1F each illustrates a cross-sectional view of a portion of a 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

As used herein, the terms "staircase," "step," and "level" can be used interchangeably. As used herein, a staircase structure refers to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "staircase" refers to a vertical shift in the height of a set of adjoined surfaces.

As used herein, the x-axis and the y-axis (perpendicular to the x-z plane) extend horizontally and form a horizontal plane. The horizontal plane is substantially parallel to the top surface of the substrate. As used herein, the z-axis extends vertically, i.e., along a direction perpendicular to the horizontal plane. The terms "x-axis" and "y-axis" can be interchangeably used with "a horizontal direction," the term "x-y plane" can be interchangeably used with "the horizontal plane," and the term "z-axis" can be interchangeably used with "the vertical direction."

As 3D memory devices scale down for higher memory capacity, more conductor layers, which function as gate electrodes of a 3D memory device, are stacked over a substrate within a designated space. Spacing between adjacent conductor layers along a vertical direction (i.e., the direction perpendicular to a top surface of the substrate) is reduced, resulting in a thinner gate-to-gate dielectric layer between the adjacent conductor layers. Conventionally, the gate-to-gate dielectric layer mainly includes silicon oxide ($SiO_x$, e.g., SiO), of which the insulation is largely affected by its thickness and film quality between the adjacent conductor layers. Due to scaling, a thinner gate-to-gate dielectric layer, made of silicon oxide, can thus be susceptible to gate-to-gate leakage or even breakdown. In addition, a reduced spacing between adjacent conductor layers can also cause increased charge loss. For example, due to smaller distance between adjacent memory cells, charges trapped in a memory cell is more likely to escape from the memory cell and travel along a memory layer (e.g., along its extending direction). As a result, data retention in the memory layer can be impaired, and operations (e.g., read, write, and/or hold) on the memory cells may have reduced precision.

Various embodiments in accordance with the present disclosure provide the structures and fabrication methods of 3D memory devices, which resolve the above-noted issues associated with thinner gate-to-gate dielectric layers. Embodiments of the present disclosure provide a gate-to-gate dielectric layer having at least one composite layer between adjacent conductor layers. The composite layer includes at least one sub-layer of silicon oxynitride ($SiO_xN_y$, e.g., SiON). As a high-k dielectric material, silicon oxynitride can provide better electric insulation between adjacent conductor layers. The gate-to-gate dielectric layer, even with a smaller thickness between adjacent conductor layers, can reduce the susceptibility to leakage and coupling. In some embodiments, the gate-to-gate dielectric layer includes at least an airgap between the adjacent conductor layers. In some embodiments, the gate-to-gate dielectric layer includes a pair of composite layers each on a different one of the adjacent conductor layers, and an airgap between the two composite layers. In some embodiments, the gate-to-gate dielectric layer includes a composite layer filling up the space between adjacent conductor layers without any airgap in between. The composite layer can include at least a sub-layer of silicon oxynitride. In some embodiments, the composite layer includes a plurality of sub-layers, which has at least one sub-layer of silicon oxynitride, each sandwiched by sub-layers of silicon oxide and/or silicon nitride. For example, the composite layer can include a plurality of alternatingly arranged sub-layers of silicon oxynitride and silicon oxide.

Also, to reduce charge loss in 3D memory devices, in some embodiments, the memory layer in the semiconductor channel can have a "bent" structure or a "cut-off" structure to create a barrier between adjacent memory cells (e.g., conductor layers) for the charges. In a "bent" structure, the memory layer has a plurality of first memory portions and a plurality second memory portions. Each first memory portion partially surrounds a respective conductor layer, and each second memory portion connects adjacent first memory portions. The first memory portion includes a vertical portion (e.g., extending vertically) and a pair of lateral portions (e.g., extending laterally), connected together to partially surround a bottom of the respective conductor layer. The first memory portions and the second memory portions may thus extend in a staggered manner along the vertical direction, creating a barrier for the charges trapped in memory cells (e.g., first memory portions) along the vertical direction. This structure of the memory layer can reduce charge loss along the vertical direction. In a "cut-off" structure, different from the "bent" structure, the second memory portions between adjacent conductor layers are removed so the first memory portions are disconnected from one another. This structure of the memory layer can enhance the barrier for the charges between adjacent memory cells.

Figure 1B:
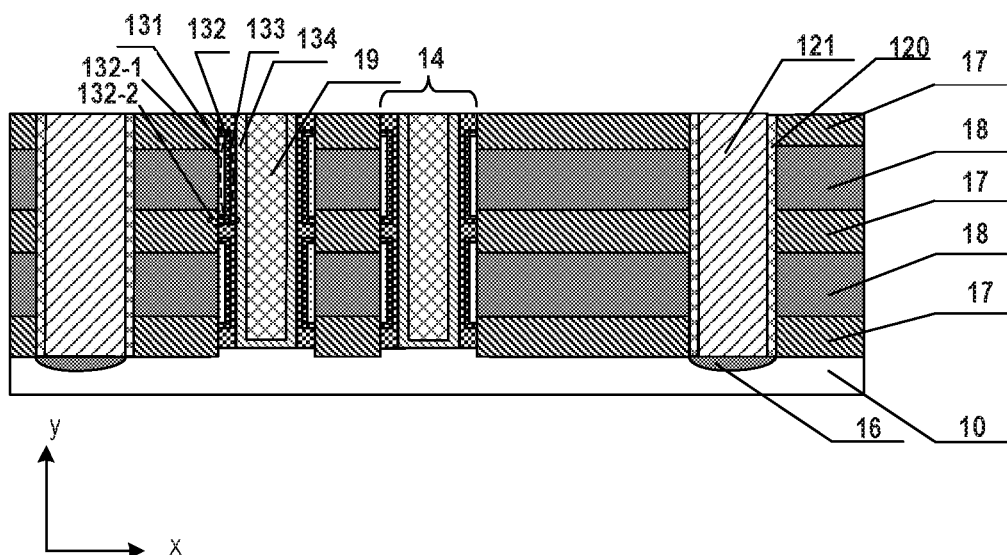
Figure 1C:
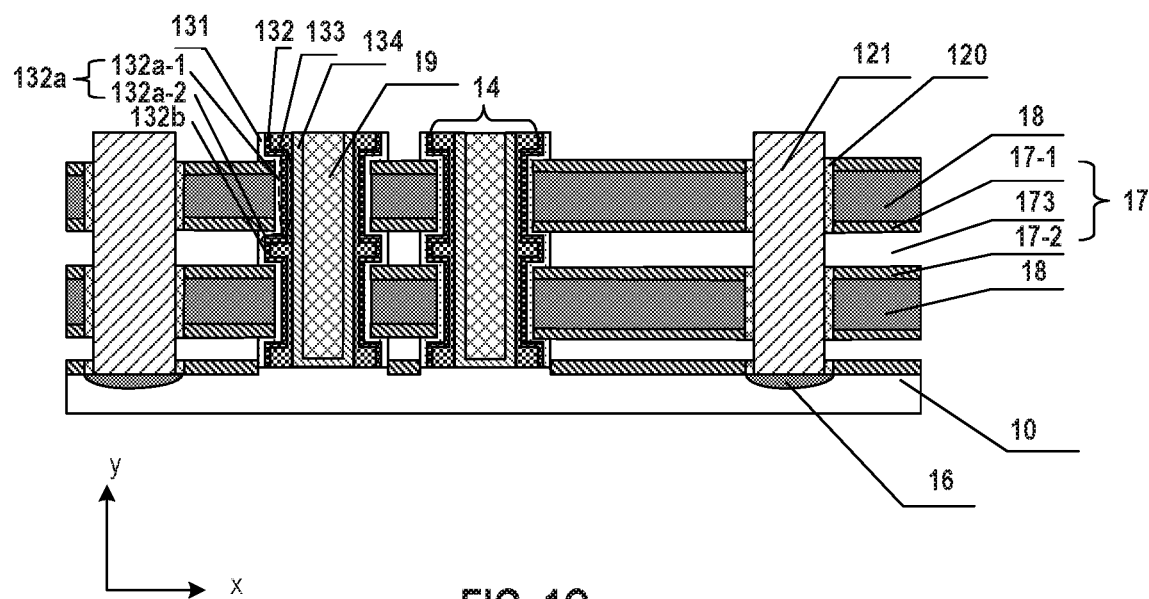
Figure 1D:
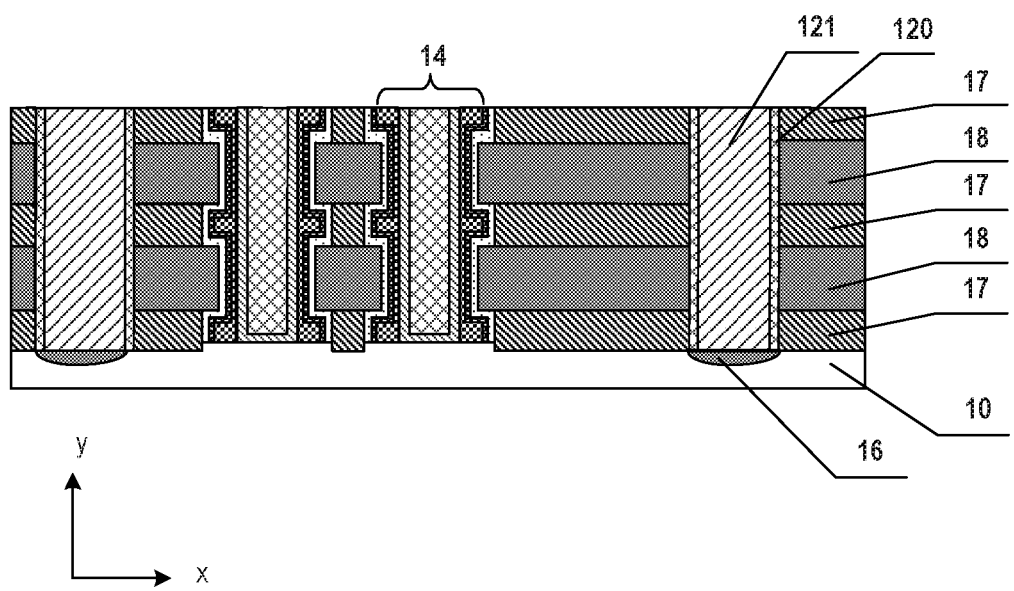
Figure 1E:
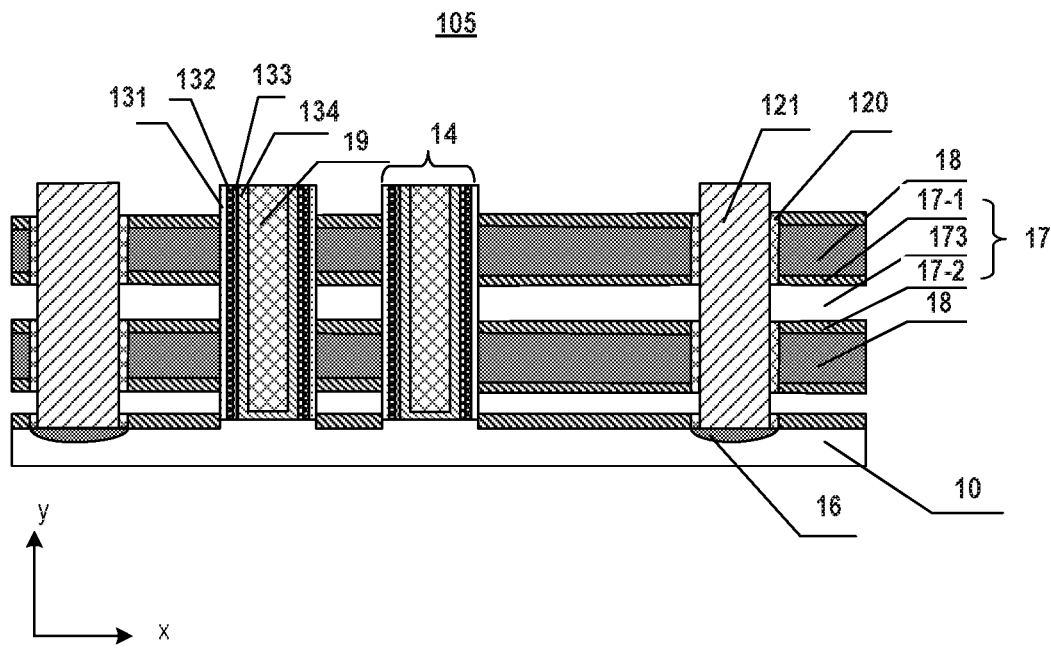
Figure 1F:
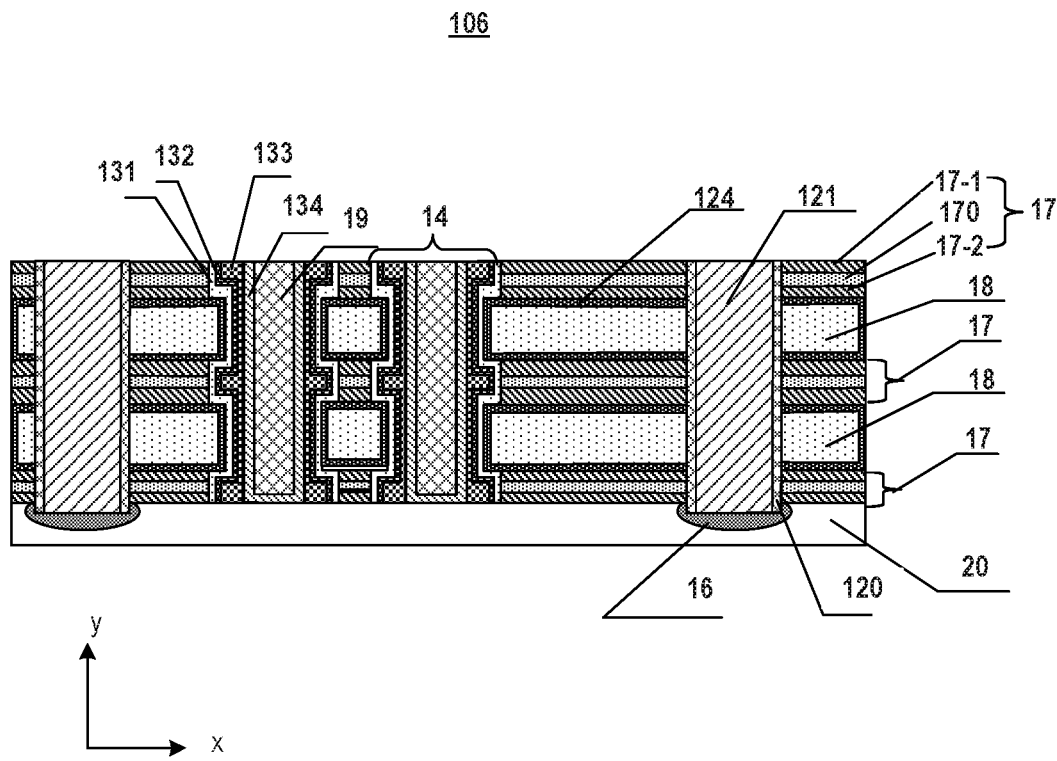

FIGS. 1A-1E illustrate cross-sectional views of 3D memory devices each having a gate-to-gate dielectric layer, according to the present disclosure. Specifically, FIG. 1A illustrates a memory device 101 having a memory layer with a "cut-off" structure and a gate-to-gate dielectric layer with an airgap between adjacent conductor layers. FIG. 1B illustrates a memory device 102 having a memory layer with a "cut-off" structure and a gate-to-gate dielectric layer without an airgap between adjacent conductor layers. FIG. 1C illustrates a memory device 103 having a memory layer with a "bent" structure and a gate-to-gate dielectric layer with an airgap between adjacent conductor layers. FIG. 1D illustrates a memory device 104 having a memory layer with a "bent" structure and a gate-to-gate dielectric layer without an airgap between adjacent conductor layers. FIG. 1E illustrates a memory device 105 having a memory layer without a "bent" structure or a "cut-off" structure and a gate-to-gate dielectric layer with an airgap between adjacent conductor layers. FIG. 1F illustrates a memory device 106 having a memory layer with a "bent" structure and a gate-to-gate dielectric layer with a pair of composite layers sandwiching a dielectric layer of a different material. For ease of description, same or similar parts in FIGS. 1A-1F are depicted using the same reference numbers.

Embodiments of the present disclosure provide different types of memory devices configured for reducing the leakage and coupling between conductor layers and preventing trapped charges to travel in undesired directions. As examples, memory devices, having a semiconductor channel with a "cut-off" structure and a gate-to-gate dielectric layer with at least a sub-layer of a high-k dielectric material (e.g., silicon oxynitride) and an airgap, may be embodied by memory device 101. Memory devices memory devices, having a semiconductor channel with a "bent" structure and a gate-to-gate dielectric layer with at least a sub-layer of a high-k dielectric material (e.g., silicon oxynitride), may be embodied by memory devices 103, 104, and 106. Memory devices, formed by a "gate first" fabrication process and having a gate-to-gate dielectric layer with at least a sub-layer of a high-k dielectric material (e.g., silicon oxynitride) and an airgap, may be embodied by memory devices 101, 103, and 105. Memory devices, formed by a "gate first" fabrication process, having a semiconductor channel with a "bent" structure and a gate-to-gate dielectric layer with at least a sub-layer of a high-k dielectric material (e.g., silicon oxynitride) and an airgap, may be embodied by memory device 103. Memory devices, having a semiconductor channel with a "cut-off" structure and a gate-to-gate dielectric layer with at least a sub-layer of a high-k dielectric material (e.g., silicon oxynitride), may be embodied by memory devices 101 and 102. Structures and fabrication processes of the memory devices are described in detail as follows.

As shown in FIG. 1A, memory device 101 includes a substrate 10, a plurality of conductor layers 18 stacking over substrate 10, and a plurality of gate-to-gate dielectric layers 17 each between and insulating adjacent conductor layers 18. Conductor layers 18, substrate 10, and gate-to-gate dielectric layers 17 may form a stack structure. Memory device 101 may include a plurality of semiconductor channels 14 each extending vertically (e.g., along a direction perpendicular to a top surface of substrate 10 or the y-direction) through the stack structure into substrate 10. Memory device 101 may also include a plurality of source structures extending through the stack structure and into substrate 10. Each source structure may include a doped region 16 in substrate 10, an insulating structure 120 extending through the stack structure, and a source contact 121 extending in insulating structure 120 and contacting doped region 16. Source contact 121 may be electrically connected to semiconductor channel 14 through doped region 16 and substrate 10.

Substrate 10 can include silicon (e.g., single crystalline silicon), silicon germanium (SiGe), gallium arsenide (GaAs), germanium (Ge), silicon on insulator (SOI), and/or any other suitable materials. In some embodiments, substrate 10 includes silicon.

Conductor layers 18 can include conductive materials including, but not limited to, tungsten (W), cobalt (Co), copper (Cu), aluminum (Al), polycrystalline silicon (polysilicon), doped silicon, silicides, or any combination thereof.

Gate-to-gate dielectric layer 17 may include one or more composite layers and at least an airgap between adjacent conductor layers 18. In the present disclosure, a plurality of gate-to-gate dielectric layers 17 for insulating a plurality of conductor layers 18 in the stack structure (e.g., all the conductor layers 18 from top to bottom of the stack structure) may be referred to as a gate-to-gate dielectric structure. In some embodiments, gate-to-gate dielectric layer 17 includes a pair of composite layers 17-1 and 17-2 and an airgap 173 between composite layers 17-1 and 17-2. In some embodiments, composite layers 17-1 and 17-2 may be formed in the space between adjacent conductor layers 18 and may be on the opposing surfaces of adjacent conductor layers 18. In some embodiments, a thickness of a composite layer, e.g., 17-1 or 17-2, may be less than about 5 nm, such as less than 5 nm (e.g., 0.5 nm, 1 nm, 1.5 nm, 2 nm, 2.5 nm, 3 nm, 3.5 nm, 4 nm, 4.5 nm, any range bounded by the lower end by any of these values, or in any range defined by any two of these values). In some embodiments, a thickness of airgap 173 may be dependent on the thicknesses of composite layers 17-1 and 17-2, and the spacing between adjacent conductor layers 18.

Gate-to-gate dielectric layer 17 may include at least one sub-layer of a high-k dielectric material such as silicon oxynitride. In some embodiments, depending on the material of conductor layers 18, the high-k dielectric material may also include material other than silicon oxynitride. In some embodiments, each composite layer, e.g., 17-1 and 17-2, may include a sub-layer of silicon oxynitride. Gate-to-gate dielectric layer 17 may also include sub-layers of other materials. In some embodiments, each composite layer, e.g., 17-1 and 17-2, may include at least a sub-layer of silicon oxide and/or silicon nitride. In some embodiments, each composite layer, e.g., 17-1 and 17-2, may include a plurality of sub-layers, having at least one sub-layer of silicon oxynitride, at least one sub-layer of silicon oxide, and at least one sub-layer of silicon nitride. In some embodiments, each composite layer, e.g., 17-1 and 17-2, may have a stack of sub-layers arranged as O/ON/O/ON/O, where "O" stands for silicon oxide and "ON" stands for silicon oxynitride. In some embodiments, each composite layer, e.g., 17-1 and 17-2, may have a stack of sub-layers arranged as O/ON/O/N/O/ON/O. In some embodiments, along the vertical direction, conductor layer 18 and the composite layers formed on conductor layer 18 (e.g., on the upper and lower surfaces of conductor layer 18) are located in the space defined between ends of vertical portion 132-1. In some embodiments, a total thickness of conductor layer 18 and the respective composite layers is less than a distance between the ends of vertical portion 132-1. In some embodiments, an end of lateral portion 132-2 facing away from the respective vertical portion is exposed by a respective gate-to-gate dielectric layer 17. For example, the end may be exposed by airgap 173 of the respective gate-to-gate dielectric layer 17. In some embodiments, a composite layer, similar to or the same as 17-1 or 17-2, may be formed on the top surface of substrate 10.

Figure 8A:
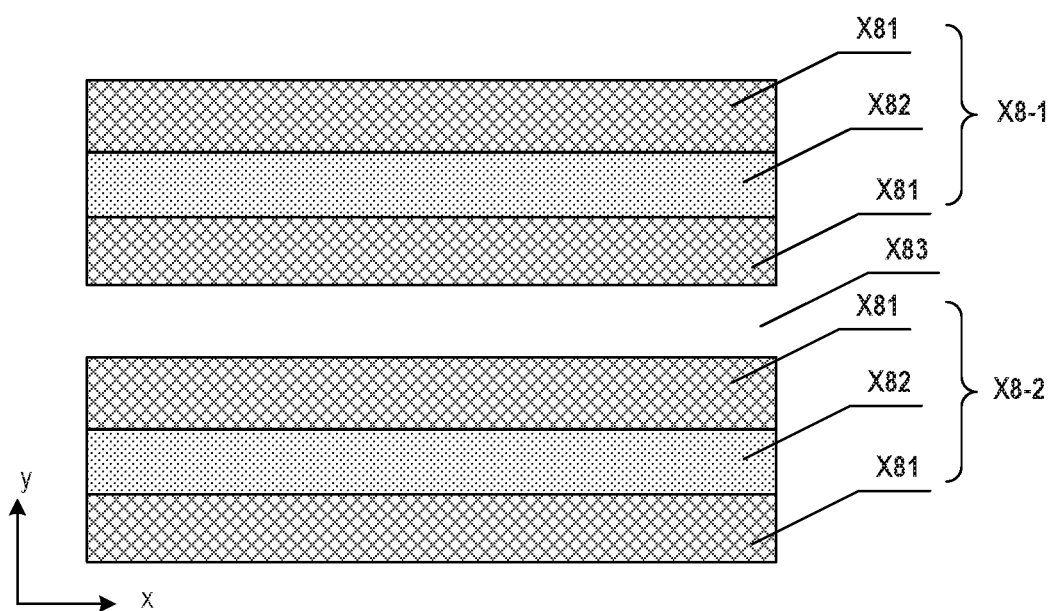
FIGS. 8A and 8B each illustrates a cross-sectional view of a gate-to-gate dielectric layer, according to some embodiments of the present disclosure.

FIG. 8A illustrates an exemplary structure of gate-to-gate dielectric layer 17. As shown in FIG. 8A, x81 represents a sub-layer of silicon oxide, x82 represents a sub-layer of silicon oxynitride, and x83 represents an airgap. Sub-layers x81, x82, and x81, on one of the adjacent conductor layers 18, may form a composite layer x8-1, and sub-layers x81, x82, and x81, on the other one of the adjacent conductor layers 18, may form another composite layer x8-2. Composite layers x8-1, x8-2, and airgap x83 may form a gate-to-gate dielectric layer 17. It should be noted that the number of sub-layers in a composite layer should not be limited by the embodiments of the present disclosure. In some embodiments, a thickness of each of composite layers x81 and x82 is less than about 5 nm, such as less than 5 nm (e.g., 0.5 nm, 1 nm, 1.5 nm, 2 nm, 2.5 nm, 3 nm, 3.5 nm, 4 nm, 4.5 nm, any range bounded by the lower end by any of these values, or in any range defined by any two of these values).

Semiconductor channel 14 may include a blocking layer 131, a memory layer 132, a tunneling layer 133, a semiconductor layer 134, and a dielectric core 19, arranged along a radial direction from the sidewall towards the center of semiconductor channel 14. Blocking layer 131 may include a plurality of blocking portions, each under a bottom of a respective conductor layer 18 and disconnected from one another. Memory layer 132 may include a plurality of memory portions, each under the bottom of the respective conductor layer 18 and partially surrounds the respective conductor layer 18. Each memory portion may be disconnected from one another. A memory portion may include a vertical portion 132-1 (e.g., extending along the vertical direction or the y-direction) and at least one lateral portion 132-2 (e.g., extending along the lateral direction or the x-direction) connected to vertical portion 132-1. In some embodiments, a memory portion includes a vertical portion 132-1 and a pair of lateral portions 132-2 (e.g., each connected to a different end of vertical portion 132-1). One end of lateral portion 132-2 may be connected to the respective vertical portion 132-1, and the other end of lateral portion 132-2 may be facing away from the respective vertical portion 132-1 (e.g., being exposed by airgap 173). The memory portion may be under and partially surrounding the respective block portion. Tunneling layer 133, exposed by airgaps 173, may be under and partially surrounding the respective memory portion.

Figure 7A:
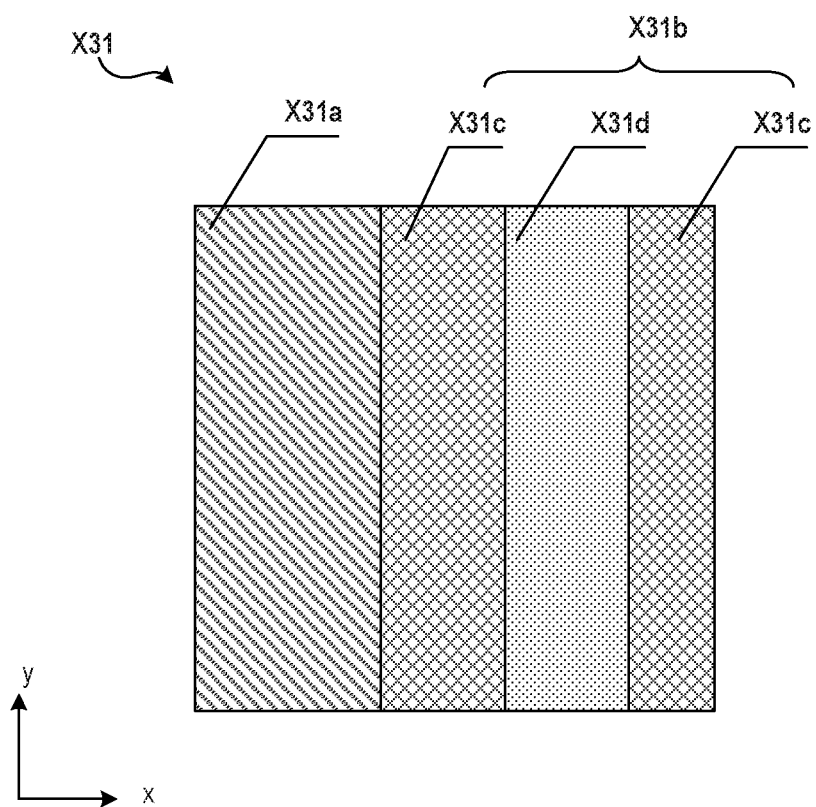
FIGS. 7A-7C each illustrates a cross-sectional view of a blocking layer, a memory layer, and a tunneling layer, according to some embodiments of the present disclosure.

Blocking layer 131 can reduce or prevent charges from escaping into conductor layers 18. Blocking layer 131 can include a single-layered structure or a multiple-layered structure. For example, blocking layer 131 can include a first blocking layer and a second blocking layer. The first blocking layer can be formed over the sidewall of a channel hole, and the second blocking layer may be formed over the first blocking layer. The first blocking layer can include a dielectric material (e.g., a dielectric metal oxide.) For example, the first blocking layer can include a dielectric metal oxide having a sufficiently high dielectric constant (e.g., greater than 7.9.) Examples of the first blocking layer include AlO, hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, and/or alloys thereof. The second blocking layer can include a dielectric material that is different from the first blocking layer. For example, the second blocking layer can include silicon oxide, silicon oxynitride, and/or silicon nitride. FIG. 7A illustrates an exemplary blocking layer x31, which is the same as or similar to blocking layer 131. As shown in FIG. 7A, blocking layer x31 includes a first blocking layer x31a and a second blocking layer x31b. First blocking layer x31a may include a high-k dielectric layer such as AlO. Second blocking layer x31b may include a plurality of dielectric layers stacking laterally. For example, second blocking layer x31b may include a pair of first dielectric layers x31c and a second dielectric layer x31d, where second dielectric layer x31d is sandwiched by first dielectric layers x31c. In some embodiments, first dielectric layer x31c includes a silicon oxide, and second dielectric layer x31d includes silicon oxynitride.

Figure 7B:
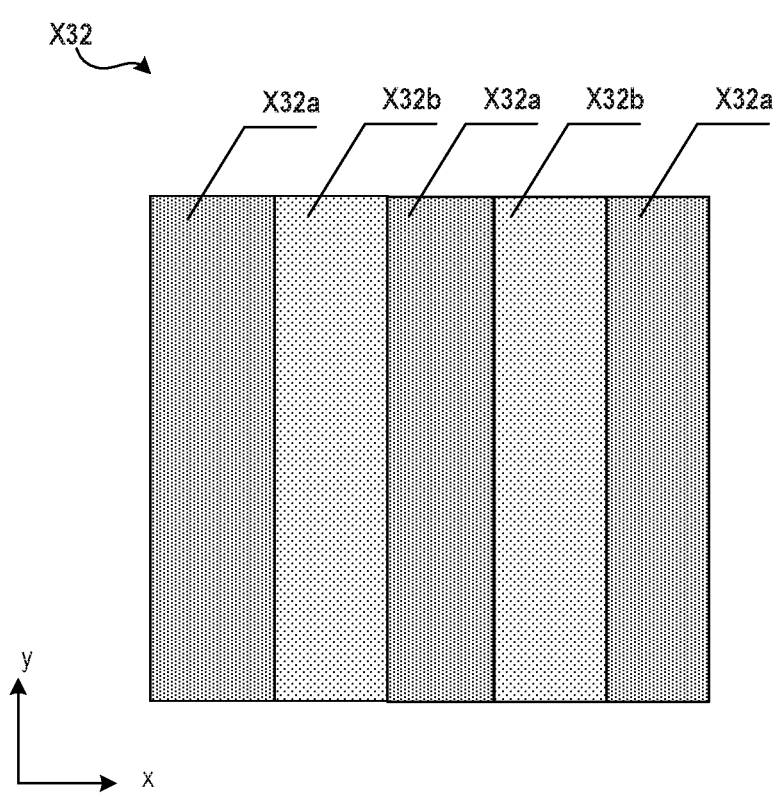

Memory layer 132 can include a charge-trapping material and can be formed over blocking layer 131. Memory layer 132 can include a single-layered structure or a multiple-layered structure. For example, memory layer 132 can include conductive materials and/or semiconductor such as tungsten, molybdenum, tantalum, titanium, platinum, ruthenium, alloys thereof, nanoparticles thereof, silicides thereof, and/or polycrystalline or amorphous semiconductor materials (e.g., polysilicon and amorphous silicon). Memory layer 132 can also include one or more insulating materials such as SiN and/or SiON. FIG. 7B illustrates an exemplary memory layer x32, which is the same as or similar to memory layer 132. As shown in FIG. 7B, memory layer x32 may include a plurality of alternatingly arranged first memory sub-layers x32a and second memory sub-layers x32b. In some embodiments, first memory sub-layer x32a includes silicon nitride, and second memory sub-layer x32b includes silicon oxynitride.

Figure 7C:
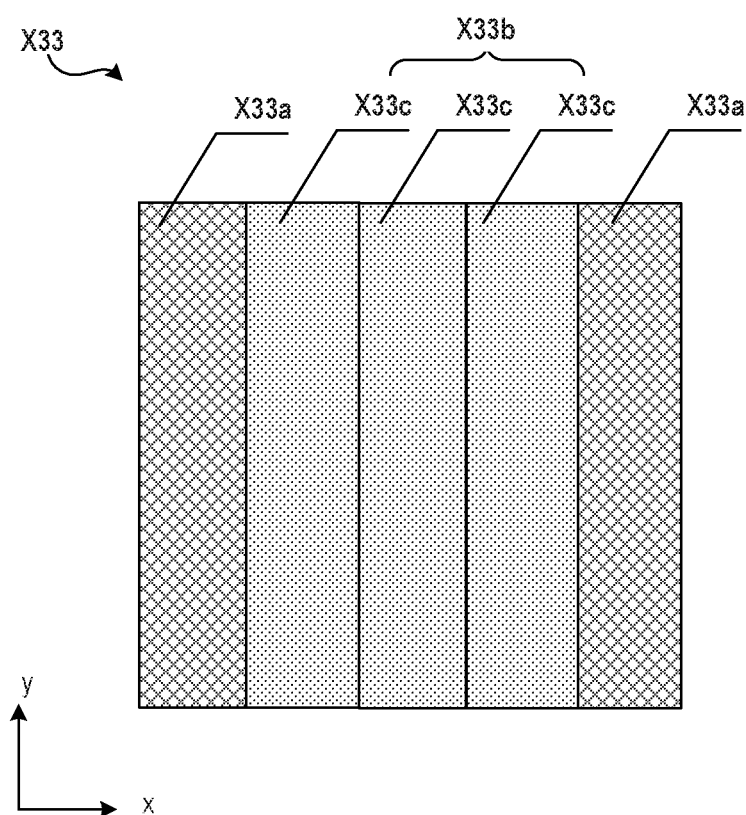

Tunneling layer 133 can include a dielectric material through which tunneling can occur under a suitable bias. Tunneling layer 133 can be formed over memory layer 132 and can include a single-layered structure or a multiple-layered structure. Tunneling layer 133 may include SiO, SiN, SiON, dielectric metal oxides, dielectric metal oxynitride, dielectric metal silicates, and/or alloys thereof. FIG. 7C illustrates an exemplary tunneling layer x33, which is the same as or similar to tunneling layer 133. As shown in FIG. 7C, tunneling layer x33 may include a plurality of first tunneling sub-layers x33a and a second tunneling sub-layer x33b. In some embodiments, second tunneling sub-layer x33b may be sandwiched by a pair of first tunneling sub-layers x33a. In some embodiments, first tunneling sub-layer x33a includes silicon oxide, and second tunneling sub-layer x33b includes a plurality of layers of silicon oxynitride.

Semiconductor layer 134 can facilitate the transport of charges and can be formed over tunneling layer 133. Semiconductor layer 134 can include one or more semiconductor materials such as a one-element semiconductor material, an III-V compound semiconductor material, an II-VI compound semiconductor material, and/or an organic semiconductor material. In some embodiments, semiconductor layer 134 includes a poly-silicon layer.

Dielectric core 19 can include a suitable dielectric material and can fill up the space surrounded by semiconductor layer 134. In some embodiments, dielectric core 19 includes silicon oxide (e.g., silicon oxide of sufficiently high purity).

Doped region 16 can be formed in substrate 10, contacting source contact 121. Source contact 121 may be insulated from conductor layers 18 by insulating structure 120. Source contact 121 may include any suitable conductive material that can be used as the source electrode, and doped region 16 may include a suitable doped (e.g., P-type or N-type) semiconductor region formed in substrate 10 and is opposite of the polarity of substrate 10. In some embodiments, source contact 121 includes one or more of doped poly-silicon, copper, aluminum, cobalt, doped silicon, silicides, and tungsten. In some embodiments, doped region 16 includes doped silicon. In some embodiments, insulating structure 120 includes silicon oxide.

Figure 8B:
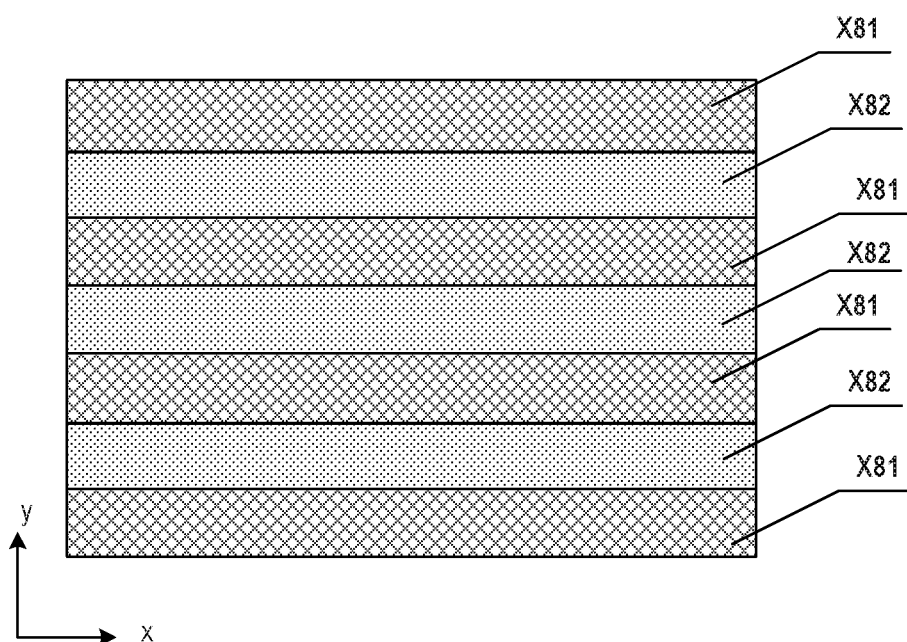

FIG. 1B illustrates a cross-section view of memory device 102, according to some embodiments. Different from memory device 101, gate-to-gate dielectric layer 17 has no airgap between adjacent conductor layers 18 and fills up the space between adjacent conductor layers 18 with a composite layer. In some embodiments, insulating structure 120 insulates source contact 121 from conductor layers 18 and gate-to-gate dielectric layers 17. In some embodiments, the ends of lateral portions 132-2, exposed portions of blocking layer 131, and exposed portions of tunneling layer 133, are covered by gate-to-gate dielectric layer 17. In some embodiments, a composite layer fills up the space between substrate 10 and the conductor layer 18 closest to substrate 10. FIG. 8B illustrates an exemplary structure of the composite layer. As shown in FIG. 8B, the composite layer may include a plurality of sub-layers, where at least one of the sub-layers include silicon oxynitride. In some embodiments, at least one of the sub-layers include silicon oxynitride and at least one of the sub-layers include silicon oxide. In some embodiments, at least one of the sub-layers include silicon oxynitride, at least one of the sub-layers include silicon oxide, and at least one of the sub-layers include silicon nitride. In some embodiments, x81 represents silicon oxide and x82 represents silicon oxynitride, and the composite layer include a plurality of alternatingly arranged sub-layers of silicon oxynitride and silicon oxide. In some embodiments, the number of sub-layers of each material and the thickness of each sub-layer may be associated with, e.g., the total thickness of the composite layer (e.g., the spacing between adjacent conductor layers 18) and/or the fabrication process, and should not be limited by the embodiments of the present disclosure.

FIG. 1C illustrates a cross-section view of memory device 103, according to some embodiments. Different from memory device 101, blocking layer 131 and memory layer 132 extend consistently along the horizontal direction and the vertical direction. Memory layer 132 may include a first memory portion 132a under and partially surrounding a bottom of the respective conductor layer 18 and composite layers on respective conductor layer 18, and a second memory portion 132b connected to adjacent first memory portions 132a. As shown in FIG. 1C, blocking layer 131 may be over memory layer 132, and may accordingly be under and partially surrounding the bottom of the respective conductor layer 18 and composite layers on respective conductor layer 18. The lateral portions of blocking layer 131 may have contact with composite layers laterally. First memory portion 132a may include a vertical portion 132a-1 and at least one lateral portion 132a-2. In some embodiments, the first portion may include vertical portion 132a-1 and a pair of lateral portions 132a-2. In some embodiments, second memory portion 132b extends vertically. As shown in FIG. 1C, second memory portions 132b and vertical portions 132a-1 of memory layer 132 may be staggered along the vertical direction. In some embodiments, a thickness of a composite layer, e.g., 17-1 or 17-2, may be less than about 5 nm, such as less than 5 nm (e.g., 0.5 nm, 1 nm, 1.5 nm, 2 nm, 2.5 nm, 3 nm, 3.5 nm, 4 nm, 4.5 nm, any range bounded by the lower end by any of these values, or in any range defined by any two of these values). A detailed description of gate-to-gate dielectric layer 17 and composite layers 17-1 and 17-2 may be referred to the description of gate-to-gate dielectric layer 17 and composite layers 17-1 and 17-2 in memory device 101, and is not repeated herein.

FIG. 1D illustrates a cross-sectional view of memory device 104, according to some embodiments. Different from memory device 103, gate-to-gate dielectric layer 17 has no airgap between adjacent conductor layers 18 and fills up the space between adjacent conductor layers 18 with a composite layer. In some embodiments, a composite layer fills up the space between substrate 10 and the conductor layer 18 closest to substrate 10. A detailed description of structures and materials of gate-to-gate dielectric layer 17 and the composite layer may be referred to the description of gate-to-gate dielectric layer 17 and the composite layer in memory device 102, and is not repeated herein.

FIG. 1E illustrates a cross-sectional view of memory device 105, according to some embodiments. Different from memory devices 101 and 103, memory device 105 includes a semiconductor channel 14 in which blocking layer 131, memory layer 132, tunneling layer 133, and semiconductor layer 134 each extends continuously along the vertical direction. In some embodiments, a thickness of a composite layer, e.g., 17-1 or 17-2, may be less than about 5 nm, such as less than 5 nm (e.g., 0.5 nm, 1 nm, 1.5 nm, 2 nm, 2.5 nm, 3 nm, 3.5 nm, 4 nm, 4.5 nm, any range bounded by the lower end by any of these values, or in any range defined by any two of these values). A detailed description of gate-to-gate dielectric layer 17 may be referred to the description of memory device 101 and is not repeated herein.

FIG. 1F illustrates a cross-sectional view of memory device 106, according to some embodiments. Different from memory device 104, memory device 106 includes a dielectric layer 170 sandwiched by a pair of composite layers 17-1 and 17-2, where dielectric layer 170 includes a material that is different from the materials of composite layers 17-1 and 17-2. In some embodiments, dielectric layer 170 includes silicon nitride. Optionally, an adhesive layer 124, including titanium and/or titanium oxide, is formed between conductor layer 18 and gate-to-gate dielectric layer 17. In some embodiments, a thickness of a composite layer, e.g., 17-1 or 17-2, may be less than about 5 nm, such as less than 5 nm (e.g., 0.5 nm, 1 nm, 1.5 nm, 2 nm, 2.5 nm, 3 nm, 3.5 nm, 4 nm, 4.5 nm, any range bounded by the lower end by any of these values, or in any range defined by any two of these values). A detailed description of structures and materials of composite layers 17-1 and 17-2 may be referred to the description of composite layers 17-1 and 17-2 of memory device 101, and is not repeated herein.

Figure 9A:
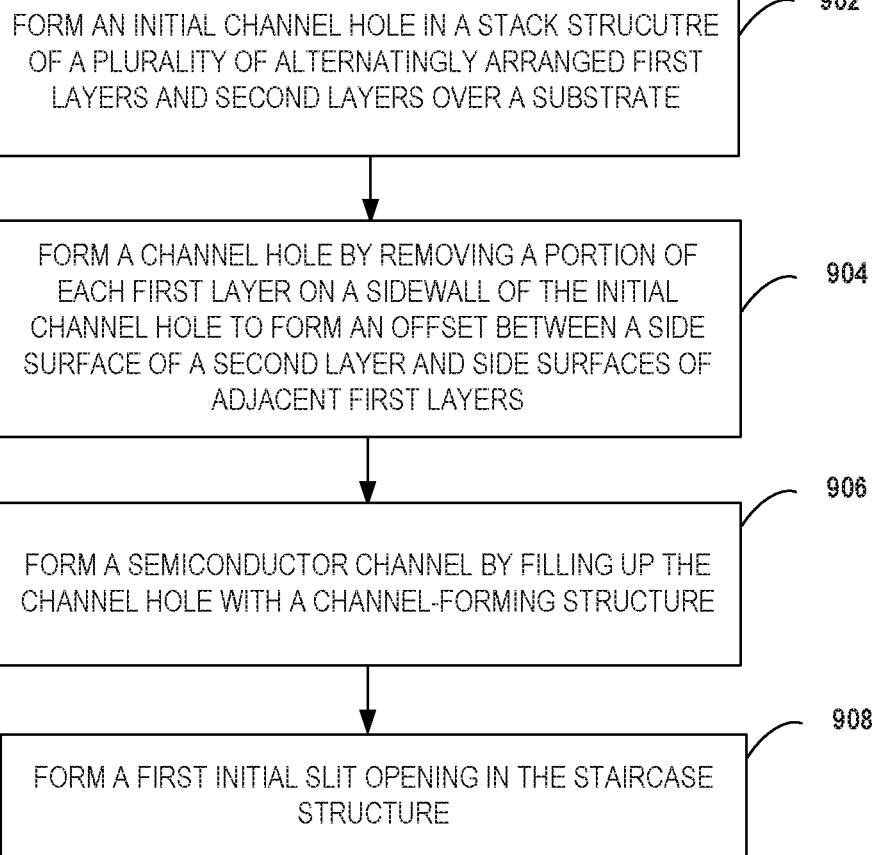
FIG. 9A illustrates a flowchart of an exemplary method for forming a semiconductor channel in a stack structure, according to some embodiments of the present disclosure.

FIGS. 2A-2G illustrate a method for forming a stack structure with semiconductor channels with "bent" structures, according to some embodiments. Structure 200 depicted in FIG. 2G can be used as the base structure to form memory devices 101-104. FIG. 9A illustrates the flowchart of fabrication process 900 depicted in FIGS. 2A-2G.

Figure 2A:
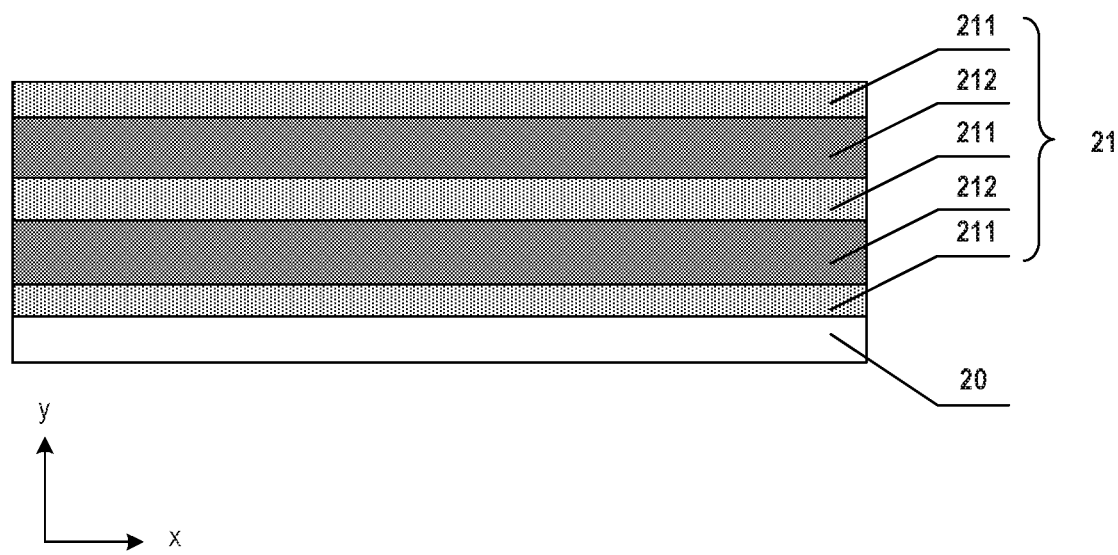
FIGS. 2A-2G illustrate structures of a 3D memory device at various stages of an exemplary fabrication process, according to some embodiments of the present disclosure.
Figure 2B:
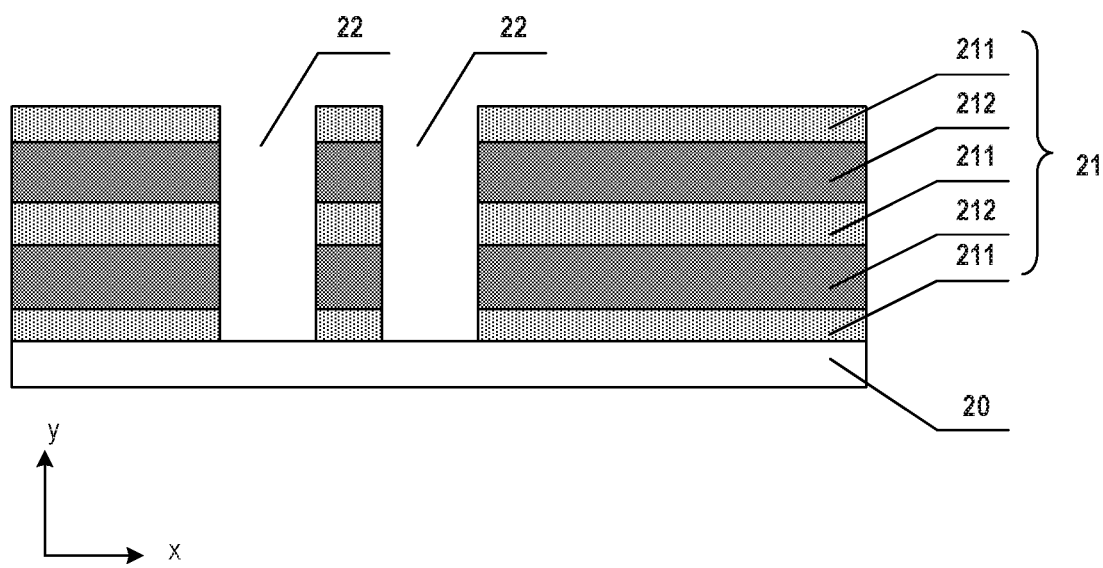

Referring to FIG. 9A, at the beginning of the fabrication process, an initial channel hole is formed in a stack structure that has a plurality of alternatingly arranged first layers and second layers over a substrate (Operation 902). FIGS. 2A and 2B illustrate corresponding structures.

As shown in FIG. 2A, a stack structure 21 having a plurality of alternatingly arranged first layers 211 and second layers 212 is formed over a substrate 20. The material of substrate 20 may be referred to the description of substrate 10 and is not repeated herein. In some embodiments, substrate 20 includes silicon (N-type silicon).

Stack structure 21 can provide the fabrication base for the formation of a 3D memory device. Memory strings (e.g., NAND memory strings) that include semiconductor channels and related structures/parts can be subsequently formed in stack structure 21. In some embodiments, stack structure 21 includes a plurality of first layer 211/second layer 212 pairs stacked vertically over substrate 20, forming a staircase structure. Each first layer 211/second layer 212 pair can include one first layer 211 and one second layer 212, and can form a staircase/level. That is, stack structure 21 can include interleaved first layers 211 and second layers 212 stacked along the vertical direction. The number of first layer 211/second layer 212 pairs in stack structure 21 (e.g., 32, 64, 96, or 128) can set the number of memory cells in the 3D memory device.

First layers 211 can each have the same thickness or have different thicknesses. Similarly, second layers 212 can each have the same thickness or have different thicknesses. Second layers 212 can include any suitable materials that are different from the material of first layers 211 so that an etchant (e.g., used in the subsequent fabrication process to remove first layers 211) can have a higher etch rate on first layers 211 over second layers 212. That is, the etchant can selectively etch first layers 211 over second layers 212. In some embodiments, first layers 211 can include a sacrificial material and second layers 212 can include a conductor material. In some embodiments, first layers 211 can include a sacrificial material and second layers 212 can include another sacrificial layer. The specific choices of materials of first layers 211 and second layers 212 should be determined by the fabrication process (e.g., the gate-first fabrication process or the gate-last fabrication process) and will be explained in detail as follows.

Stack structure 21 can be formed by, e.g., repetitively etching a dielectric stack of a plurality of first material layer/second material layer pairs vertically and laterally. The etching of the first material layer/second material layer pairs can include repetitively etching/trimming an etch mask (e.g., a photoresist layer) over the dielectric stack to expose the portion of first material layer/second material layer pair to be etched, and etching/removing the exposed portion using a suitable etching process. The etching of the etch mask and the insulating material layer/sacrificial material layer pairs can be performed using any suitable etching processes such as wet etch and/or dry etch. In some embodiments, the etching includes dry etch, e.g., inductively coupled plasma etching (ICP) and/or reactive-ion etch (RIE).

An initial channel hole 22 can be formed in stack structure 21. In some embodiments, initial channel hole 22 extends from a top surface of stack structure 21 to substrate 20. In some embodiments, a bottom portion of initial channel hole 22 exposes substrate 20. Initial channel hole 22 can be formed by any suitable fabrication process. For example, a patterned photoresist layer can be formed over stack structure 21. The patterned photoresist layer can expose a portion of stack structure 21 for forming initial channel hole 22. A suitable etching process can be performed to remove the portion of stack structure 21 until substrate 20 is exposed. The etching process can include a dry etching process.

Figure 2C:
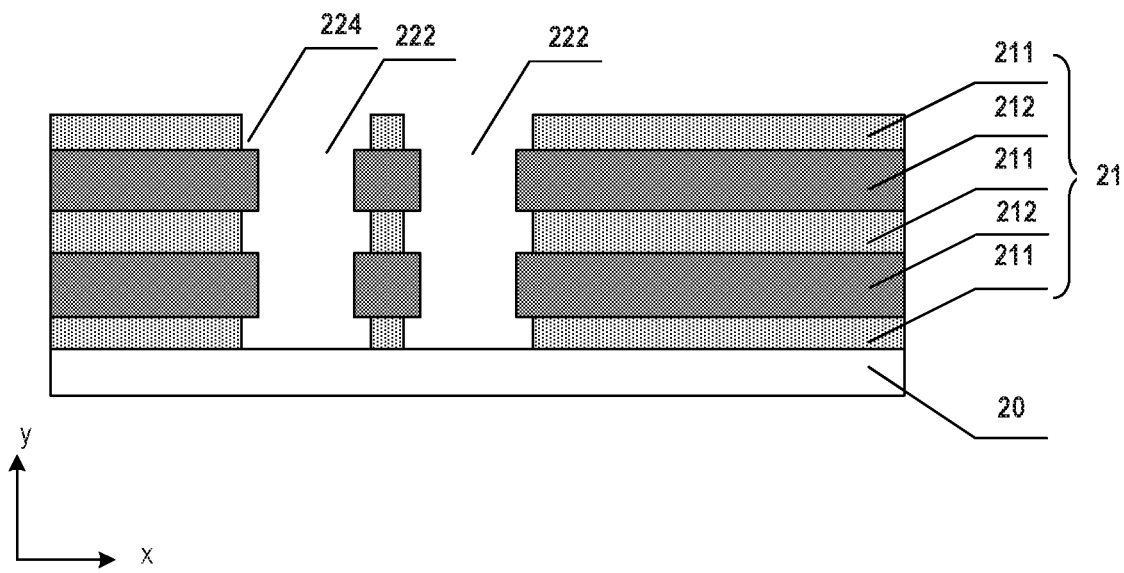

Referring back to FIG. 9A, after initial channel holes are formed, a channel hole is formed by removing a portion of each first layer on a sidewall of the initial channel hole to form an offset between a side surface of a second layer and side surfaces of adjacent first layers (Operation 904). FIG. 2C illustrates a corresponding structure.

As shown in FIG. 2C, a portion of each first layer 211 on the sidewall of initial channel hole 22 can be removed to form channel hole 222. For ease of description, the surface of first layer 211 (or second layer 212) facing initial channel hole 22 or channel hole 222 is referred to as a side surface of first layer 211 (or second layer 212). In some embodiments, an offset 224 can be formed on the side surface of first layer 211. The dimension or thickness of the removed portion (e.g., along the later direction or the x-direction) of first layer 211 can be any suitable value that allows an offset to be formed between the side surface of second layer 212 and first layer 211. In some embodiments, the side surfaces of second layers 212 form protrusions along the sidewall of channel hole 222. Any suitable selective etching process (e.g., a recess etch) can be performed to form offsets 224. In some embodiments, the selective etching process has a high etching selectivity on first layers 211 over second layers 212, causing little or no damage on second layers 212. A wet etch and/or a dry etch can be performed as the selective etching process. In some embodiment, an RIE is performed as the selective etching process.

Figure 2D:
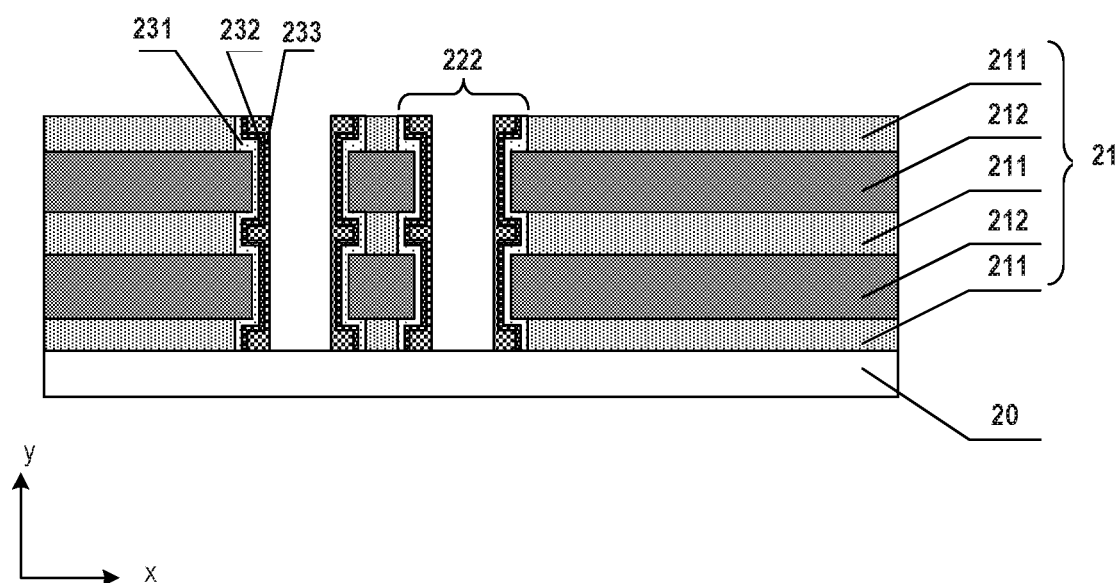
Figure 2E:
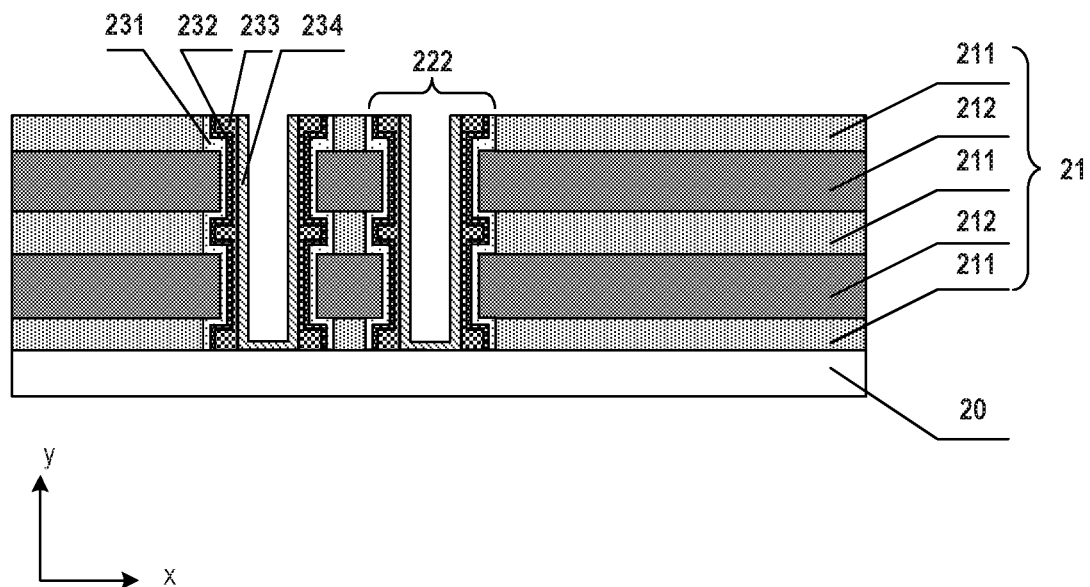
Figure 2F:
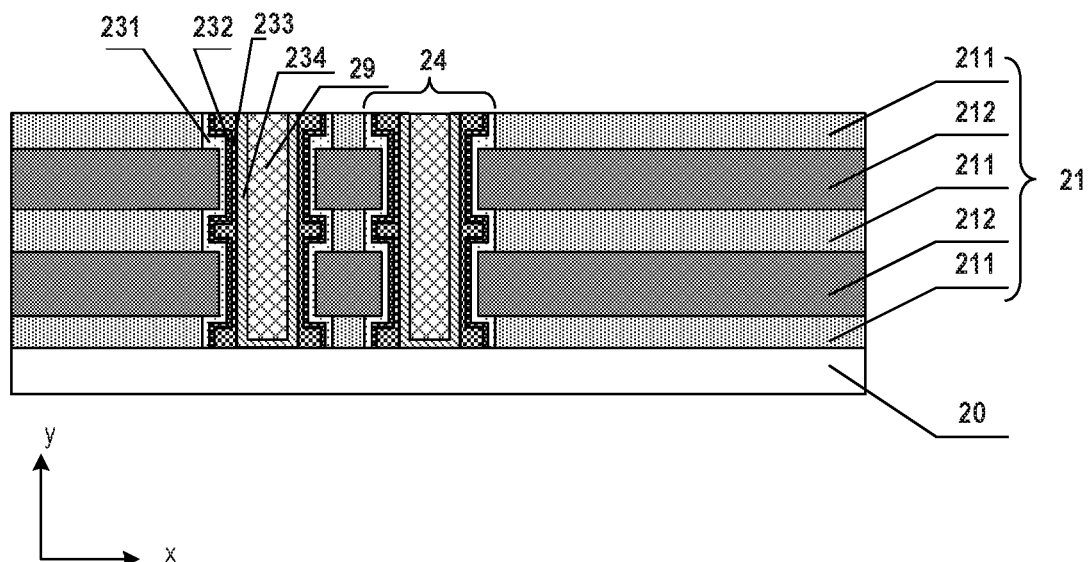

Referring to FIG. 9A, after the formation of the channel hole, a channel-forming structure is formed to fill up the channel hole, and a semiconductor channel is formed (Operation 906). FIGS. 2D-2F illustrates corresponding structures.

As shown in FIG. 2D-2F, a semiconductor channel 24 can be formed by filling channel hole 222 with a channel-forming structure. The channel forming structure may include a blocking layer 231 deposited along the sidewall of channel hole 222, a memory layer 232 over the blocking layer, a tunneling layer 233 over the blocking layer, a semiconductor layer 234 over the tunneling layer, and a dielectric core 29 filling up the rest of channel hole 222. Each of these layers may be respectively the same as or similar to blocking layer 131, memory layer 132, tunneling layer 133, semiconductor layer 134, and dielectric core 19 illustrated in FIG. 1A. A detailed description of the materials of these layers is thus not repeated herein.

As shown in FIG. 2D, in some embodiments, a blocking material layer, a memory material layer, and a tunneling material layer, are sequentially deposited in channel hole 222 along a radial direction from the sidewall towards the center of channel hole 222. The materials of the blocking material layer, the memory material layer, and the tunneling material layer can be referred to the description of blocking layer 131, memory layer 132, and tunneling layer 133, and are not repeated herein. The blocking material layer can be formed by a suitable deposition method such as chemical vapor deposition (CVD), atomic layer deposition (ALD), pulsed laser deposition (PLD), low pressure CVD (LPCVD), and/or liquid source misted chemical deposition. The memory material layer can be formed by any suitable deposition method such as CVD, ALD, and physical vapor deposition (PVD). The tunneling material layer can be formed by a suitable deposition method such as CVD, ALD, and/or PVD. A recess etching process, such as dry etch, can be performed to remove portions of the blocking material layer, the memory material layer, and the tunneling material layer at the bottom of channel hole 222 to expose substrate 20. Blocking layer 231, memory layer 232, and tunneling layer 233 can then be formed accordingly.

As shown in FIGS. 2E and 2F, a semiconductor layer 234 is deposited over tunneling layer 233 and substrate 20, and a dielectric core 29 is deposited over semiconductor layer 234 to fill up the rest of the space in channel hole 222, forming semiconductor channel 24. Semiconductor layer 234 can be formed by any suitable deposition method such as LPCVD, ALD, and/or metal-organic chemical vapor deposition (MOCVD). In some embodiments, dielectric core 29 includes SiO (e.g., SiO of sufficiently high purity) and can be formed by any suitable deposition method such as CVD, LPCVD, ALD, and/or PVD.

Figure 2G:
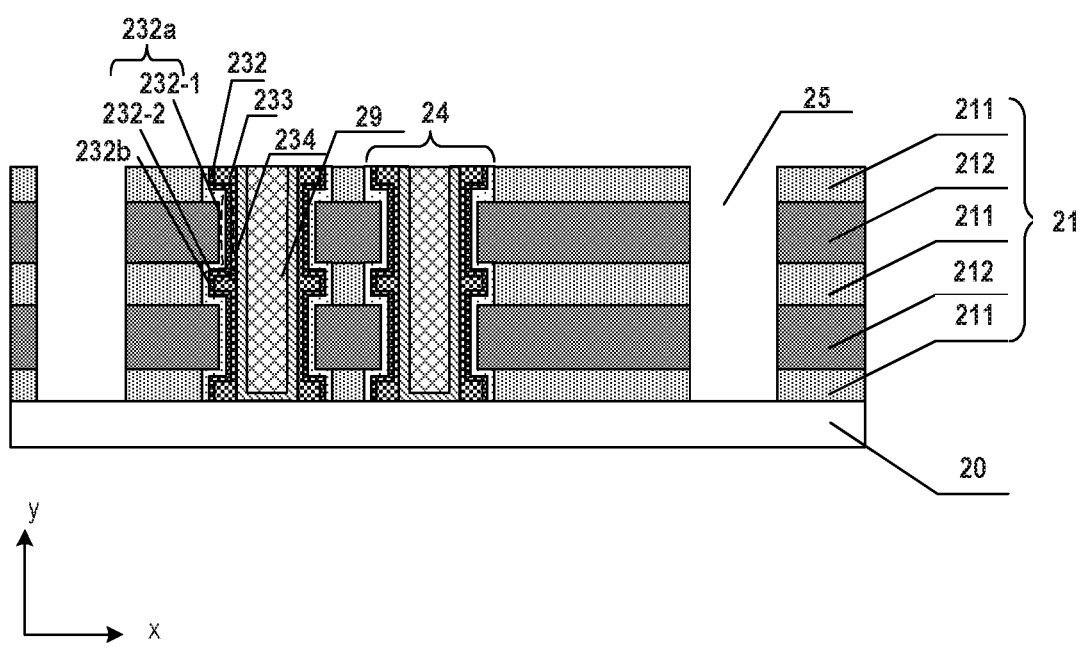

Referring back to FIG. 9A, after the formation of the semiconductor channel, a first initial slit opening is formed in the stack structure (Operation 908). FIG. 2G illustrates a corresponding structure 200.

As shown in FIG. 2G, a first initial slit opening 25 is formed to extend through the stack structure and expose substrate 20. A suitable etching process, e.g., a dry etching process, can be performed to form first initial slit opening 25.

Figure 9B:
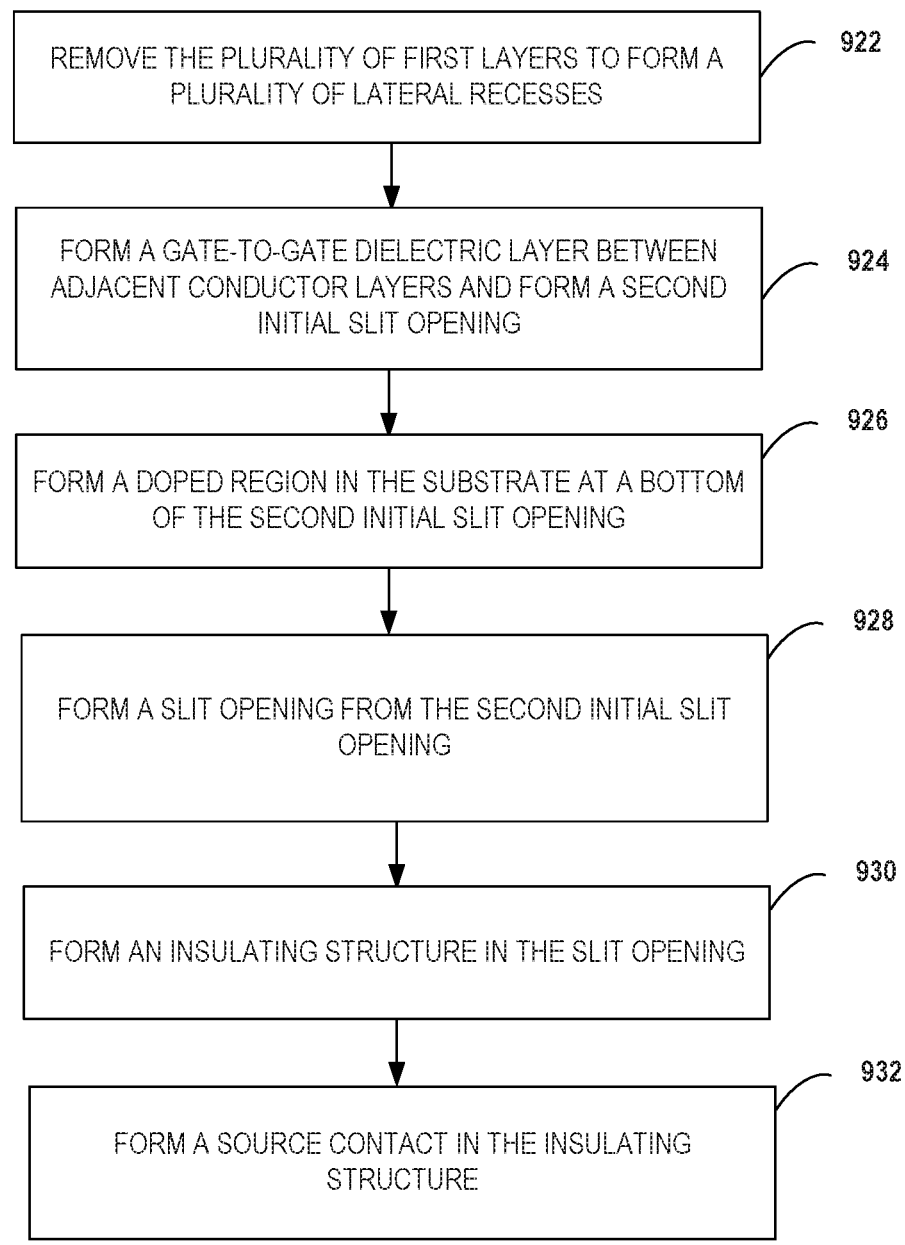
FIGS. 9B-9D each illustrates a flowchart of an exemplary method for forming a 3D memory device following the method of FIG. 9A, according to some embodiments of the present disclosure.

FIGS. 3A-3J illustrate a "gate first" method to form memory devices 103 and 104 based on structure 200, according to some embodiments. Specifically, FIGS. 3A, 3C, 3E, 3G, and 3I illustrate the fabrication process to form memory device 103 based on structure 200, and FIGS. 3B, 3D, 3F, 3H, and 3J illustrate the fabrication process to form memory device 104 based on structure 200. In the "gate first" method, first layers 211 include a sacrificial material and second layers 212 include a conductor material for subsequently forming conductor layers 18. In some embodiments, second layers 212 include polysilicon. FIG. 9B illustrates the flowchart of fabrication process 920 depicted in FIGS. 3A-3J to form memory devices 103 and 104.

Figure 3A:
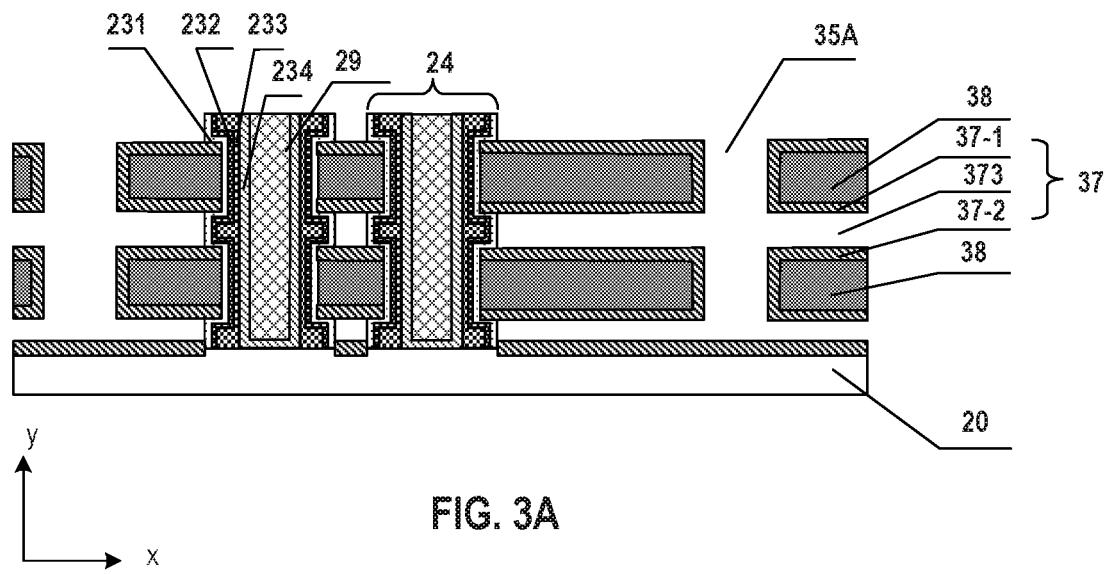
FIGS. 3A-3J illustrate structures of a 3D memory device at various stages of another exemplary fabrication process, according to some embodiments of the present disclosure.
Figure 3B:
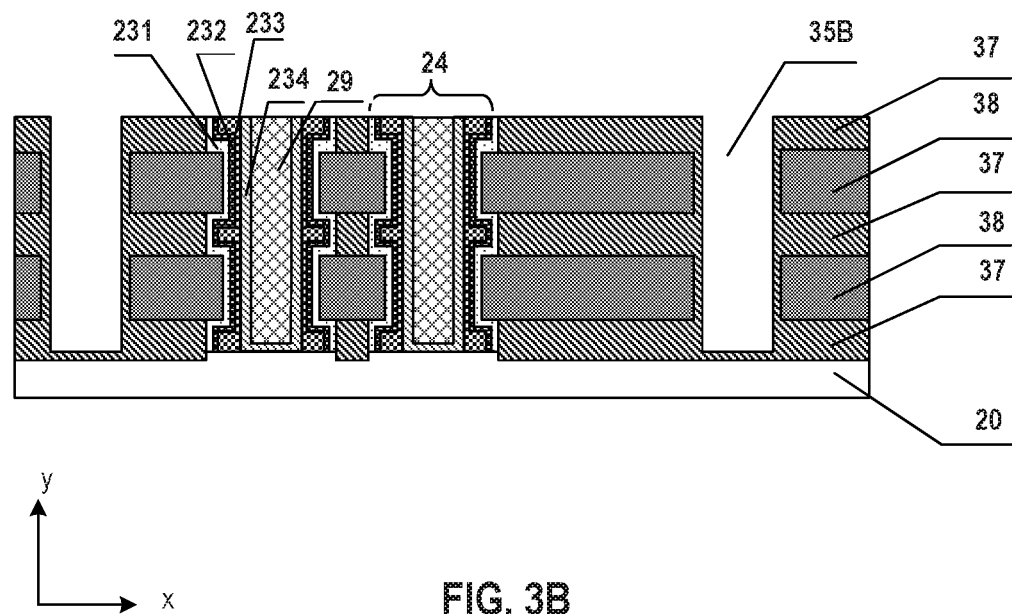

As shown in FIG. 9B, at the beginning of the fabrication process, the plurality of first layers are removed (Operation 922) and a gate-to-gate dielectric layer is formed between adjacent conductor layers (Operation 924). A second initial slit opening is formed from the first initial slit opening. FIGS. 3A and 3B respectively illustrate a corresponding structure. In some embodiments, an isotropic etching process (e.g., wet etch) is performed to remove first layers 211 and expose blocking layer 231 and substrate 20. A plurality of lateral recesses can be formed from the removal of first layers 211.

As shown in FIG. 3A, an oxidation reaction and/or a nitriding reaction may be performed to form a composite layer from a portion of second layer 212 that reacts with the reactants. The unreacted portion of second layer 212 may form a conductor layer 38 that can function as a gate electrode of memory device 103. The reacted portion of second layer 212 may form a composite layer 37-1 or 37-2 (e.g., similar to or the same as 17-1 or 17-2) covering conductor layer 38. The composite layer may be formed from a top portion/upper surface of second layer 212 and from a bottom portion/lower surface of second layer 212. An airgap 373 may be formed between composite layers 37-1 and 37-2 on adjacent conductor layers 38. In some embodiments, a pair of composite layers (e.g., 37-1 and 37-2) facing each other and on adjacent conductor layers 38 and airgap 373 in between may form a gate-to-gate dielectric layer 37, similar to or the same as gate-to-gate dielectric layer 17 illustrated in FIGS. 1A and 1C. In some embodiments, the composite layer (e.g., 37-1 or 37-2) may also be formed on the side surface of second layers 212 (e.g., the sidewall of first initial slit opening 25), forming a second initial slit opening 35A from first initial slit opening 25.

In some embodiments, a plurality of gate-to-gate dielectric layers 37 are formed by oxidizing and/or nitriding second layers 212 through first initial slit opening 25 and the lateral recesses. In some embodiments, to form plurality of gate-to-gate dielectric layers 37, oxygen diffusion concentration and/or nitrogen diffusion concentration is controlled, such that each gate-to-gate dielectric layer 37 includes at least one sub-layer of silicon oxynitride. In some embodiments, each composite layer (e.g., 37-1 or 37-2) includes at least a sub-layer of silicon oxynitride. In some embodiments, oxygen and/or nitrogen diffusion concentration are controlled, so each of the plurality of gate-to-gate dielectric layers 37 can have the structures described in FIG. 1A. For example, each gate-to-gate dielectric layer 37 includes a pair of composite layers (e.g., 37-1 and 37-2), each including a plurality of alternatingly arranged sub-layers of silicon oxynitride and silicon oxide. The specific structure of each composite layer should not be limited by the embodiments of the present disclosure. In some embodiments, a composite layer may be formed over substrate 20 from the oxidation and/or nitridation reaction.

Different from the process to form gate-to-gate dielectric layer 37 from portions of second layers 212, as shown in FIG. 3B, gate-to-gate dielectric layer 37 can be formed by depositing a dielectric material to fill up the lateral recesses and performing an oxidizing reaction and/or a nitriding reaction to form the at least one sub-layer of silicon oxynitride in each gate-to-gate dielectric layer 37. The process can be performed through the lateral recess and first initial slit opening 25. In some embodiments, a dielectric material, such as silicon oxide or silicon nitride, may be deposited by a suitable deposition method, e.g., CVD, ALD, and/or PVD, to fill up the lateral recesses. An oxidizing reaction and/or a nitriding reaction may be performed on the deposited dielectric material between adjacent second layers 212 to form gate-to-gate dielectric layer 37, which includes a composite layer having at least one sub-layer of silicon oxynitride. In some embodiments, each composite layer includes at least a sub-layer of silicon oxynitride. In some embodiments, oxygen and/or nitrogen diffusion concentration are controlled so each of the plurality of gate-to-gate dielectric layers 37 can have the structures described in FIG. 1B. For example, each gate-to-gate dielectric layer 37 includes a composite layer having a plurality of alternatingly arranged sub-layers of silicon oxynitride and silicon oxide. No airgap is formed between adjacent second layers 212. In some embodiments, gate-to-gate dielectric layer 37 covers blocking layer 231. The specific structure of each composite layer should not be limited by the embodiments of the present disclosure. In some embodiments, second layers 212 form conductor layers 38. In some embodiments, an adhesion layer (not shown) may be formed on second layers 212 before the deposition of the dielectric material. In some embodiments, the composite layer may also be formed on the side surface of second layers 212 (e.g., the sidewall of first initial slit opening 25), forming a second initial slit opening 35B from first initial slit opening 25. In some embodiments, a composite layer may be formed over substrate 20 from the oxidation and/or nitridation reaction.

Figure 3C:
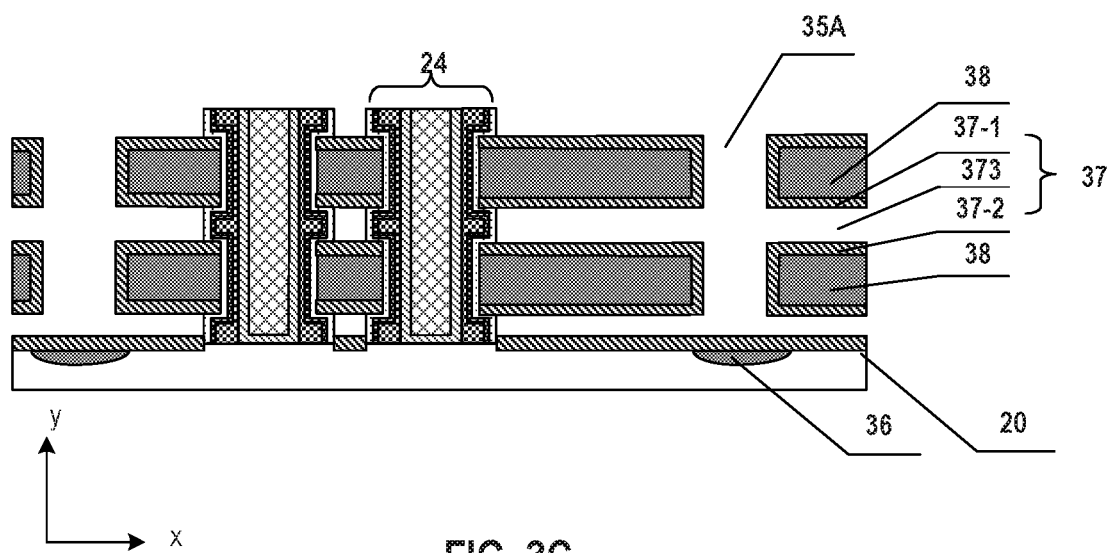
Figure 3D:
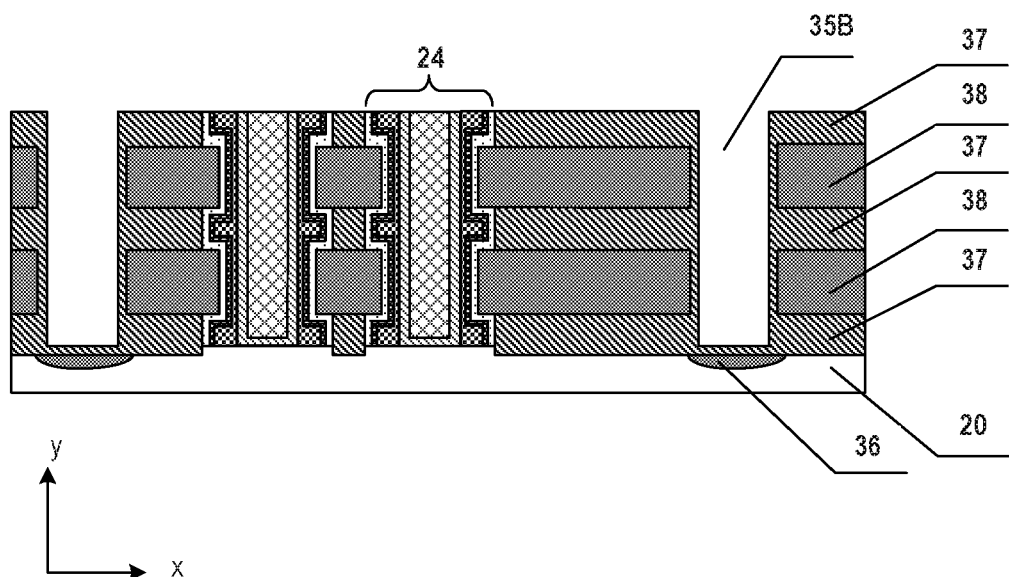

Referring back to FIG. 9B, after the formation of gate-to-gate dielectric layers, a doped region may be formed in the substrate at a bottom of the second initial slit opening (Operation 926). FIGS. 3C and 3D illustrate corresponding structures.

As shown in FIGS. 3C and 3D, a doped region 36 may be formed in substrate 20 at the bottom of the second initial slit opening (e.g., 35A in FIG. 3C and 35B in FIG. 3D). A suitable doping process, such as ion implantation, can be performed to form doped region 36. In some embodiments, a portion of the composite layer at the bottom of the second initial slit opening (e.g., 35A and 35B) is removed to expose substrate 20 before the doping process. In some embodiments, the portion of the composite layer at the bottom of the second initial slit opening (e.g., 35A and 35B) is retained.

Figure 3E:
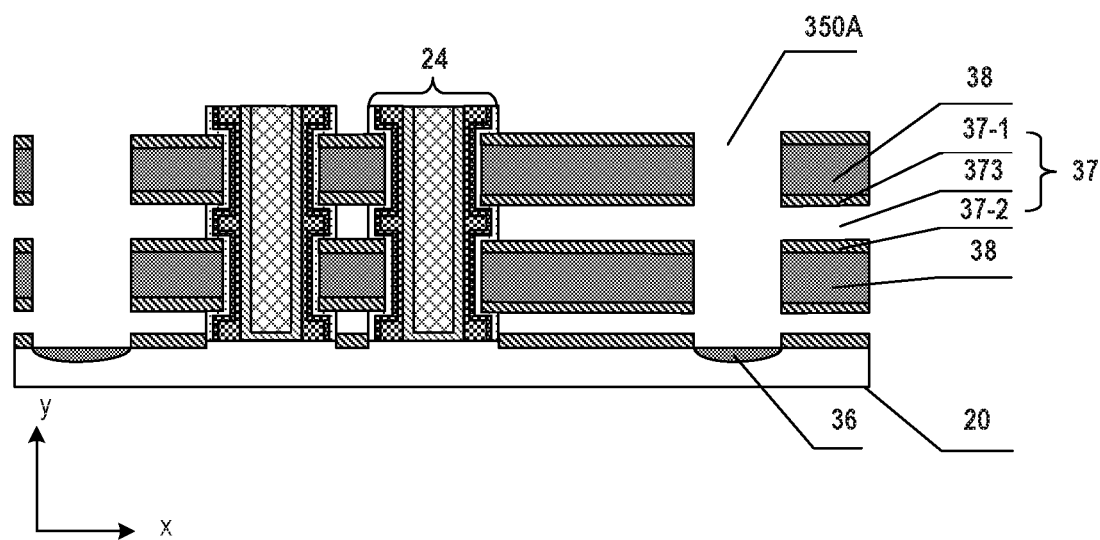
Figure 3F:
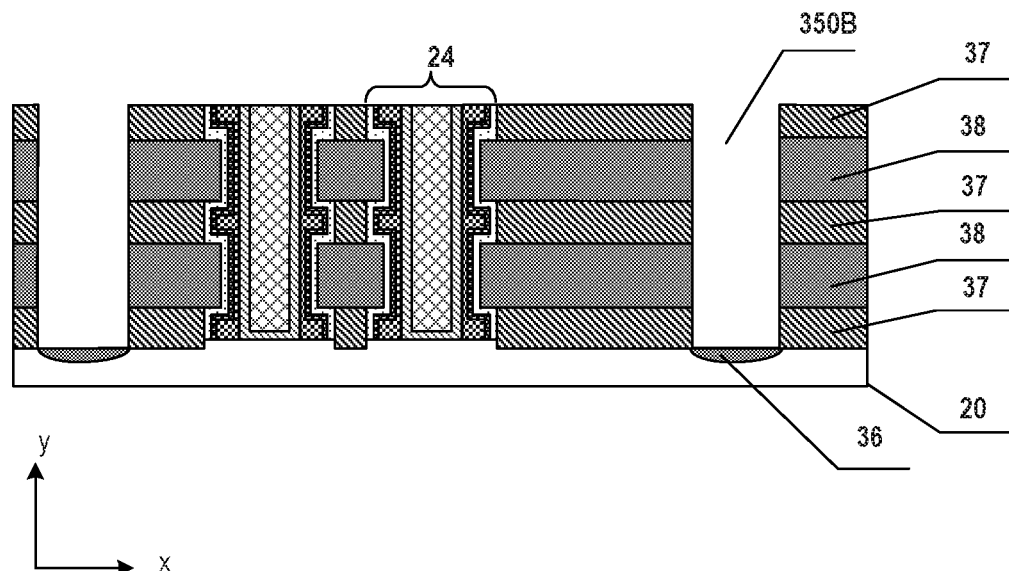

Referring back to FIG. 9B, after the formation of the doped region, a slit opening is formed from the second initial slit opening (Operation 928). FIGS. 3E and 3F illustrate corresponding structures.

As shown in FIGS. 3E and 3F, a slit opening (e.g., 350A in FIG. 3E and 350B in FIG. 3F) is formed from respective second initial slit opening (e.g., 35A in FIG. 3C and 35B in FIG. 3D). In some embodiments, a recess etch is performed to remove any excess materials from the side surfaces of conductor layers 38, forming slit opening 350A/350B. In some embodiments, excess material (e.g., the material of a composite layer) over substrate 20 at the bottom of second initial slit opening 35A/35B can also be etched and removed. The sidewall of slit opening 350A/350B may expose conductor layers 38. In some embodiments, the sidewall of slit opening 350A exposes airgaps 373. In some embodiments, the sidewall of slit opening 350A/350B also exposes gate-to-gate dielectric layers 37.

Figure 3G:
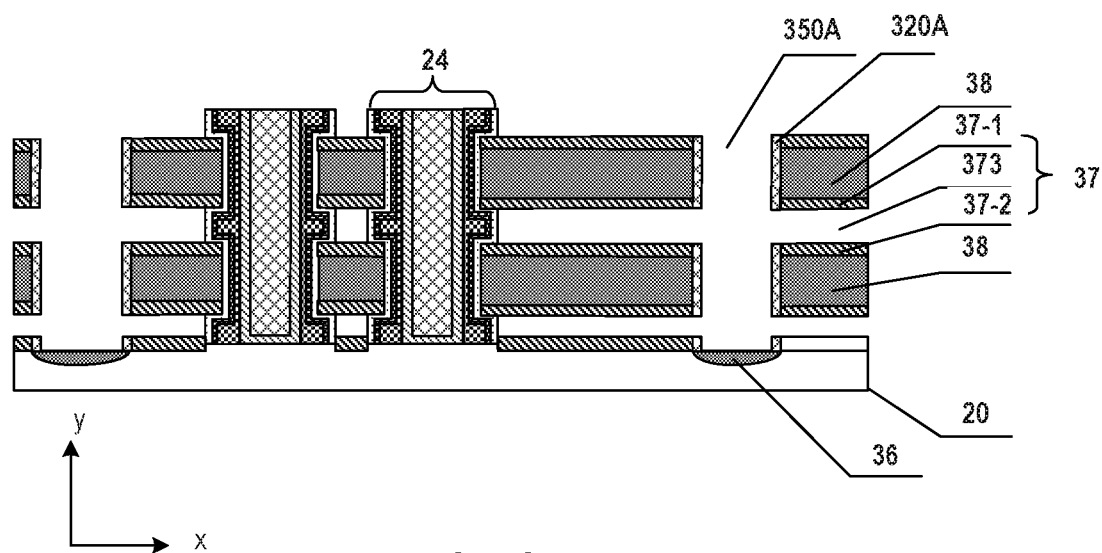
Figure 3H:
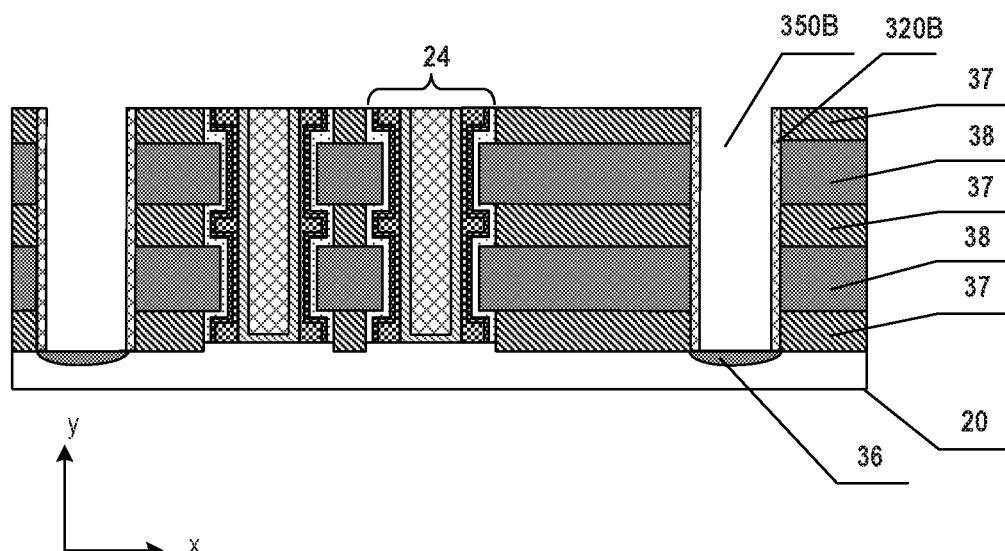

Referring back to FIG. 9B, an insulating structure is formed in the slit opening (Operation 930). FIGS. 3G and 3H illustrate corresponding structures.

As shown in FIGS. 3G and 3H, an insulating structure (e.g., 320A in FIG. 3G and 320B in FIG. 3H) may be formed in respective slit structure (e.g., 350A in FIG. 3G and 350B in FIG. 3H). In some embodiments, insulating structure 320A/320B is formed over the sidewall of respective slit opening 350A/350B and exposes substrate 20 (e.g., or doped region 36) at the bottom of respective slit opening 350A/350B. In some embodiments, insulating structure 320A/320B includes a dielectric material, such as silicon oxide, and is deposited by a suitable deposition process such as CVD, ALD, LPCVD, and/or PVD. In some embodiments, a recess etch (e.g., dry etch and/or wet etch) is performed to remove any excess material (e.g., material deposited during the formation of insulating structure 320A/320B) at the bottom of slit structure 350A/350B to expose substrate 20 (e.g., or doped region 36).

Figure 3I:
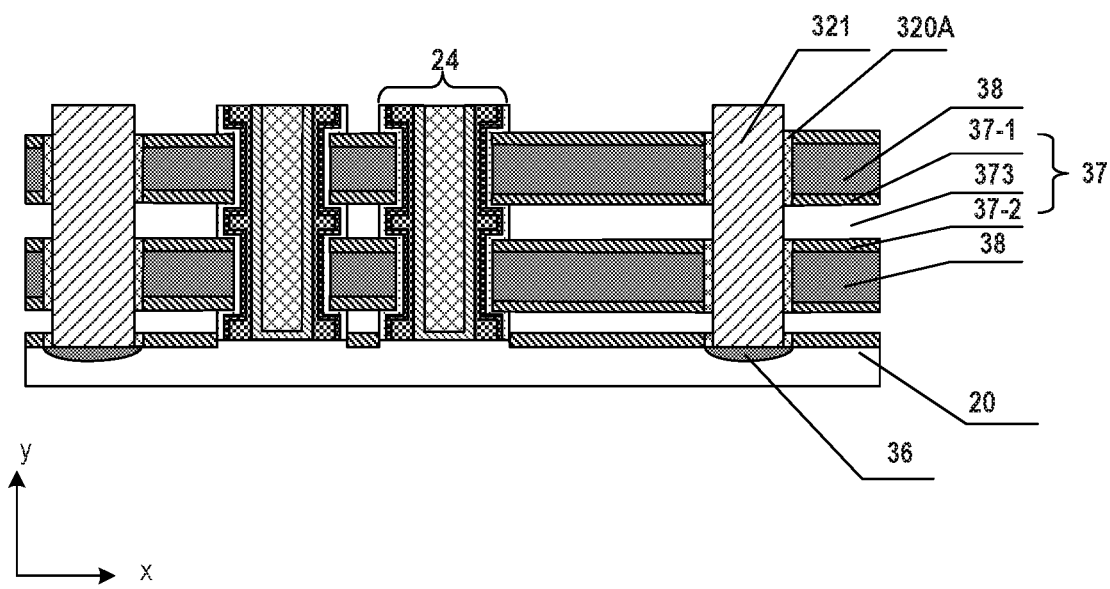
Figure 3J:
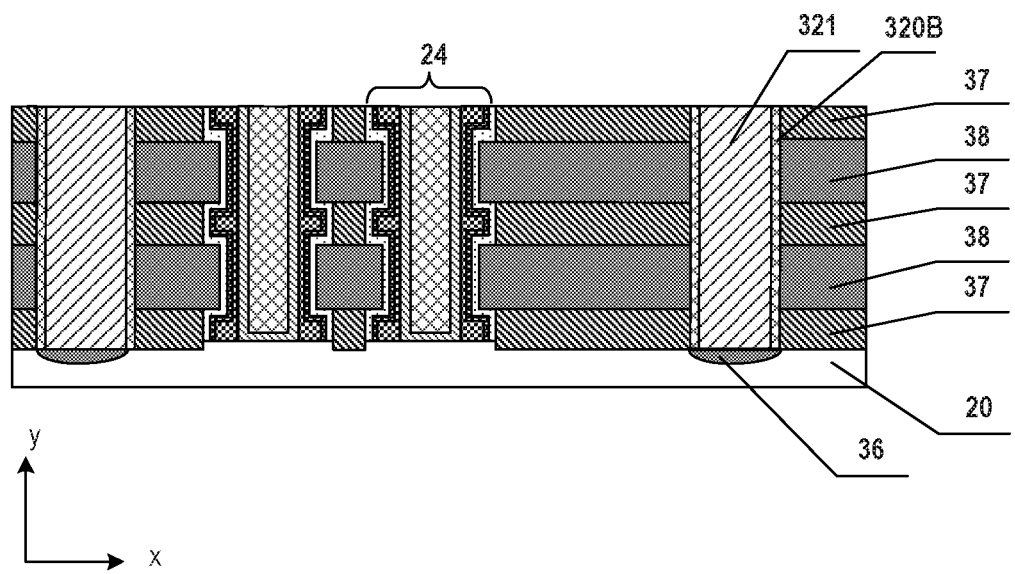

Referring back to FIG. 9B, after the formation of insulating structure, a source contact is formed in the insulating structure (Operation 932). FIGS. 3I and 3J illustrate corresponding structures.

As shown in FIGS. 3I and 3J, a suitable conductive material can be deposited in insulating structure 320A/320B to form a respective source contact 321. Any suitable deposition method can be used to form source contact 321. For example, source contact 321 can be formed by CVD, ALD, and/or PVD. In some embodiments, source contact 321 includes tungsten and is deposited by CVD. In some embodiments, source contact 321A, doped region 36, and respective insulating structure 320A/320B form a source structure. A suitable planarization process (e.g., recess etch and/or chemical-mechanical polishing) can be performed to planarize the top surface of the stack structure, e.g., planarizing the source structures, semiconductor channels 24, and/or gate-to-gate dielectric layers 37.

Figure 9C:
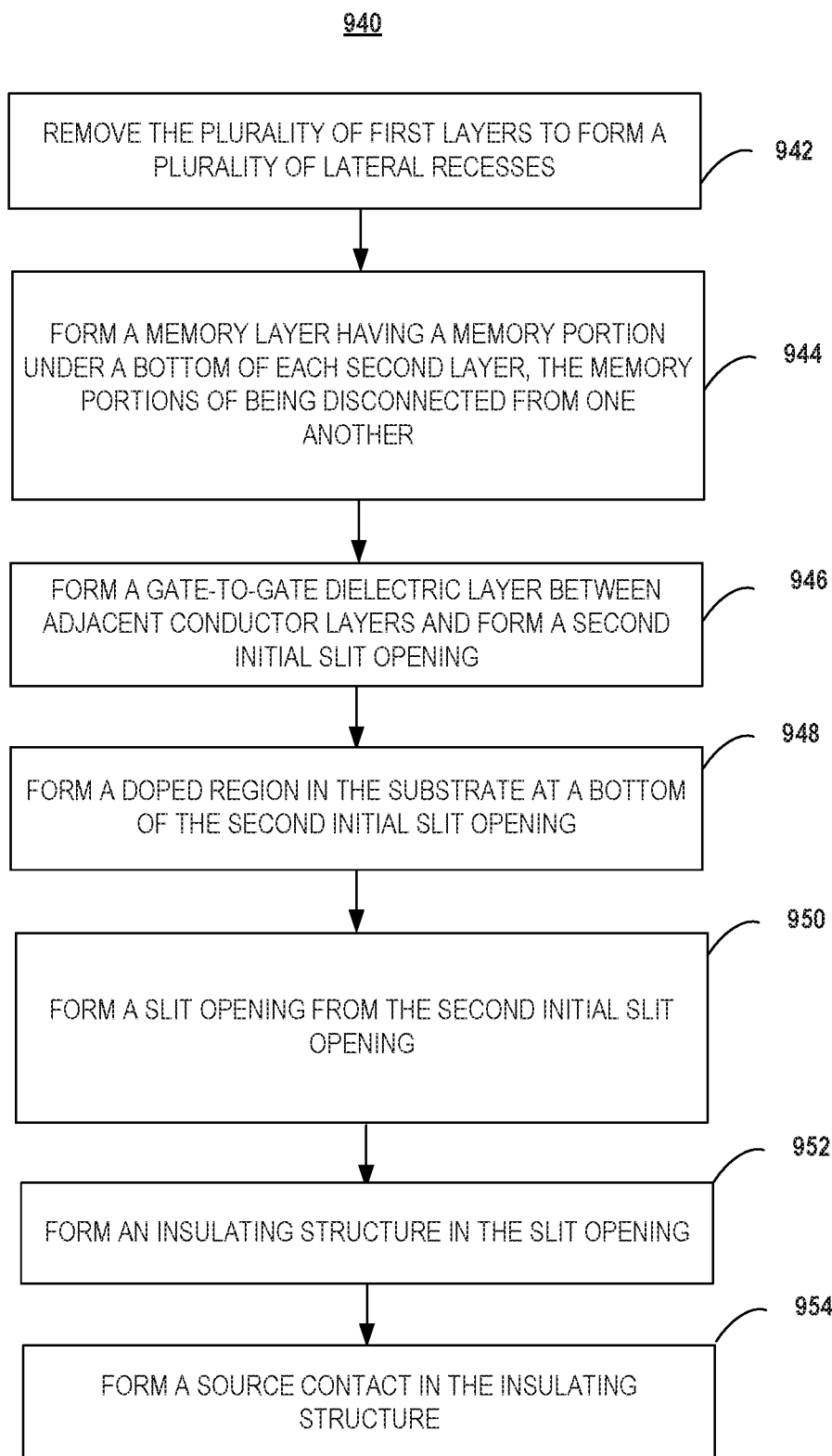

FIGS. 4A-4G illustrate a "gate first" method to form memory devices 101 and 102 based on structure 200, according to some embodiments. Specifically, FIGS. 4A, 4B, 4D, and 4F illustrate the fabrication process to form memory device 101 based on structure 200, and FIGS. 4A, 4C, 4E, and 4G illustrate the fabrication process to form memory device 102 based on structure 200. In the "gate first" method, first layers 211 include a sacrificial material and second layers 212 include a conductor material for subsequently forming conductor layers 18. In some embodiments, second layers 212 include polysilicon. FIG. 9C illustrates a flowchart 940 for fabrication processes depicted in FIGS. 4A-4G to form memory devices 101 and 102.

Figure 4A:
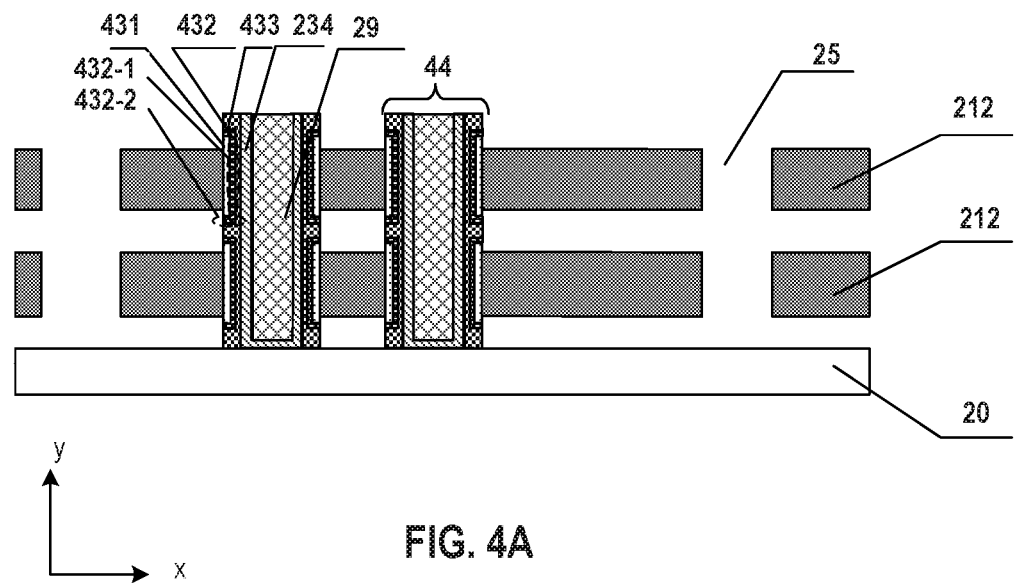
FIGS. 4A-4G illustrate structures of a 3D memory device at various stages of another exemplary fabrication process, according to some embodiments of the present disclosure.

As shown in FIG. 9C, at the beginning of the fabrication process, the plurality of first layers are removed (Operation 942) and a memory layer having a memory portion under a bottom of each second layer is formed (Operation 944). The memory portions are disconnected from one another. FIG. 4A illustrates a corresponding structure. In some embodiments, an isotropic etching process (e.g., wet etch) is performed to remove the first layers (e.g., 211) to form a plurality of lateral recesses that expose the blocking layer (e.g., 231) and the substrate (e.g., 20).

As shown in FIG. 4A, a blocking layer 431 having a plurality of blocking portions, each under a bottom of a respective second layer 212 and disconnected from each other, is formed. Also, a memory layer 432 having a plurality of memory portions, each under a respective blocking portion, is formed. Each memory portion may include a vertical portion 432-1 and at least one lateral portion 432-2 connected to vertical portion 432-1. In some embodiments, each memory portion includes a pair of lateral portions 432-2 being connected to a different end of the respective vertical portion 432-1. Each memory portion may surround the respective blocking portion under the bottom of the respective second layer 212 and may be disconnected from one another along the vertical direction. A tunneling layer 433 under and partially surrounding memory layer 432 is also formed and extend along the vertical direction consistently. In some embodiments, tunneling layer 433 may be exposed between adjacent second layers 212.

A suitable etching process (e.g., a wet etch) may be performed on structure 200 to remove portions of semiconductor channel 24 from first initial slit opening 25 and the lateral recesses. In some embodiments, at least second memory portions 232b are removed to expose lateral portions 232a-2 of first memory portions 232a. First memory portions 232a may fully or partially be retained to form the memory portions. Depending on the etching process, lateral portions 232-2 may be over-etched, and the length of lateral portion 232a-2 may vary along the lateral direction in different applications. In some embodiments, portions of blocking layer 231 and tunneling layer 233 may also be removed during the etching process. Blocking portions, disconnected from one another and over memory portions, may be formed. Semiconductor channel 24, after the formation of memory portions, may form a semiconductor channel 44.

Figure 4B:
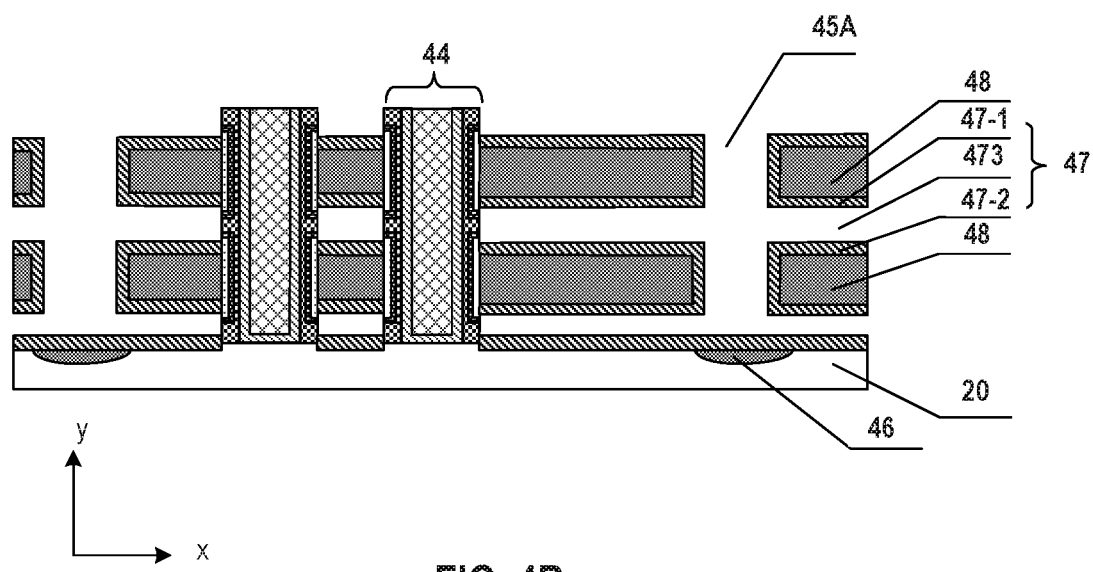
Figure 4C:
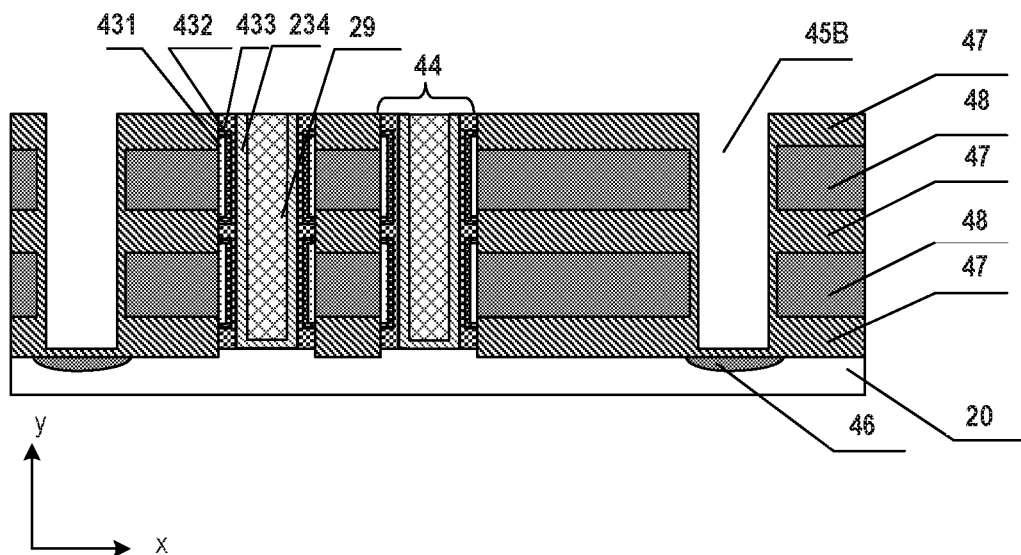

Referring back to FIG. 9C, a gate-to-gate dielectric layer is formed between adjacent conductor layers and a second initial slit opening is formed (Operation 946). Also, a doped region is formed in the substrate at the bottom of the second initial list opening (Operation 948). FIGS. 4B and 4C respectively illustrate a corresponding structure.

FIG. 4B illustrates a gate-to-gate dielectric layer 47 with an airgap. As shown in FIG. 4B, a gate-to-gate dielectric layer 47, a conductor layer 48, a second initial opening 45A, and a doped region 46 may be formed in the stack structure. In some embodiments, gate-to-gate dielectric layer 47 includes a pair of composite layers 47-1 and 47-2, and an airgap 473 between composite layers 47-1 and 47-2. The fabrication process to form these structures may be referred to the fabrication process to form gate-to-gate dielectric layer 37, conductor layer 38, second initial slit opening 35A, and doped region 36 illustrated in FIGS. 3A and 3C, and is not repeated herein.

FIG. 4C illustrates a gate-to-gate dielectric layer 47 without an airgap. As shown in FIG. 4C, gate-to-gate dielectric layer 47, a conductor layer 48, a second initial opening 45B, and a doped region 46 may be formed in the stack structure. In some embodiments, gate-to-gate dielectric layer 47 includes a composite layer filling up the space between adjacent conductor layers 48. In some embodiments, gate-to-gate dielectric layer 47 covers the exposed portions of blocking layer 431, memory layer 432, and tunneling layer 433. The fabrication process to form these structures may be referred to the fabrication process to form gate-to-gate dielectric layer 37, conductor layer 38, second initial slit opening 35B, and doped region 36 illustrated in FIGS. 3B and 3D, and is not repeated herein.

Figure 4D:
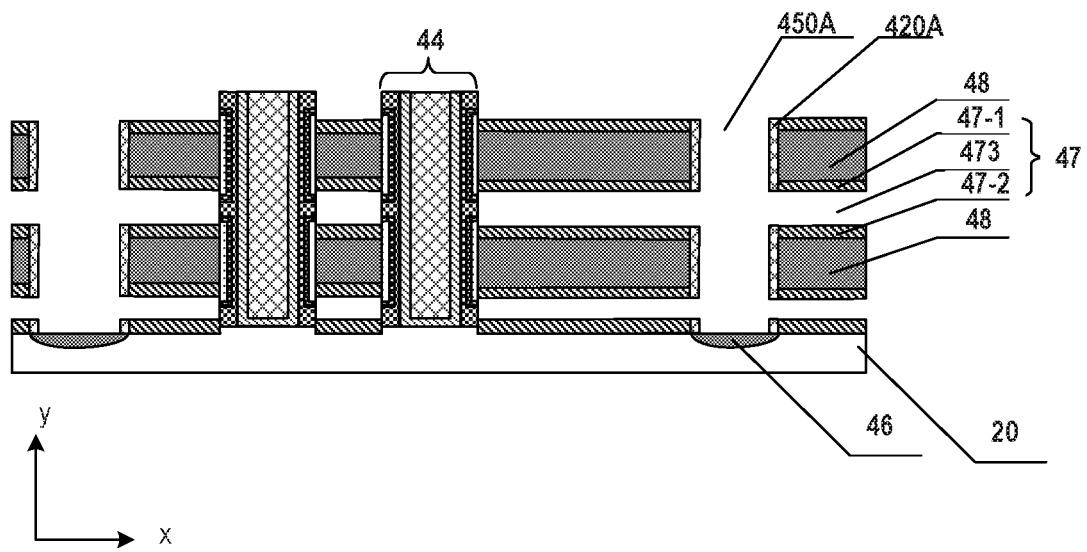
Figure 4E:
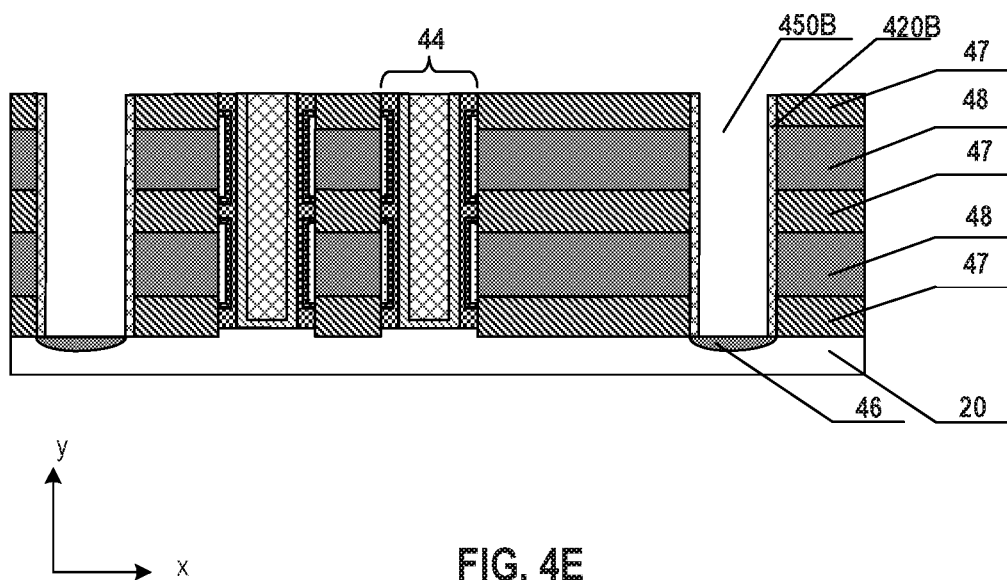

Referring back to FIG. 9C, after the formation of the doped region and gate-to-gate dielectric layer, a slit opening is formed from the second initial slit opening (Operation 950) and an insulating structure is formed in the slit opening (Operation 952). FIGS. 4D and 4E respectively illustrate a corresponding structure.

As shown in FIGS. 4D and 4E, a slit opening (e.g., 450A in FIG. 4D and 450B in FIG. 4E) and an insulating structure (e.g., 420A in FIG. 4D and 420B in FIG. 4E) can be formed. The fabrication process to form slit opening 450A and insulating structure 420A may be referred to the fabrication process to form slit opening 350A and insulating structure 320A in FIGS. 3E and 3G, and the fabrication process to form slit opening 450B and insulating structure 420B may be referred to the fabrication process to form slit opening 350B and insulating structure 320B in FIGS. 3F and 3H. Details are not repeated herein.

Figure 4F:
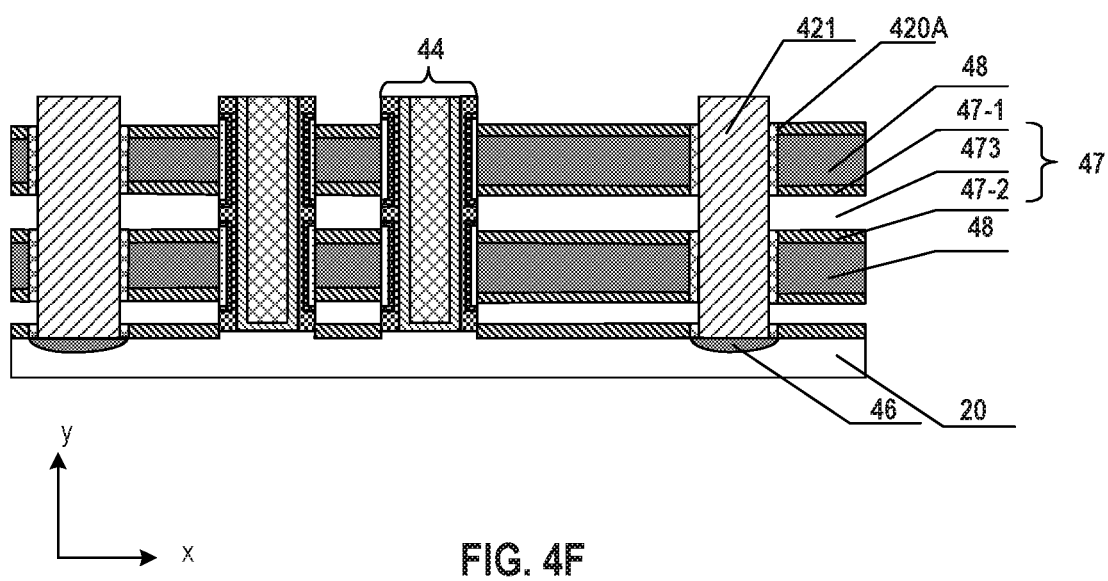
Figure 4G:
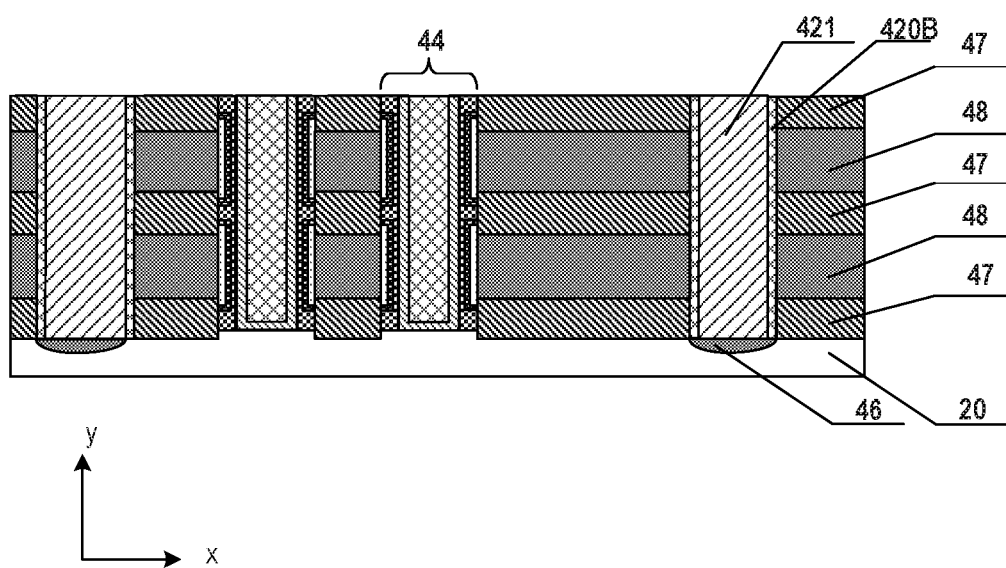

Referring back to FIG. 9C, after the formation of the slit opening and the insulating structure, a source contact is formed in the insulating structure (Operation 954). FIGS. 4F and 4G respectively illustrate a corresponding structure.

As shown in FIGS. 4F and 4G, a source contact 421 is formed in respective insulating structure (e.g., 420A in FIG. 4F and 420B in FIG. 4G), contacting the respective doped region 46. The fabrication process to form source contact 421 can be referred to the fabrication process to form source contact 321 illustrated in FIGS. 3I and 3J. Details are not repeated herein.

Figure 10:
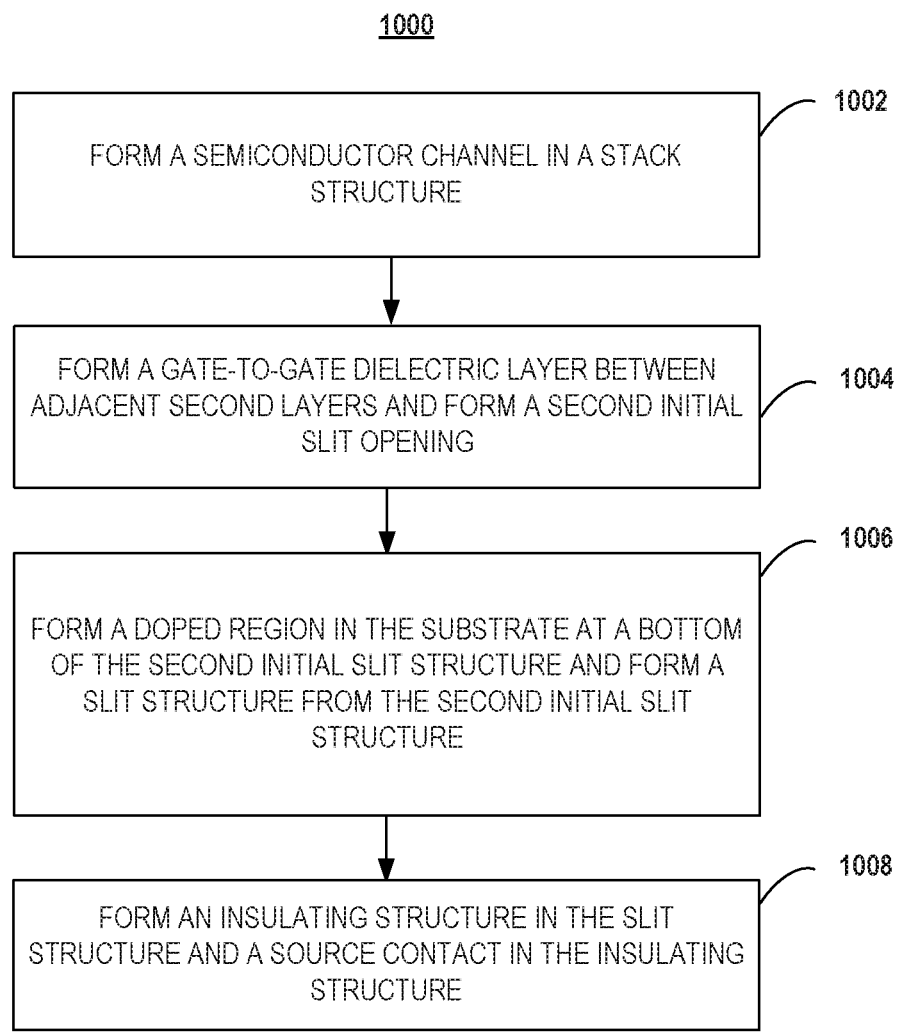
FIG. 10 illustrates a flow chart of an exemplary method for forming another 3D memory device, according to some embodiments of the present disclosure.

FIGS. 5A-5D, 5E, and 5I illustrate a "gate first" method to form memory device 105, which has an airgap in a gate-to-gate dielectric layer, according to some embodiments. FIGS. 5A-5D, 5F, and 5J illustrate a "gate first" method to form a memory device without an airgap in a gate-to-gate dielectric layer, according to some embodiments. FIG. 10 illustrates a flowchart 1000 for fabrication processes depicted in FIGS. 5A-5J.

Figure 5A:
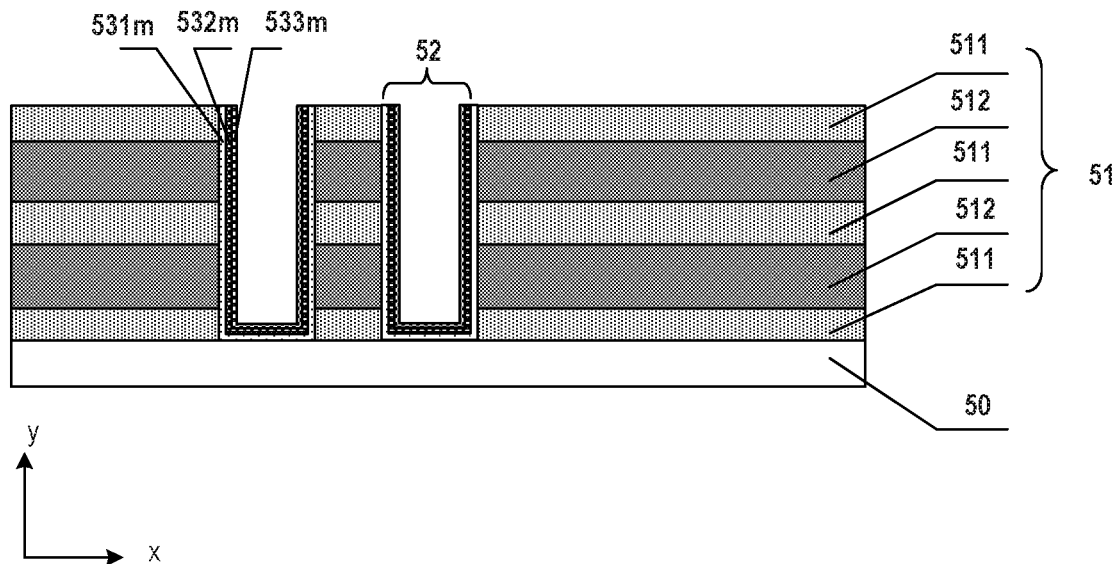
FIGS. 5A-5J illustrate structures of a 3D memory device at various stages of another exemplary fabrication process, according to some embodiments of the present disclosure.
Figure 5B:
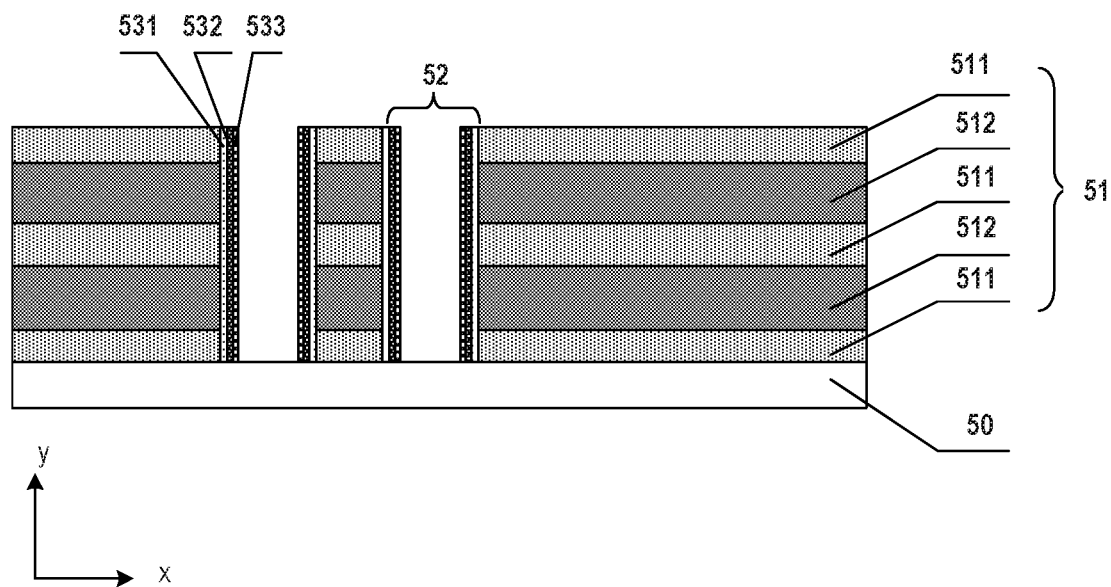
Figure 5C:
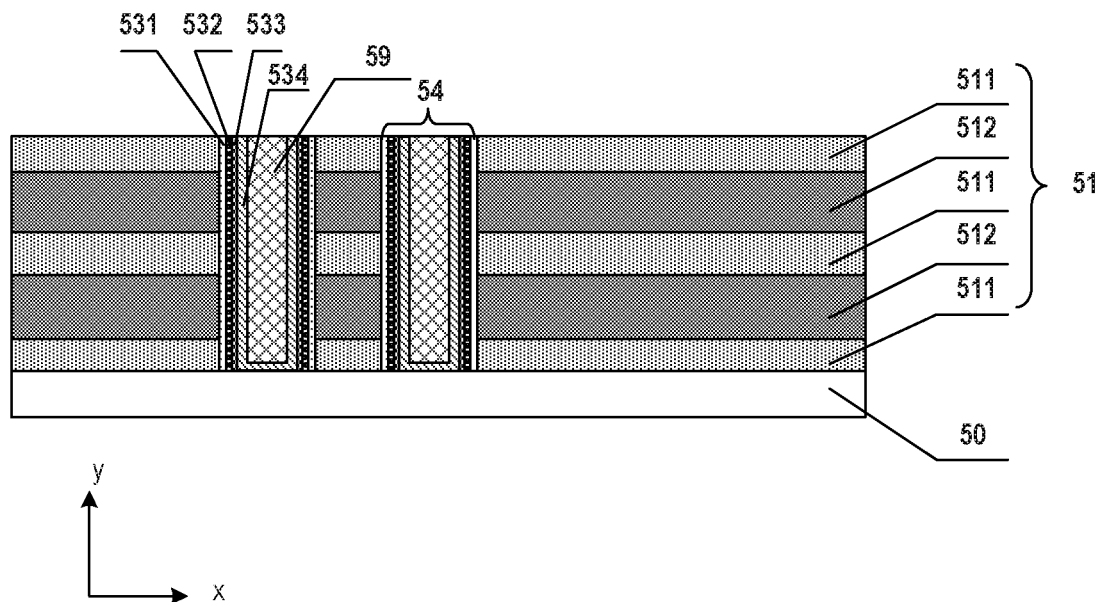

At the beginning of the fabrication process, a semiconductor channel is formed in a stack structure (Operation 1002). FIGS. 5A-5C illustrate corresponding structures.

As shown in FIGS. 5A-5C, a semiconductor channel 54 can be formed in a stack structure 51 over a substrate 50. As shown in FIG. 5A, stack structure 51 may include a plurality of alternatingly arranged first layers 511 and second layers 512 forming a plurality of staircases, where each first layer 511/second layer 512 form a staircase/level. First layers 511 may include a sacrificial material, and second layers 512 may include a conductor material for forming conductor layers that subsequently function as the gate electrodes of the memory device. Detailed description of the material of substrate 50, and the material and fabrication process to form stack structure 51 can be referred to the description of substrate 20 and stack structure 21 in FIG. 2A, and is not repeated herein. In some embodiments, substrate 50 includes silicon, first layer 511 includes silicon nitride and/or silicon oxide, and second layers 512 include polysilicon.

As shown in FIG. 5A, a channel hole 52 may be formed extending vertically through stack structure 51. The fabrication process to form channel hole 52 may be similar to or the same as the fabrication process to form initial channel hole 22 (e.g., illustrated in FIG. 2B). Different from the formation of channel hole 222 illustrated in FIG. 2C, no offset is formed between side surfaces of first layer 511 and second layer 512 in channel hole 52. That is, the side surfaces of first layer 511 and second layer 512 may be coplanar along the vertical direction. A blocking material layer 531m, a memory material layer 532m, and a tunneling material layer 533m may be sequentially deposited over the sidewall of channel hole 52. The materials and deposition processes to form these material layers can be referred to the description of materials and deposition processes of the blocking material layer, the memory material layer, and the tunneling material illustrated in FIG. 2D, and are not repeated herein.

As shown in FIG. 5B, portions of blocking material layer 531m, memory material layer 532m, and tunneling material layer 533m may be removed to expose substrate 50. An etching process, similar to the etching process illustrated in FIG. 2D, may be performed, and blocking layer 531, memory layer 532, and tunneling layer 533, may be formed.

As shown in FIG. 5C, a semiconductor layer 534 and a dielectric core 59 may be sequentially be deposited to fill up channel hole 52 and form semiconductor channel 54. The materials and deposition processes to form semiconductor layer 534 and dielectric core may be referred to the description of materials and deposition processes to form semiconductor layer 234 and dielectric core 29 illustrated in FIGS. 2E and 2F, and are not repeated herein.

Figure 5D:
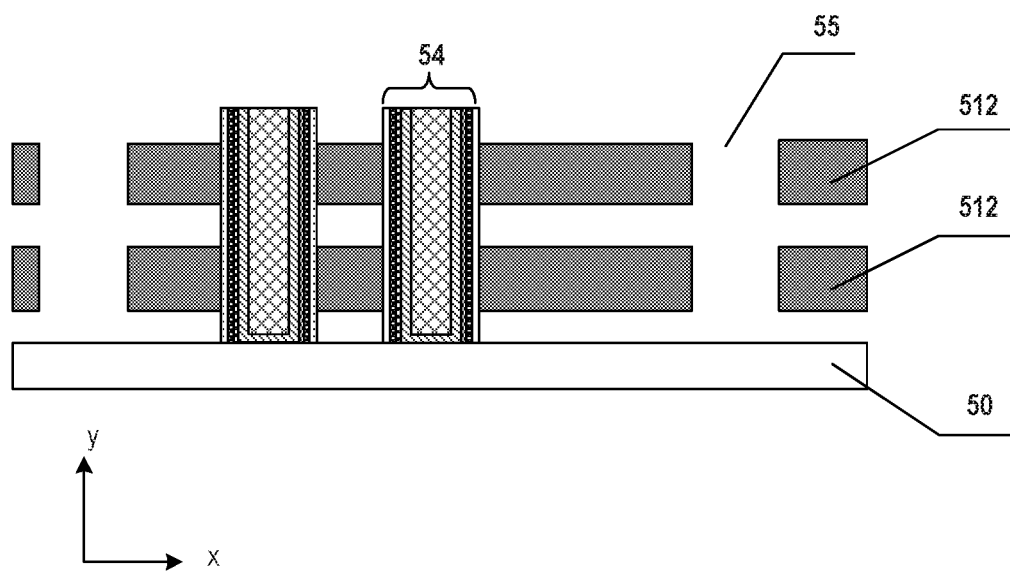
Figure 5E:
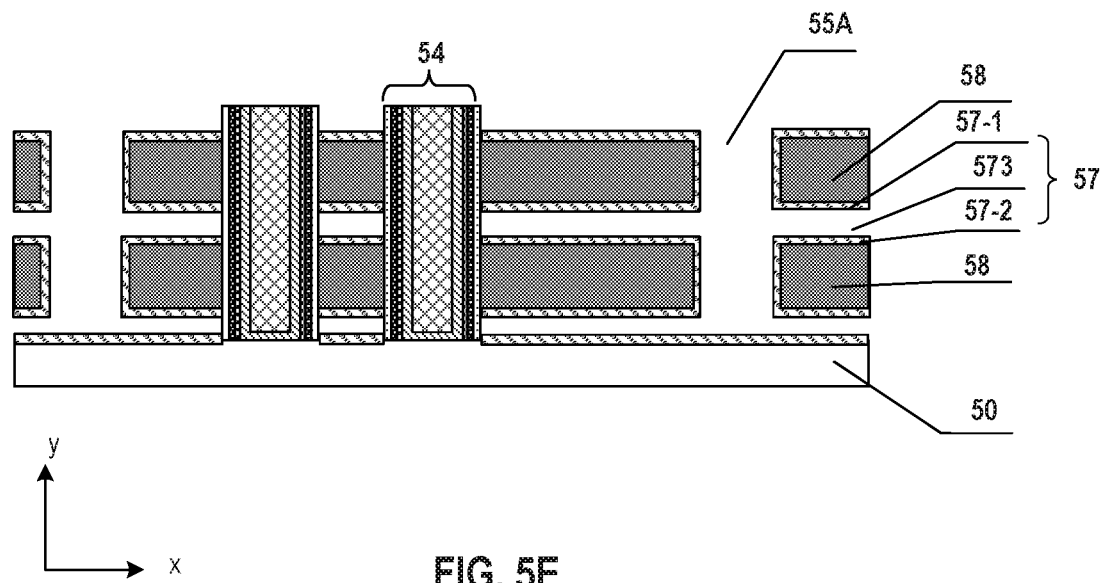
Figure 5F:
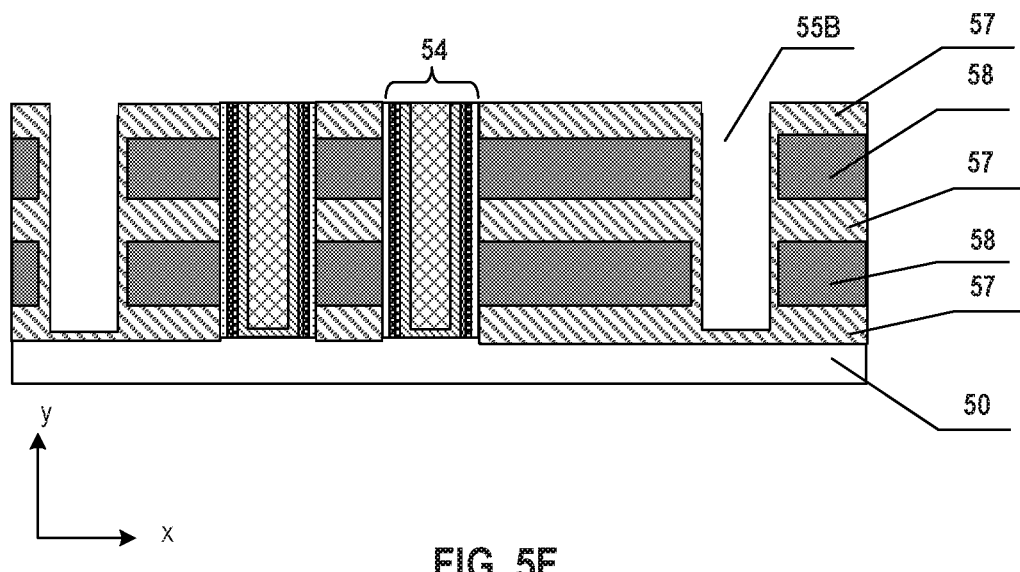

Referring back to FIG. 10, after the formation of the semiconductor channel, a gate-to-gate dielectric layer is formed between adjacent conductor layers, and a second initial slit opening is formed (Operation 1004). FIGS. 5D and 5E illustrate corresponding structures having a gate-to-gate dielectric layer with an airgap. FIGS. 5D and 5F illustrate corresponding structures having a gate-to-gate dielectric layer without an airgap.

As shown in FIG. 5D, a first initial slit opening 55 can be formed extending vertically through the stack structure, and first layers 511 may be removed through first initial slit openings 55 to form a plurality of lateral recesses. The formation of first initial slit openings 55 can be referred to the formation of first initial slit opening 25 illustrated n FIG. 2G, and the formation of lateral recesses and can be referred to the formation of lateral recesses illustrated in FIG. 3A. In some embodiments, portions of block layer 531 are exposed in the lateral recesses. Details are not repeated herein.

FIG. 5E illustrates a structure formed from the structure illustrated in FIG. 5D. In some embodiments, as shown in FIG. 5E, a gate-to-gate dielectric layer 57 and a second initial slit opening 55A can be formed. Gate-to-gate dielectric layer 57 may be located between adjacent conductor layers 58. Gate-to-gate dielectric layer 57 may include a pair of composite layers 57-1 and 57-2, and an airgap 573 between composite layers 57-1 and 57-2. The materials, structures, and fabrication process to form gate-to-gate dielectric layer 57 and second initial slit opening 55A may be referred to the description of materials, structures, and fabrication process to form gate-to-gate dielectric layer 37 and second initial slit opening 35A illustrated in FIG. 3A and are not repeated herein.

FIG. 5F illustrates another structure formed from the structure illustrated in FIG. 5D. In some embodiments, as shown in FIG. 5E, a gate-to-gate dielectric layer 57 and a second initial slit opening 55B can be formed. Gate-to-gate dielectric layer 57 may be located between adjacent conductor layers 58 and have no airgap between adjacent conductor layers 58. Gate-to-gate dielectric layer 57 may include a composite layer between adjacent conductor layers 58. The materials, structures, and fabrication process to form gate-to-gate dielectric layer 57 and second initial slit opening 55B may be referred to the description of materials, structures, and fabrication process to form gate-to-gate dielectric layer 37 and second initial slit opening 35B illustrated in FIG. 3B and are not repeated herein.

Figure 5G:
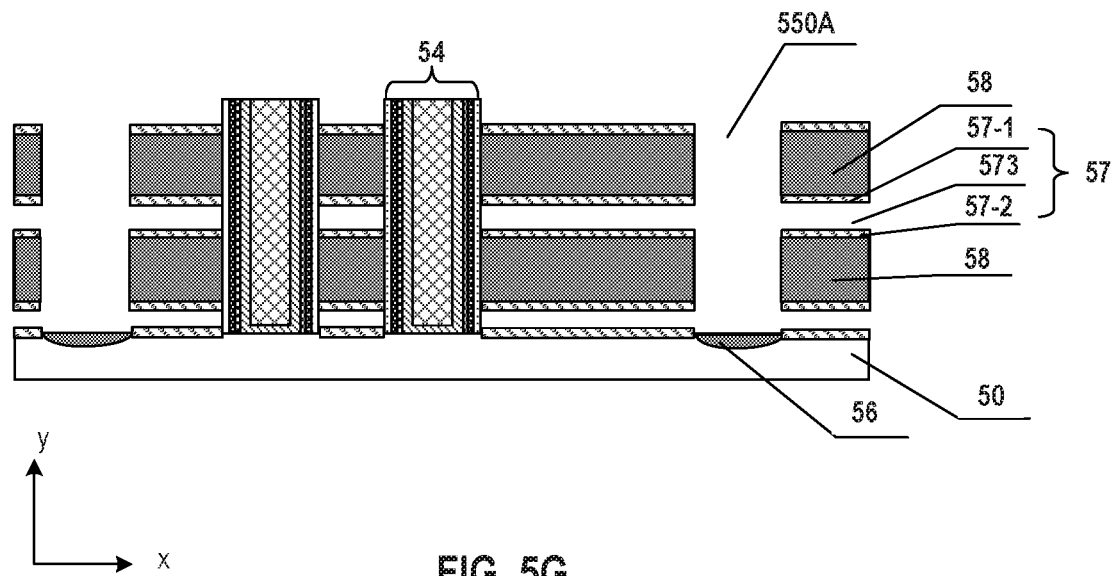
Figure 5H:
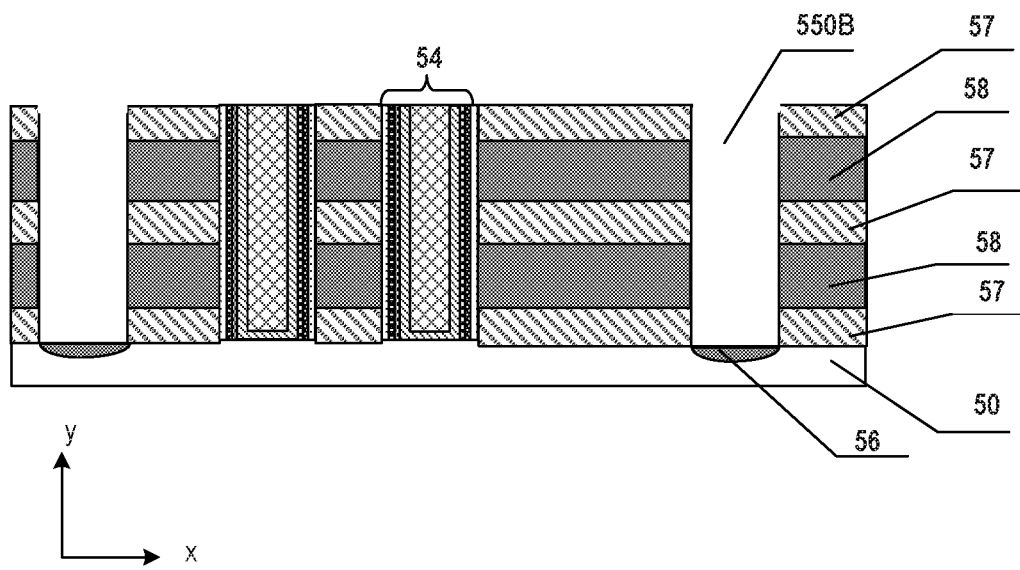

Referring back to FIG. 10, after the formation of gate-to-gate dielectric layers and second initial slit openings, a doped region is formed at the bottom of the second slit structure and a slit structure is formed from the second initial slit structure (Operation 1006). FIGS. 5G and 5H each illustrates a respective structure.

As shown in FIGS. 5G and 5H, a doped region 56 is formed in respective substrate 50, and a slit structure (e.g., 550A in FIG. 5G and 550B in FIG. 5H) is formed extending through the stack structure and exposing substrate 50 (e.g., the respective doped region 56). The specific fabrication processes to form doped region 56 and slit opening 550A/550B should be referred to the description of fabrication processes to form doped region 36 and slit opening 350A/350B, and are not repeated herein.

Figure 5I:
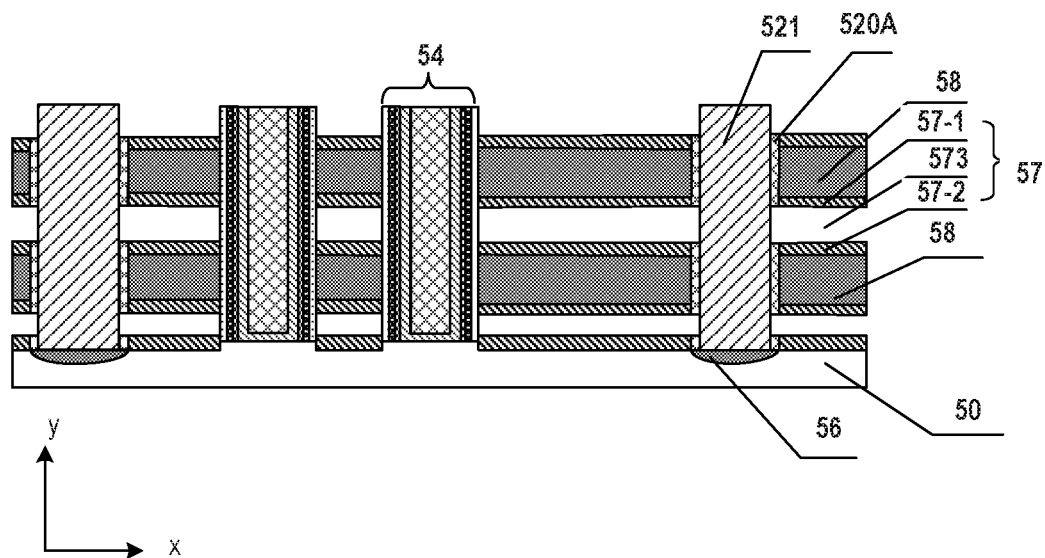
Figure 5J:
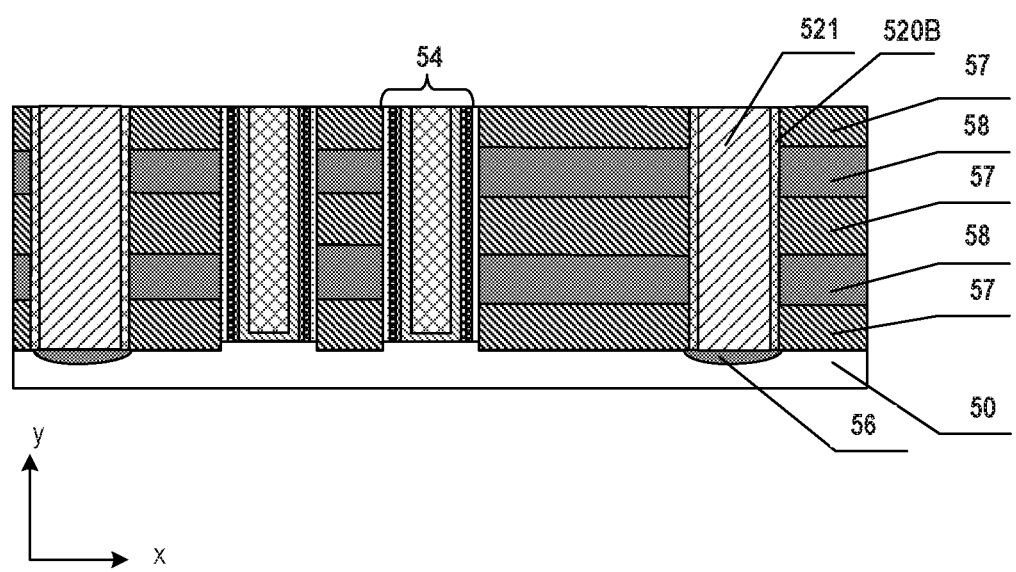

Referring back to FIG. 10, after the formation of the doped region and slit structure, an insulating structure is formed in the slit structure and a source contact is formed in the insulating structure (Operation 1008). FIGS. 5I and 5J each illustrates a respective structure.

As shown in FIGS. 5I and 5J, an insulating structure (e.g., 520A in FIG. 5I and 520B in FIG. 5J) and a source contact 521 are formed in respective insulating structure 520A/520B. In some embodiments, source contact 521 contacts respective doped region 36. Description of materials and fabrication processes to form insulating structures 520A/520B and source contact 521 should be referred to the description of materials and fabrication processes to form insulating structures 320A/320B and source contact 521 illustrated in FIGS. 3I and 3J, and are not repeated herein.

Figure 9D:
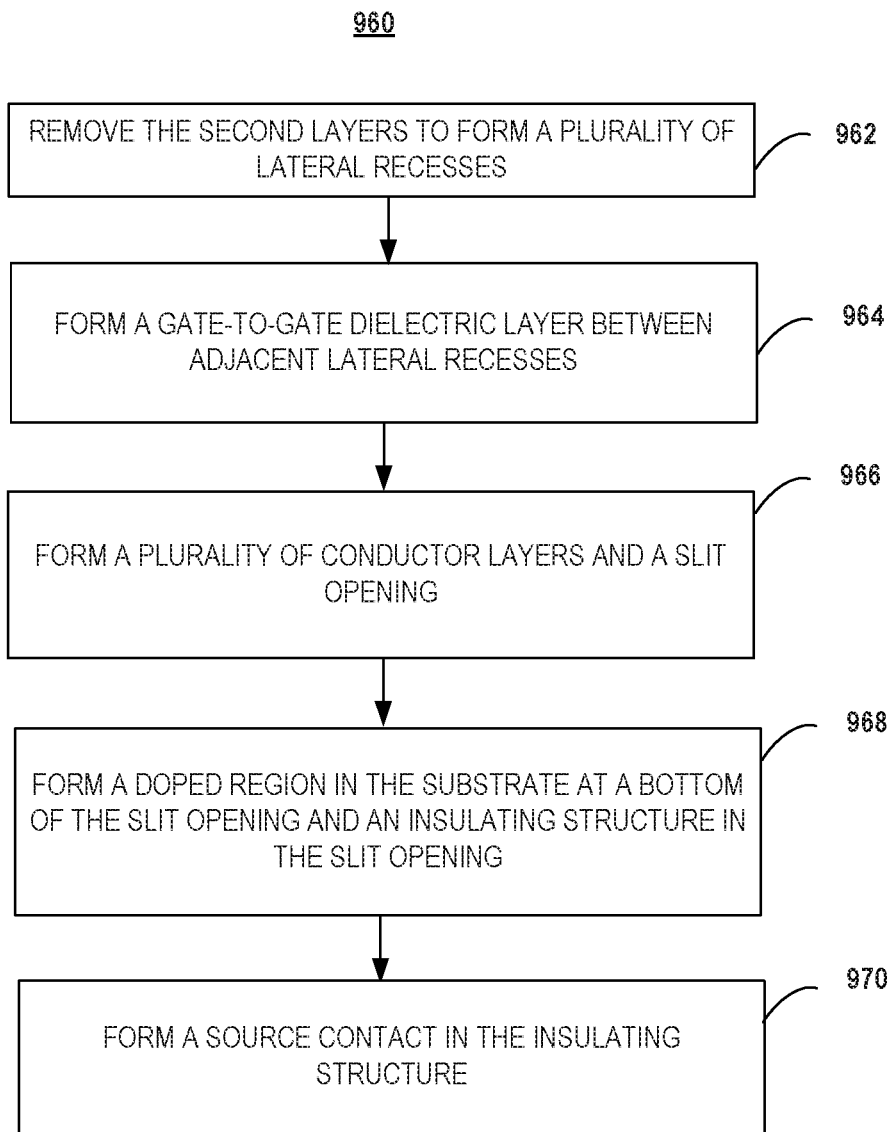

FIGS. 6A-6I illustrate a "gate last" method to form memory devices with a gate-to-gate dielectric layer between adjacent conductor layers from structure 200, according to some embodiments. Specifically, FIGS. 6A, 6B, 6D, 6F, and 6H illustrate the fabrication process to form a gate-to-gate dielectric layer from an entirety of each of the plurality of first layers, and FIGS. 6A, 6C, 6E, 6G, and 6I illustrate the fabrication process to form a gate-to-gate dielectric layer from a portion of each of the plurality of first layers. In some embodiments, FIGS. 6A, 6B, 6D, 6F, and 6H illustrate the fabrication process to form memory device 104, and FIGS. 6A, 6C, 6E, 6G, and 6I illustrate the fabrication process to form memory device 106. In this "gate last" method, first layers 211 include a dielectric material for forming the gate-to-gate dielectric layers and second layers 212 include a sacrificial material for forming the conductor layers that function as gate electrodes. The dielectric material may include silicon oxide and/or silicon nitride. In some embodiments, first layers 211 include silicon nitride. In some embodiments, second layers 212 include a different material than the material of first layers 211. In some embodiments, second layers 212 include polysilicon, carbon, and/or organic films. FIG. 9D illustrates a flowchart 960 for fabrication processes depicted in FIGS. 6A-6I.

Figure 6A:
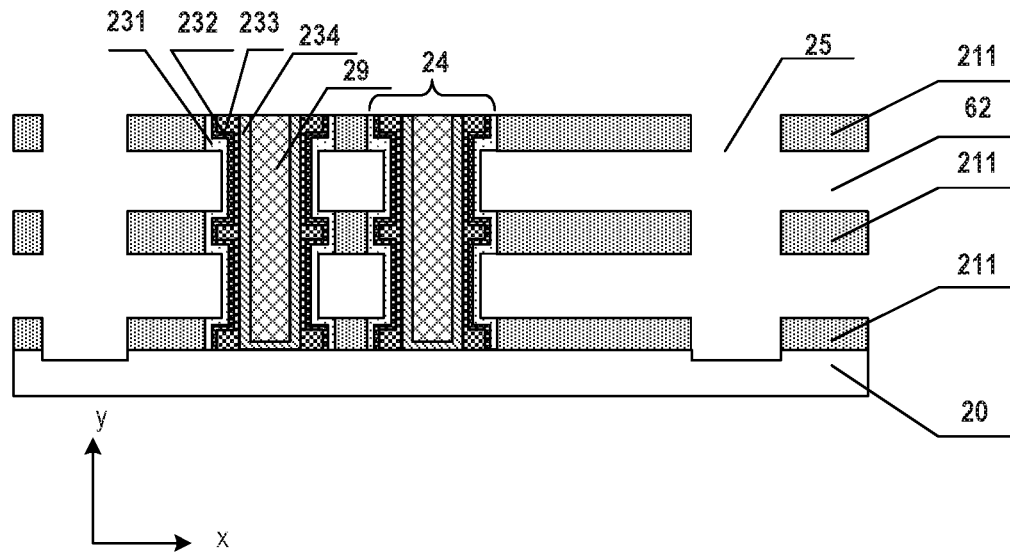
FIGS. 6A-6I illustrate structures of a 3D memory device at various stages of another exemplary fabrication process, according to some embodiments of the present disclosure.

As shown in FIG. 6A, at the beginning of the fabrication process, the plurality of second layers are removed (Operation 962). FIG. 6A illustrates a corresponding structure.

In some embodiments, an isotropic etching process (e.g., wet etch) is performed to remove second layers 212 and expose blocking layer 231 and substrate 20. A plurality of lateral recesses 62 can be formed from the removal of second layers 212 through first initial slit opening 25. Portions of blocking layer 231 can be exposed by lateral recesses 62.

Figure 6B:
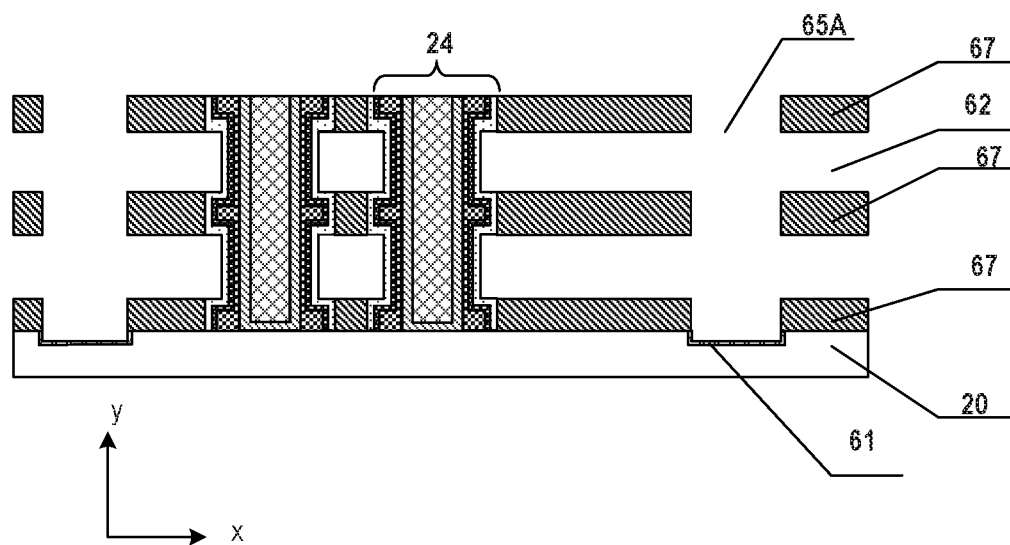
Figure 6C:
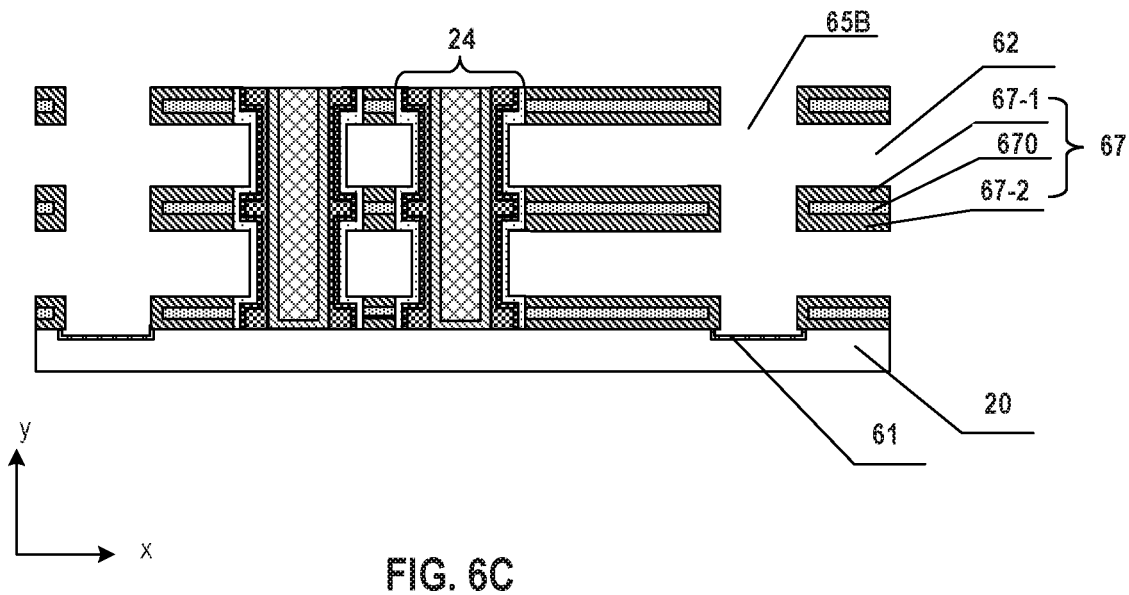

Referring back to FIG. 9D, after the removal of second layers and formation of lateral recesses, a gate-to-gate dielectric layer is formed between adjacent lateral recesses and a second initial slit opening is formed (Operation 964). FIGS. 6B and 6C each illustrates a corresponding structure.

In some embodiments, gate-to-gate dielectric layers 67 of FIGS. 6A and 6B are formed by oxidizing first layers 211 through first initial slit opening 25 and lateral recesses 62. In some embodiments, to form a plurality of gate-to-gate dielectric layers 67, oxygen diffusion concentration is controlled, such that each gate-to-gate dielectric layer 37 includes a desired number of sub-layers of silicon oxynitride and/or silicon oxide. The specific structure of each composite layer should not be limited by the embodiments of the present disclosure. A second initial slit opening (e.g., 65A in FIG. 6B and 65B in FIG. 6C) may be formed from the respective first initial slit opening (e.g., 25 in FIG. 6A) by the oxidation process on first layers 211. In some embodiments, an oxidized layer 61 may be formed over substrate 20 at the bottom of second initial slit structure 65A/65B from the oxidation reaction between oxygen and substrate 20.

FIG. 6B illustrates the structure in which each gate-to-gate dielectric layer is formed by fully oxidizing each first layer 211. As shown in FIG. 6B, an oxidation reaction may be performed to form a gate-to-gate dielectric layer 67 from the oxidation of the entire portion of each first layer 211. Each gate-to-gate dielectric layer 67 may include a composite layer that includes at least a sub-layer of silicon oxynitride, formed from the entire portion of a respective first layer 211, between adjacent conductor layers that are subsequently formed. In some embodiments, each composite layer includes at least a sub-layer of silicon oxynitride and at least a sub-layer of silicon oxide. In some embodiments, each composite layer includes a plurality of alternating arranged sub-layers of silicon oxynitride and silicon oxide, such as the structure illustrated in FIG. 8B.

FIG. 6C illustrates the structure in which a gate-to-gate dielectric layer 67 is formed by partially oxidizing each first layer 211. Gate-to-gate dielectric layer 67 may include a pair of composite layers (e.g., 67-1 and 67-2) that are formed from the oxidation of the outside portion, instead of the entire portion, of each first layer 211. As shown in FIG. 6C, an oxidation reaction may be performed to form a gate-to-gate dielectric layer 67 from the outside portion of each first layer 211. Each gate-to-gate dielectric layer 67 may include a pair of composite layers (e.g., 67-1 and 67-2) formed between adjacent conductor layers that are formed subsequently. Each composite layer may be formed from an outside portion of first layer 211. In some embodiments, composite layer 67-1 is formed from a top portion of first layer 211 (e.g., a portion extending from the upper surface of first layer 211 into the inside of first layer 211) and composite layer 67-2 is formed from a bottom portion of the same first layer 211 (e.g., a portion extending from the lower surface of first layer 211 into the inside of first layer 211). The unreacted portion of first layer 211 may be sandwiched or surrounded by composite layers 67-1 and 67-2, and may be referred to as an unreacted dielectric layer 670 (e.g., consisting of silicon nitride). In some embodiments, gate-to-gate dielectric layer 67 includes a pair of composite layers 67-1 and 67-2 and unreacted dielectric layer 670 between composite layers 67-1 and 67-2. The thicknesses of composite layers 67-1 and 67-2, and unreacted dielectric layer 670 may each be determined by the oxidation process, where the thickness of unreacted dielectric layer 670 is greater than zero. In some embodiments, each composite layer 67-1/67-2 includes at least a sub-layer of silicon oxynitride. In some embodiments, each composite layer 67-1/67-2 includes at least a sub-layer of silicon oxynitride and at least a sub-layer of silicon oxide. In some embodiments, each composite layer includes a plurality of alternating arranged sub-layers of silicon oxynitride and silicon oxide, such as the structure illustrated in FIG. 8B. In some embodiments, gate-to-gate dielectric layer 67 includes a pair of composite layers 67-1 and 67-2, and the unreacted dielectric layer 670 between composite layers 67-1 and 67-2. That is, gate-to-gate dielectric layer 67 includes a sub-layer of silicon nitride sandwiched by two alternatingly arranged stacks of sub-layers of silicon oxynitride and silicon oxide.

Figure 6D:
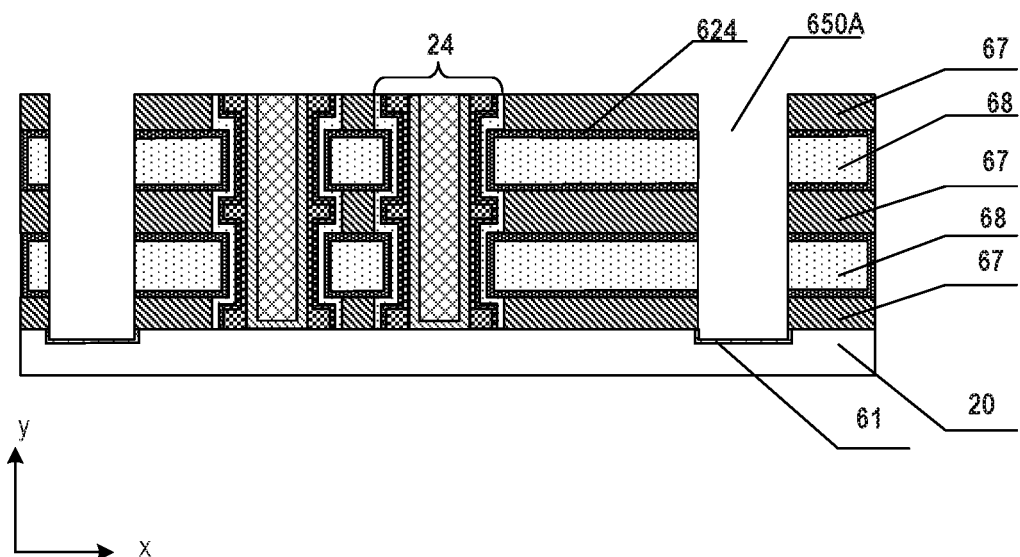
Figure 6E:
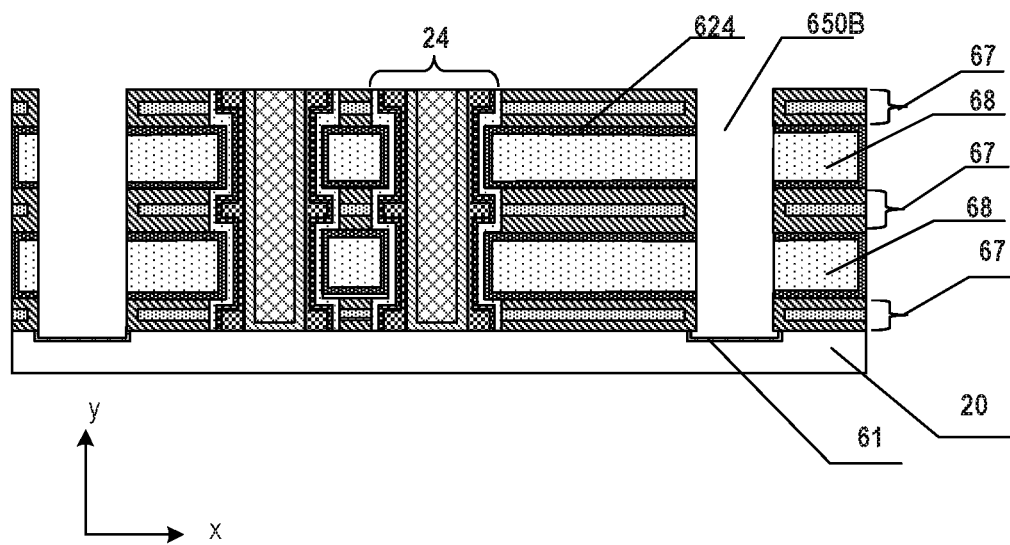

Referring back to FIG. 9D, after the formation of gate-to-gate dielectric layers, a plurality of conductor layers and a slit opening are formed (Operation 966). FIGS. 6D and 6E each illustrates a corresponding structure.

As shown in FIGS. 6D and 6E, a plurality of conductor layers 68 and a respective slit opening (e.g., 650A in FIG. 6D and 650B in FIG. 6E) is formed from the respective second initial slit opening 65A/65B. In some embodiments, a conductor material layer can be deposited into each lateral recesses 62 to fill up the space in lateral recess 62 through respective second initial slit opening 65A/65B, and a recess etch (e.g., dry and/or wet etch) can be performed to remove any excess conductor material layer and portions of composite layer 67-1/67-2 on the sidewall of second initial slit opening 65A/65B, forming respective conductor layers 68 and respective slit opening 650A/650B. In some embodiments, conductor layers 68 includes tungsten, copper, aluminum, cobalt, silicides, doped and/or polysilicon. In some embodiments, an adhesive layer 624 is deposited in lateral recesses 62 through respective second initial slit openings before the deposition of conductor material layer, e.g., to improve the adhesion between the conductor material layer and gate-to-gate dielectric layer 67. In some embodiments, adhesion layer 624 includes titanium (Ti) and/or titanium nitride (TiN). In some embodiments, the conductor material layers and adhesive layers 624 are each deposited by a suitable method such as one or more of CVD, ALD, LPCVD, and/or PVD.

Figure 6F:
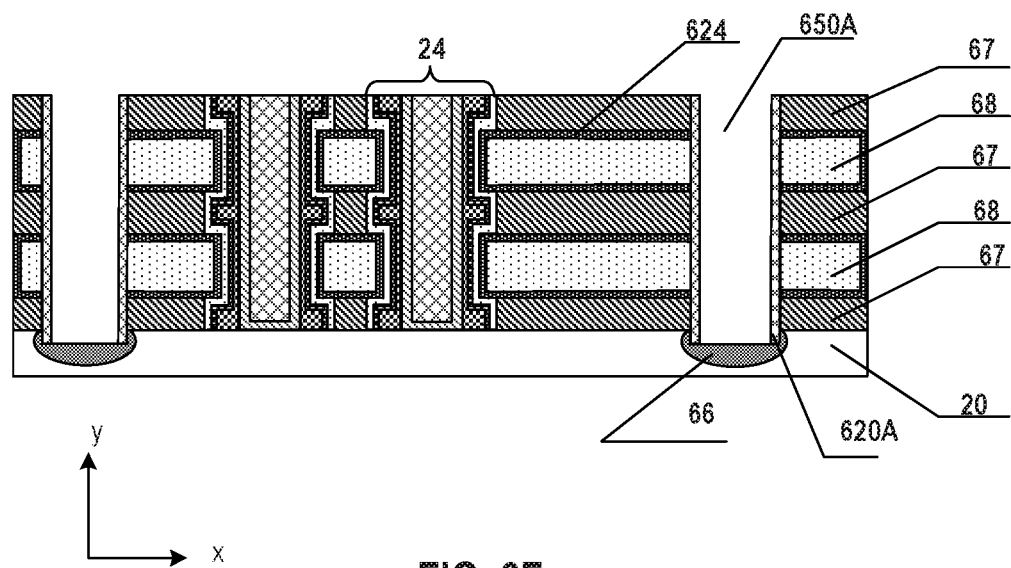
Figure 6G:
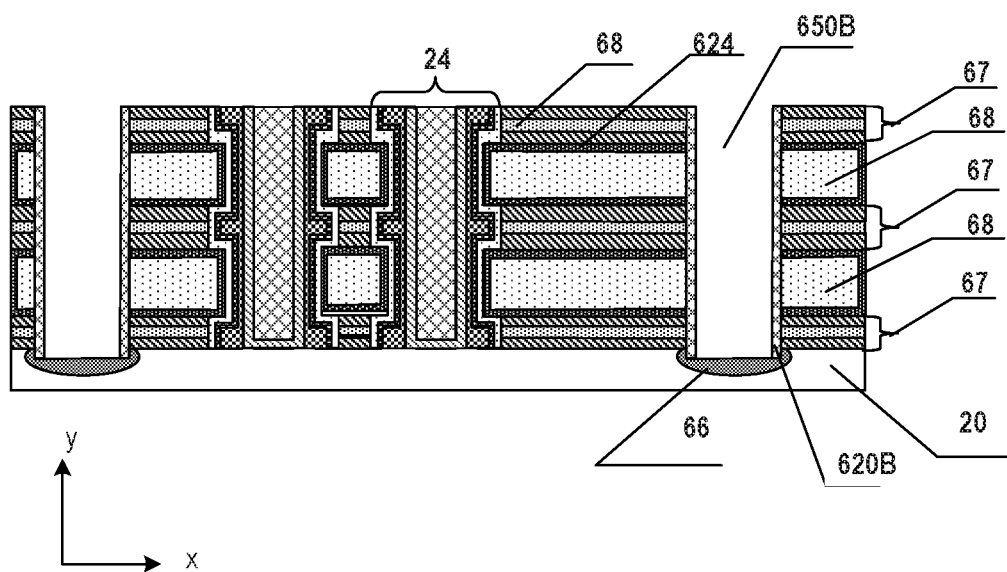

Referring back to FIG. 9D, after the formation of conductor layers, a doped region is formed in the substrate at a bottom of the slit opening and an insulating structure is formed in the slit opening (Operation 968). FIGS. 6F and 6G each illustrates a corresponding structure.

As shown in FIGS. 6F and 6G, a respective doped region 66 can be formed in substrate 20. Doped region 16 may include a suitable doped (e.g., P-type or N-type) semiconductor region formed in substrate 10 and is opposite from the polarity of substrate 20. A suitable doping process, such as ion implantation, can be performed to form doped region 66. In some embodiments, doped region 66 includes doped silicon.

A respective insulating structure (e.g., 620A in FIG. 6F and 620B in FIG. 6G) can be formed to insulate respective conductor layers 68 from subsequently-formed source contacts. In some embodiments, insulating structure 620A/620B each covers the sidewall of the respective slit opening and exposes substrate 20 (e.g., respective doped region 66). In some embodiments, insulating structure 620A covers the side surfaces of composite layers of gate-to-gate dielectric layer 67, conductor layers 68, and adhesion layer 624. In some embodiments, insulating structure 620B covers the side surfaces of composite layers of gate-to-gate dielectric layer 67, unreacted dielectric layer 670 of gate-to-gate dielectric layer 67, conductor layers 68, and adhesion layer 624. To form insulating structure 620A/620B, a suitable insulating material can be deposited to cover the sidewall of the respective slit opening 650A/650B, and a suitable recess etch (e.g., dry etch and/or wet etch) can be performed to remove excess portions of the insulating material on the sidewall and bottom of slit opening 650A/650B. Respective oxidized layer 61 can also be removed by the recess etching process. Insulating structure 620A/620B can be formed in slit opening 650A/650B. In some embodiments, insulating structure 120 includes silicon oxide and is deposited by any one of CVD, ALD, LPCVD, and/or PVD. In various embodiments, the order to form respective insulating structure 620A/620B and doped region 66 can vary based on different fabrication operations and should not be limited by the embodiments of the present disclosure.

Figure 6H:
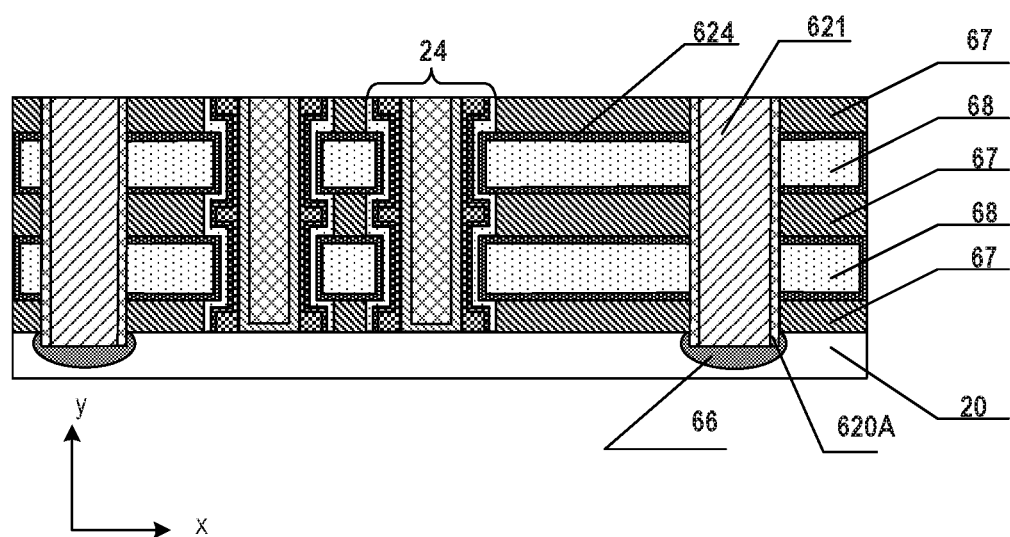
Figure 6I:
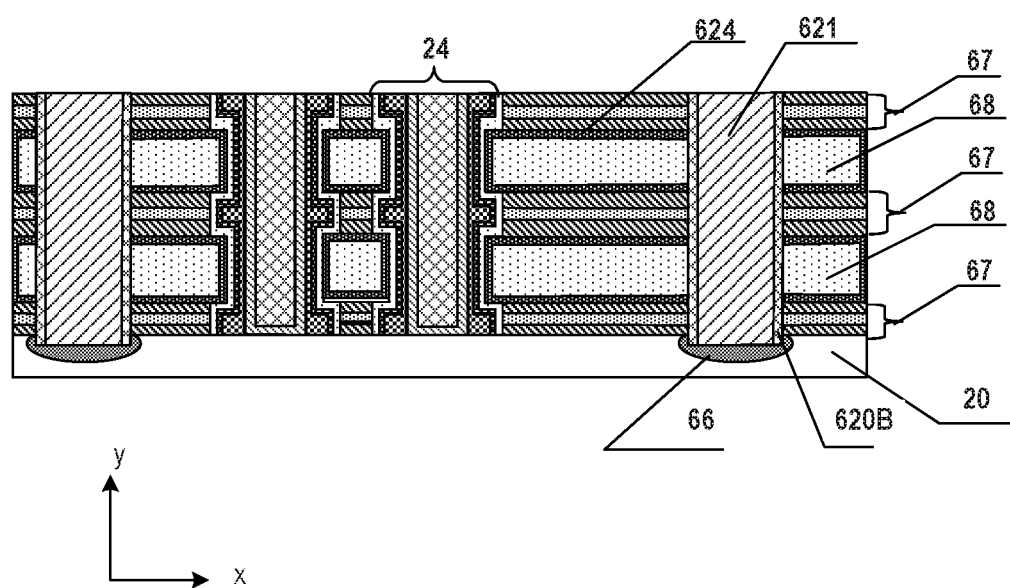

Referring back to FIG. 9D, after the formation of insulating structures and doped regions, a source contact is formed in the insulating structure (Operation 970). FIGS. 6H and 6I each illustrates a corresponding structure.

As shown in FIGS. 6H and 6I, a source contact 621 is formed in respective insulating structure 620A/620B. Source contact 621 may contact respective doped region 66 and form an electrical connection with semiconductor channels 24 through doped region 66 and substrate 20. Source contact 621 can include one or more of tungsten, cobalt, copper, aluminum, silicides, and/or doped polysilicon, and can be deposited by one or more of CVD, PVD, and/or ALD. A suitable CMP and/or recess etch can be performed to remove the excess materials of insulating structure 620A/620B and source contact 621.

In some embodiments, the "gate last" method is also employed to form a memory device that has a semiconductor channel with no lateral portions, e.g., extending along the vertical direction consistently. For example, to form the memory device, a semiconductor channel similar to or the same as semiconductor channel 54 (e.g., illustrated in FIG. 5C) can be formed in a stack structure. The stack structure, different from stack structure 51, can be have a plurality of alternatingly arranged first layers of a dielectric material layer and second layers of a sacrificial material layer, similar to or the same as the stack structure illustrated in FIGS. 6A-6I. In some embodiments, the first layers include silicon nitride and the second layers include a different material than the first layers, such as polysilicon, carbon, and/or organic films. The second layers can be removed to form a plurality of lateral recesses, similar to the fabrication operation illustrated in FIG. 6A. The first layer may then be oxidized using an oxidation reaction similar to the oxidation process illustrated in FIGS. 6B and 6C to form a plurality of gate-to-gate dielectric layers. The stack structure may further be processed, using the fabrication processes illustrated in FIGS. 6D-6I, to form other parts, e.g., source contacts, insulating structures, and conductor layers. A detailed description of the material and fabrication process to form the memory device can be referred to the description of FIGS. 5A-5J and FIGS. 6A-6I, and is thus not repeated herein.

In various embodiments, based on the material of the first layers and/or second layers, the gate-to-gate dielectric layer may include different materials than the materials introduced in the present disclosure. By using the methods of the present disclosure, the first layers and/or the second layers can undergo a suitable reaction (e.g., oxidizing and/or nitriding reaction) to form at least a sub-layer of a high-k dielectric material in the respective gate-to-gate dielectric layer. For example, x81 may include hafnium oxide ($HfO_x$) and x82 may include hafnium oxynitride ($HfO_xN_y$, e.g., HfON). In some embodiments, gate-to-gate dielectric layer 17 of memory devices 102 and 104 may be formed by depositing hafnium oxide to fill up the lateral recesses which are formed by the removal of first layers 211, and performing an oxidizing and/or nitriding process on the hafnium oxide between conductor layers 18 to form at least a sub-layer of hafnium oxynitride in gate-to-gate dielectric layer 17. In some embodiments, in a "gate first" method, second layers 212 includes hafnium and gate-to-gate dielectric layer 17 of memory devices 101, 103, 105, and 106 (e.g., each formed by a "gate first" method) includes at least a sub-layer of hafnium oxynitride. In some embodiments, in a "gate last" method, first layers 211 includes hafnium and gate-to-gate dielectric layer 17 of memory devices 104 and 106 (e.g., each formed by a "gate last" method) includes at least a sub-layer of hafnium oxynitride. The specific materials of the gate-to-gate dielectric layer should not be limited by the embodiments of the present disclosure.

In some embodiments, a method for forming a 3D memory device includes the following operations. First, an initial channel hole is formed in a stack structure of a plurality first layers and a plurality of second layers alternatingly arranged over a substrate. An offset is formed between a side surface of each one of the plurality of first layers and a side surface of each one of the plurality of second layers on a sidewall of the initial channel hole to form a channel hole. A semiconductor channel is formed by filling the channel hole with a channel-forming structure, the semiconductor channel having a memory layer including a plurality of first memory portions each surrounding a bottom of a respective second layer and a plurality of second memory portions each connecting adjacent first memory portions. Further, the plurality of first layers are removed and a plurality of conductor layers are formed from the plurality of second layers. A gate-to-gate dielectric layer is formed between the adjacent conductor layers. The gate-to-gate dielectric layer includes at least one sub-layer of silicon oxynitride and an airgap.

In some embodiments, removing the plurality of first layers includes forming a first initial slit opening extending through the stack structure and exposing the substrate and removing the plurality of first layers through the first initial slit to form a plurality of lateral recesses that expose portions of the semiconductor channel.

In some embodiments, filling the channel hole with a channel-forming structure includes forming a blocking layer over a sidewall of the channel hole, forming the memory layer over the blocking layer, forming a tunneling layer over the memory layer, forming a semiconductor layer over the tunneling layer, and forming a dielectric core over the semiconductor layer to fill up the channel hole.

In some embodiments, forming the plurality of conductor layers, the gate-to-gate dielectric layer, and a second initial slit opening include forming a composite layer from a portion of each of the plurality of second layers, a remaining portion of the respective second layer forming a respective conductor layer, a pair of composite layers on the adjacent conductor layers and facing each other forming the gate-to-gate dielectric layer, the first initial slit opening forming a second initial slit opening, the composite layer having at least one sub-layer of silicon oxynitride.

In some embodiments, the plurality of second layers include polysilicon and forming the composite layer includes performing, through the first initial slit opening and the plurality of lateral recesses, one or more of an oxidation reaction and a nitriding reaction on the plurality of second layers. A reacted portion of each of the plurality of second layers form the respective composite layer and an unreacted portion of each of the plurality of second layers form the respective conductor layer.

In some embodiments, a composite layer is formed from each of a top portion and a bottom portion of the respective second layer.

In some embodiments, forming the gate-to-gate dielectric layer further includes forming the airgap between the pair of composite layers.

In some embodiments, forming the composite layer includes controlling the oxygen diffusion concentration such that the composite layer includes the at least one sub-layer of silicon oxynitride.

In some embodiments, forming the composite layer further includes controlling the oxygen diffusion concentration such that the composite layer includes at least one sub-layer of silicon oxynitride and at least one sub-layer of silicon oxide.

In some embodiments, forming the composite layer further includes controlling the oxygen diffusion concentration such that the composite layer includes a plurality of alternatingly arranged sub-layers of silicon oxynitride and sub-layers of silicon oxide.

In some embodiments, forming the offset includes removing a portion of the side surface of each one of the plurality of first layers on the sidewall of the initial channel hole.

In some embodiments, removing the portion of the side surface of each one of the plurality of first layers includes performing a recess etching process that selectively etches the plurality of first layers over the plurality of second layers.

In some embodiments, the plurality of first layers and the plurality of second layers are formed by alternatingly depositing a plurality of first material layers and a plurality of second material layers over the substrate to form an initial stack structure over the substrate. The plurality of first material layers may have a different etching selectivity than the plurality of second material layers. In some embodiments, the plurality of first layers and the plurality of second layers are also formed by repetitively etching the plurality of first material layers and the plurality of second material layers to form the stack structure having the plurality of first layers and the plurality of second layers arranged in a staircase structure.

In some embodiments, depositing the plurality of first material layers includes depositing at least one of a silicon nitride material layer, a silicon oxide material layer, or a silicon oxynitride material layer.

In some embodiments, the method further includes forming a doped region in the substrate at a bottom of the second initial slit opening, forming a slit opening from the second initial slit opening by removing portions of the composite layer to expose the plurality of conductor layers on a sidewall of the slit opening and to expose the substrate at a bottom of the slit opening, and forming an insulating structure in the slit opening. The insulating structure may be over the exposed portions of the plurality of conductor layers and exposing the substrate at the bottom of the slit opening. The method may also include forming a source contact in the insulating structure and in contact with the doped region.

In some embodiments, forming an insulating structure in the slit opening includes depositing a layer of silicon oxide layer covering the exposed portions of the plurality of conductor layers and the gate-to-gate dielectric layer between adjacent conductor layers, and forming the source contact includes depositing at least one of tungsten, cobalt, copper, aluminum, polysilicon, doped silicon, or silicides in the insulating structure.

In some embodiments, a method for forming a 3D memory device includes forming an initial channel hole in a stack structure of a plurality first layers and a plurality of second layers alternatingly arranged over a substrate, forming an offset between a side surface of each one of the plurality of first layers and a side surface of each one of the plurality of second layers on a sidewall of the initial channel hole to form a channel hole, and forming a semiconductor channel by filling the channel hole with a channel-forming structure. The semiconductor channel may have a memory layer including a plurality of first memory portions each surrounding a bottom of a respective second layer and a plurality of second memory portions each connecting adjacent first memory portions. The method may also include removing the plurality of first layers, forming a plurality of conductor layers each from a middle portion of a respective second layer, forming a composite layer from a surface portion of the second layer, the composite layer including at least one sub-layer of silicon oxynitride, and forming an airgap between adjacent conductor layers.

In some embodiments, removing the plurality of first layers includes forming a first initial slit opening extending through the stack structure and exposing the substrate and removing the plurality of first layers through the first initial slit to form a plurality of lateral recesses that expose portions of the semiconductor channel.

In some embodiments, filling the channel hole with a channel-forming structure includes forming a blocking layer over a sidewall of the channel hole, forming the memory layer over the blocking layer, forming a tunneling layer over the memory layer, forming a semiconductor layer over the tunneling layer, and forming a dielectric core over the semiconductor layer to fill up the channel hole.

In some embodiments, forming the plurality of conductor layers, the composite layer, the airgap, and a second initial slit opening include forming the composite layer from each of a top portion and a bottom portion of each of the plurality of second layers, the middle portion between the top portion and the bottom portion forming a respective conductor layer, an unfilled portion of each of the plurality of lateral recesses between adjacent conductor layers forming the airgap, the first initial slit opening forming a second initial slit opening.

In some embodiments, the plurality of second layers include polysilicon and forming the composite layer includes performing, through the first initial slit opening and the plurality of lateral recesses, one or more of an oxidation reaction and a nitriding reaction on the plurality of second layers. A reacted top and bottom portions of each of the plurality of second layers may form the respective composite layers and an unreacted portion between the reacted top and bottom portions of each of the plurality of second layers may form the respective conductor layer.

In some embodiments, forming the composite layer includes controlling the oxygen diffusion concentration such that the composite layer includes the at least one sub-layer of silicon oxynitride.

In some embodiments, forming the composite layer further includes controlling the oxygen diffusion concentration such that the composite layer includes at least one sub-layer of silicon oxynitride and at least one sub-layer of silicon oxide.

In some embodiments, forming the composite layer further includes controlling the oxygen diffusion concentration such that the composite layer includes a plurality of alternatingly arranged sub-layers of silicon oxynitride and sub-layers of silicon oxide.

In some embodiments, forming the offset includes removing a portion of the side surface of each one of the plurality of first layers on the sidewall of the initial channel hole.

In some embodiments, removing the portion of the side surface of each one of the plurality of first layers includes performing a recess etching process that selectively etches the plurality of first layers over the plurality of second layers.

In some embodiments, the plurality of first layers and the plurality of second layers are formed by alternatingly depositing a plurality of first material layers and a plurality of second material layers over the substrate to form an initial stack structure over the substrate. The plurality of first material layers may have a different etching selectivity than the plurality of second material layers. In some embodiments, the plurality of first layers and the plurality of second layers are also formed by repetitively etching the plurality of first material layers and the plurality of second material layers to form the stack structure having the plurality of first layers and the plurality of second layers arranged in a staircase structure.

In some embodiments, depositing the plurality of first material layers includes depositing at least one of a silicon nitride material layer, a silicon oxide material layer, or a silicon oxynitride material layer.

In some embodiments, the method further includes forming a doped region in the substrate at a bottom of the second initial slit opening, forming a slit opening from the second initial slit opening by removing portions of the composite layer to expose the plurality of conductor layers on a sidewall of the slit opening and to expose the substrate at a bottom of the slit opening, and forming an insulating structure in the slit opening. The insulating structure may be over the exposed portions of the plurality of conductor layers and exposing the substrate at the bottom of the slit opening. In some embodiments, the method also includes forming a source contact in the insulating structure and in contact with the doped region.

In some embodiments, forming an insulating structure in the slit opening includes depositing a layer of silicon oxide layer covering the exposed portions of the plurality of conductor layers and the gate-to-gate dielectric layer between adjacent conductor layers, and forming the source contact includes depositing at least one of tungsten, cobalt, copper, aluminum, polysilicon, doped silicon, or silicides in the insulating structure.

In some embodiments, a 3D memory device includes a stack structure including a plurality of conductor layers insulated from one another by a gate-to-gate dielectric structure. The gate-to-gate dielectric structure may include at least a sub-layer of silicon oxynitride and an airgap between adjacent conductor layers along a direction perpendicular to a top surface of the substrate. The 3D memory device also includes a semiconductor channel extending from a top surface of the stack structure to the substrate. The semiconductor channel may include a memory layer having a plurality of first memory portions each surrounding a bottom of a respective conductor layer and a plurality of second memory portions each connecting adjacent first memory portions. The plurality of first memory portions and the plurality of second memory portions may be staggered along a vertical direction perpendicular to a top surface of the substrate, and a source structure may extend from the top surface of the stack structure to the substrate.

In some embodiments, the gate-to-gate dielectric structure includes a gate-to-gate dielectric layer between adjacent conductor layers, the gate-to-gate dielectric layer including a pair of composite layers on the adjacent conductor layers and the airgap between the pair of composite layers. The pair of composite layers may each have at least a sub-layer of silicon oxynitride.

In some embodiments, the pair of composite layers each includes at least a sub-layer of silicon oxide and a sub-layer of silicon oxynitride.

In some embodiments, the pair of composite layers each includes a plurality of alternatingly arranged sub-layers of silicon oxide and sub-layers of silicon oxynitride.

In some embodiments, the plurality of first memory portions each includes a vertical portion along the vertical direction and at least one lateral portion along a lateral direction parallel to the top surface of the substrate. The vertical portion and the at least one lateral portion may partially surround the respective conductor layer vertically and laterally.

In some embodiments, along a radial direction from a sidewall of the semiconductor channel to a center of the semiconductor channel, the semiconductor channel includes a blocking layer, the memory layer over the blocking layer, a tunneling layer over the plurality of memory portions, a semiconductor layer over the tunneling layer, and a dielectric core over the semiconductor layer.

In some embodiments, each composite layer is located between ends of the respective vertical portion of each of the plurality of first memory portions along the vertical direction.

In some embodiments, the blocking layer includes at least one of a first blocking layer and a second blocking layer. The first blocking layer may include one or more of aluminum oxide (AlO), hafnium oxide (HfO$_2$), lanthanum oxide (LaO$_2$), yttrium oxide (Y$_2$O$_3$), tantalum oxide (Ta$_2$O$_5$), silicates thereof, nitrogen-doped compounds thereof, or alloys thereof, the second blocking layer including one or more of silicon oxide, silicon oxynitride, and silicon nitride. In some embodiments, the memory layer includes a charge-trapping material that includes at least one of tungsten, molybdenum, tantalum, titanium, platinum, ruthenium, alloys thereof, nanoparticles thereof, silicides thereof, polysilicon, amorphous silicon, SiN, or SiON. In some embodiments, the tunneling layer includes at least one of SiO, SiN, SiON, dielectric metal oxides, dielectric metal oxynitride, dielectric metal silicates, or alloys thereof. In some embodiments, the semiconductor layer includes at least one of a one-element semiconductor material, a III-V compound semiconductor material, a II-VI compound semiconductor material, or an organic semiconductor material. In some embodiments, the dielectric core includes SiO.

In some embodiments, the plurality of conductor layers each including a layer of one or more of W, Co, Al, doped silicon, silicides, and a combination thereof. In some embodiments, the source structure each includes an insulating structure and a source contact in the insulating structure. The source contact may be conductively in contact with the substrate. The insulating structure may include silicon oxide, and the source contact including one or more of W, Co, Al, doped silicon, silicides, and a combination thereof The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    forming an initial channel hole in a stack structure of a plurality of first layers and a plurality of second layers alternatingly arranged over a substrate, the plurality of second layers comprising a conductive material;
    forming an offset between a side surface of each one of the plurality of first layers and a side surface of each one of the plurality of second layers on a sidewall of the initial channel hole to form a channel hole;
    forming a semiconductor channel by filling the channel hole with a channel-forming structure, the semiconductor channel having a memory layer comprising a plurality of first memory portions each surrounding a bottom of a respective second layer and a plurality of second memory portions each connecting adjacent first memory portions;
    removing the plurality of first layers;
    converting an upper portion and a lower portion of each of the second layers each into a layer of dielectric materials;
    forming a plurality of conductor layers from unreacted portions of the plurality of second layers; and
    forming a gate-to-gate dielectric layer between the adjacent conductor layers, the gate-to-gate dielectric layer comprising at least one sub-layer of silicon oxynitride and an airgap.

2. The method of claim 1, wherein removing the plurality of first layers comprises:
    forming a first initial slit opening extending through the stack structure and exposing the substrate; and
    removing the plurality of first layers through the first initial slit opening to form a plurality of lateral recesses that expose portions of the semiconductor channel.

3. The method of claim 2, wherein filling the channel hole with a channel-forming structure comprises:
    forming a blocking layer over a sidewall of the channel hole;
    forming the memory layer over the blocking layer;
    forming a tunneling layer over the memory layer;
    forming a semiconductor layer over the tunneling layer; and
    forming a dielectric core over the semiconductor layer to fill up the channel hole.

4. The method of claim 3, wherein forming the plurality of conductor layers, the gate-to-gate dielectric layer, and a second initial slit opening comprises:
    forming a composite layer from a portion of each of the plurality of second layers, a remaining portion of the respective second layer forming a respective conductor layer, a pair of composite layers on the adjacent conductor layers and facing each other forming the gate-to-gate dielectric layer, the first initial slit opening forming a second initial slit opening, the composite layer having at least one sub-layer of silicon oxynitride.

5. The method of claim 4, wherein the plurality of second layers comprise polysilicon and forming the composite layer comprises:
    performing, through the first initial slit opening and the plurality of lateral recesses, one or more of an oxidation reaction and a nitriding reaction on the plurality of second layers, a reacted portion of each of the plurality of second layers forming the respective composite layer, an unreacted portion of each of the plurality of second layers forming the respective conductor layer.

6. The method of claim 5, wherein a composite layer is formed from each of a top portion and a bottom portion of the respective second layer.

7. The method of claim 6, wherein forming the gate-to-gate dielectric layer further comprises forming the airgap between the pair of composite layers.

8. The method of claim 7, wherein forming the composite layer comprises controlling an oxygen diffusion concentration such that the composite layer comprises the at least one sub-layer of silicon oxynitride.

9. The method of claim 8, wherein forming the composite layer further comprises controlling the oxygen diffusion concentration such that the composite layer comprises at least one sub-layer of silicon oxynitride and at least one sub-layer of silicon oxide.

10. The method of claim 9, wherein forming the composite layer further comprises controlling the oxygen diffusion concentration such that the composite layer comprises a plurality of alternatingly arranged sub-layers of silicon oxynitride and sub-layers of silicon oxide.

11. The method of claim 1, wherein
forming the offset comprises removing a portion of the side surface of each one of the plurality of first layers on the sidewall of the initial channel hole by a recess etching process that selectively etches the plurality of first layers over the plurality of second layers.

12. A method for forming a three-dimensional (3D) memory device, comprising:
forming an initial channel hole in a stack structure of a plurality of first layers and a plurality of second layers alternatingly arranged over a substrate, the plurality of second layers comprising a conductive material;
forming an offset between a side surface of each one of the plurality of first layers and a side surface of each one of the plurality of second layers on a sidewall of the initial channel hole to form a channel hole;
forming a semiconductor channel by filling the channel hole with a channel-forming structure, the semiconductor channel having a memory layer comprising a plurality of first memory portions each surrounding a bottom of a respective second layer and a plurality of second memory portions each connecting adjacent first memory portions;
removing the plurality of first layers while retaining the plurality of second layers;
forming a plurality of conductor layers each from a middle portion of a respective second layer;
forming a composite layer from a surface portion of the second layer, the composite layer comprising at least one sub-layer of silicon oxynitride; and
forming an airgap between adjacent conductor layers.

13. The method of claim 12, wherein removing the plurality of first layers comprises:
forming a first initial slit opening extending through the stack structure and exposing the substrate; and
removing the plurality of first layers through the first initial slit opening to form a plurality of lateral recesses that expose portions of the semiconductor channel.

14. The method of claim 13, wherein forming the plurality of conductor layers, the composite layer, the airgap, and a second initial slit opening comprises:
forming the composite layer from each of a top portion and a bottom portion of each of the plurality of second layers, the middle portion between the top portion and the bottom portion forming a respective conductor layer, an unfilled portion of each of the plurality of lateral recesses between adjacent conductor layers forming the airgap, the first initial slit opening forming a second initial slit opening.

15. The method of claim 14, wherein the plurality of second layers comprise polysilicon and forming the composite layer comprises:
performing, through the first initial slit opening and the plurality of lateral recesses, one or more of an oxidation reaction and a nitriding reaction on the plurality of second layers, reacted top and bottom portions of each of the plurality of second layers forming the respective composite layers, an unreacted portion between the reacted top and bottom portions of each of the plurality of second layers forming the respective conductor layer.

16. The method of claim 15, wherein forming the composite layer comprises controlling an oxygen diffusion concentration such that the composite layer comprises the at least one sub-layer of silicon oxynitride.

17. A three-dimensional (3D) memory device, comprising:
a stack structure comprising a plurality of conductor layers insulated from one another by a gate-to-gate dielectric structure, wherein the gate-to-gate dielectric structure comprises a pair of composite layers each comprising at least a sub-layer of silicon oxynitride or an airgap between adjacent conductor layers along a direction perpendicular to a top surface of a substrate, the pair of composite layers each covering a surface of the respective conductor layers;
a semiconductor channel extending from a top surface of the stack structure to the substrate, wherein the semiconductor channel comprises a memory layer comprising a plurality of first memory portions each surrounding a bottom of a respective conductor layer and a plurality of second memory portions each connecting adjacent first memory portions, the plurality of first memory portions and the plurality of second memory portions are staggered along a vertical direction perpendicular to a top surface of the substrate; and
a source structure extending from the top surface of the stack structure to the substrate.

18. The 3D memory device of claim 17, wherein the pair of composite layers are on the adjacent conductor layers and the airgap is between the pair of composite layers, the pair of composite layers each having at least a sub-layer of silicon oxynitride; and
the plurality of first memory portions each comprises a vertical portion along the vertical direction and at least one lateral portion along a lateral direction parallel to the top surface of the substrate, the vertical portion and the at least one lateral portion partially surrounding the respective conductor layer vertically and laterally.

19. The 3D memory device of claim 18, wherein, along a radial direction from a sidewall of the semiconductor channel to a center of the semiconductor channel, the semiconductor channel comprises a blocking layer, the memory layer over the blocking layer, a tunneling layer over the plurality of memory portions, a semiconductor layer over the tunneling layer, and a dielectric core over the semiconductor layer.

20. The 3D memory device of claim 19, wherein each composite layer is located between ends of the respective vertical portion of each of the plurality of first memory portions along the vertical direction.

* * * * *